(12) United States Patent
Inoue et al.

(10) Patent No.: US 8,901,891 B2
(45) Date of Patent: Dec. 2, 2014

(54) VOLTAGE POLARITY DETERMINATION CIRCUIT AND CHARGE AMOUNT MEASUREMENT CIRCUIT

(75) Inventors: Atsuo Inoue, Kyoto (JP); Noriaki Matsuno, Hyogo (JP)

(73) Assignee: Panasonic Corporation, Osaka (JP)

( * ) Notice: Subject to any disclaimer, the term of this patent is extended or adjusted under 35 U.S.C. 154(b) by 684 days.

(21) Appl. No.: 13/218,193

(22) Filed: Aug. 25, 2011

(65) Prior Publication Data

US 2011/0313698 A1 Dec. 22, 2011

Related U.S. Application Data

(63) Continuation of application No. PCT/JP2010/001247, filed on Feb. 24, 2010.

(30) Foreign Application Priority Data

| Feb. 25, 2009 | (JP) | ................................ | 2009-042206 |
| Apr. 28, 2009 | (JP) | ................................ | 2009-109716 |
| Feb. 15, 2010 | (JP) | ................................ | 2010-030562 |

(51) Int. Cl.
| *H02J 7/00* | (2006.01) |
| *G01R 19/14* | (2006.01) |
| *G01R 31/36* | (2006.01) |

(52) U.S. Cl.
CPC ............ *G01R 19/14* (2013.01); *G01R 31/3613* (2013.01)
USPC .......................................... 320/132; 324/617

(58) Field of Classification Search
USPC .............................. 320/132; 702/63; 324/617
See application file for complete search history.

(56) References Cited

U.S. PATENT DOCUMENTS

| 4,291,266 | A | * | 9/1981 | Portmann | ...................... | 320/101 |
| 6,339,315 | B1 | | 1/2002 | Castelli et al. | | |
| 6,661,204 | B2 | * | 12/2003 | Malcolm | ....................... | 320/136 |
| 6,680,615 | B2 | * | 1/2004 | Nebon et al. | ................... | 324/426 |
| 8,233,582 | B2 | * | 7/2012 | Schwoerer | ....................... | 377/12 |

FOREIGN PATENT DOCUMENTS

| JP | 09-311147 | 12/1997 |
| JP | 2000-241515 | 9/2000 |

OTHER PUBLICATIONS

The editorial department of Transistor Technology (editors), "Handbook of Battery Applications," CQ Publishing Co., Ltd., 2005, p. 165, Fig.2-4-5, with its English translation.

* cited by examiner

*Primary Examiner* — Edward Tso
*Assistant Examiner* — Ramy Ramadan
(74) *Attorney, Agent, or Firm* — McDermott Will & Emery LLP

(57) ABSTRACT

A voltage polarity determination circuit includes an integration circuit, a switch, and a time measurement circuit. The integration circuit includes an operational amplifier circuit having an input offset voltage which is larger than the maximum value of a voltage input to the integration circuit or smaller than the minimum value of the input voltage of the integration circuit. The switch switches the input voltage of the integration circuit between a voltage whose polarity is to be determined and a reference voltage. The time measurement circuit measures a time interval which it takes for the output voltage of the integration circuit to reach a set voltage, and based on the result of the measurement, determines the polarity of the input voltage of the integration circuit.

5 Claims, 30 Drawing Sheets

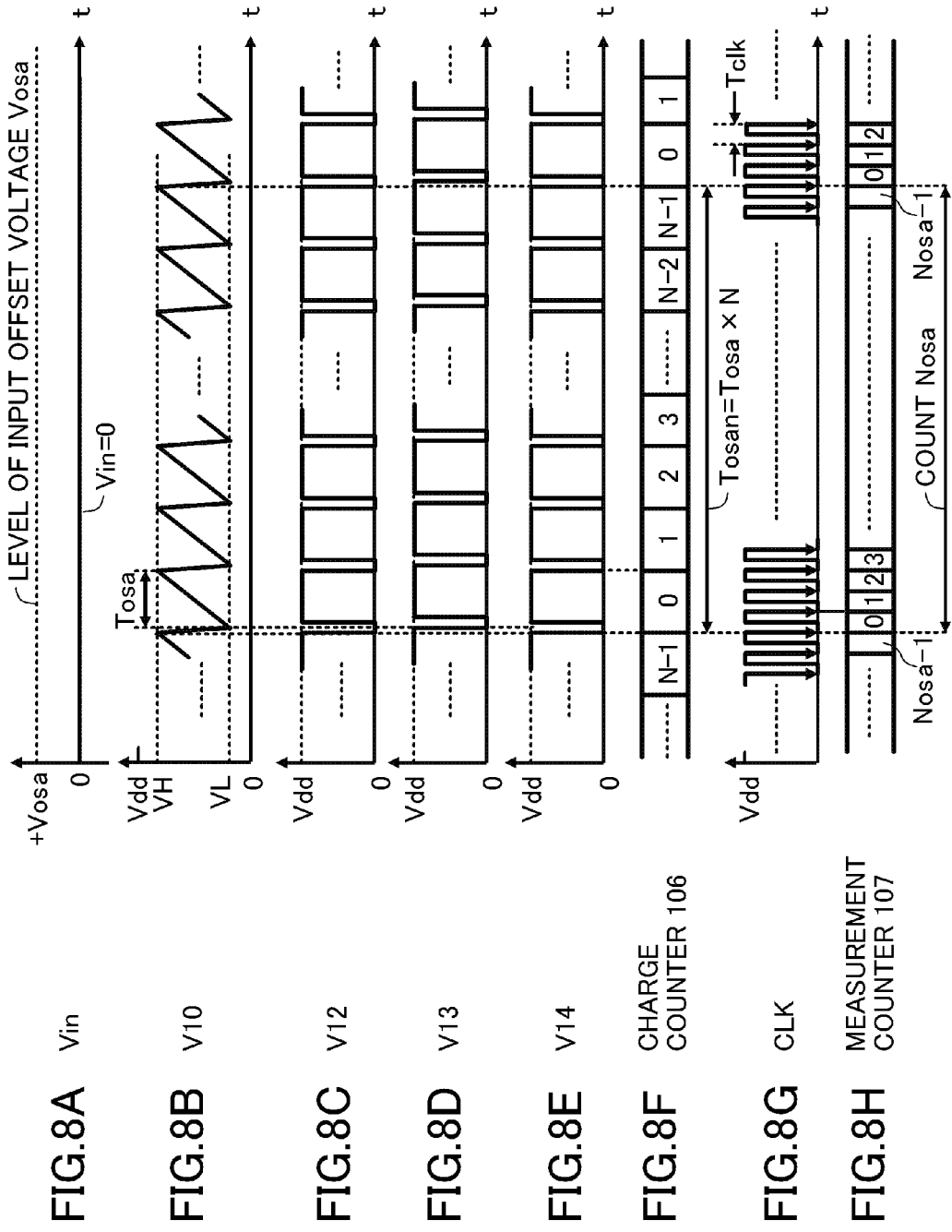

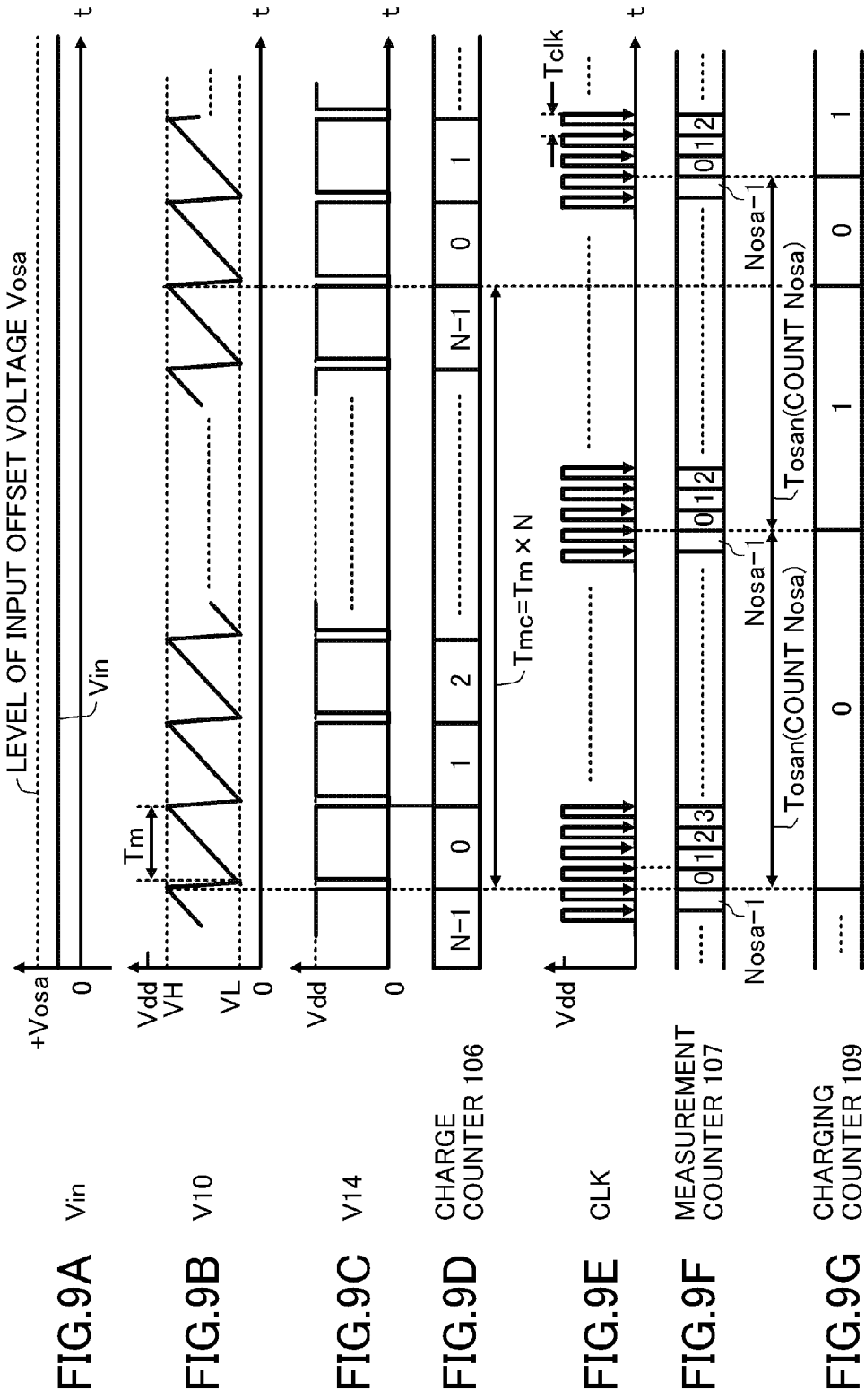

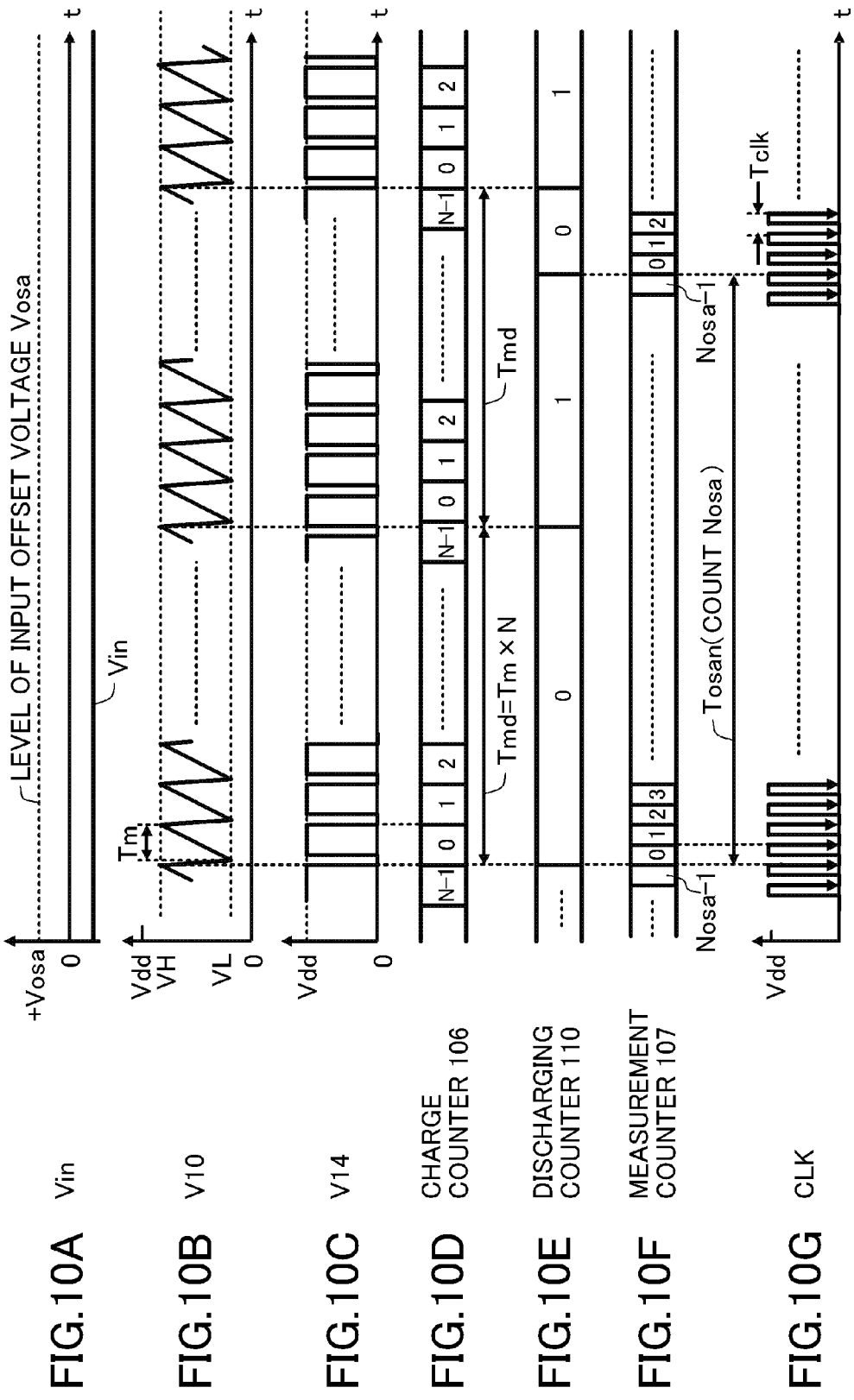

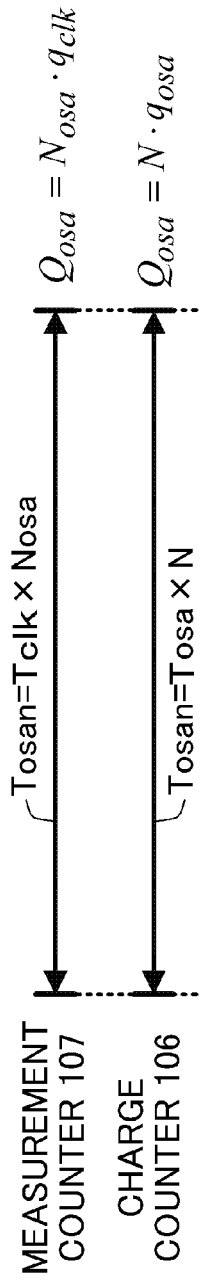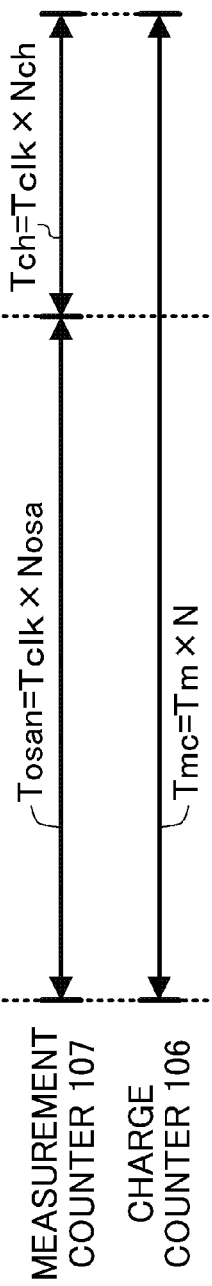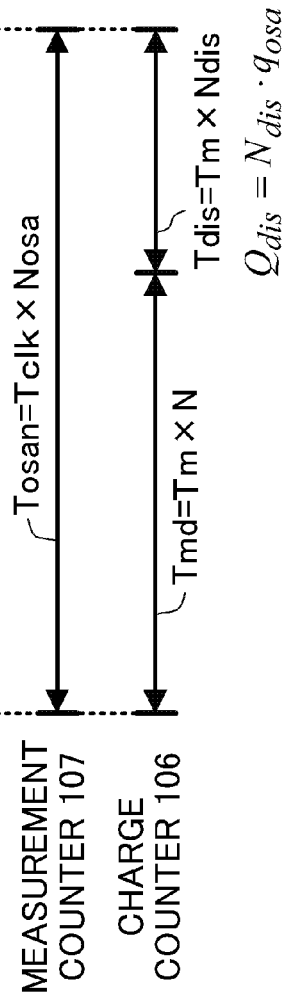

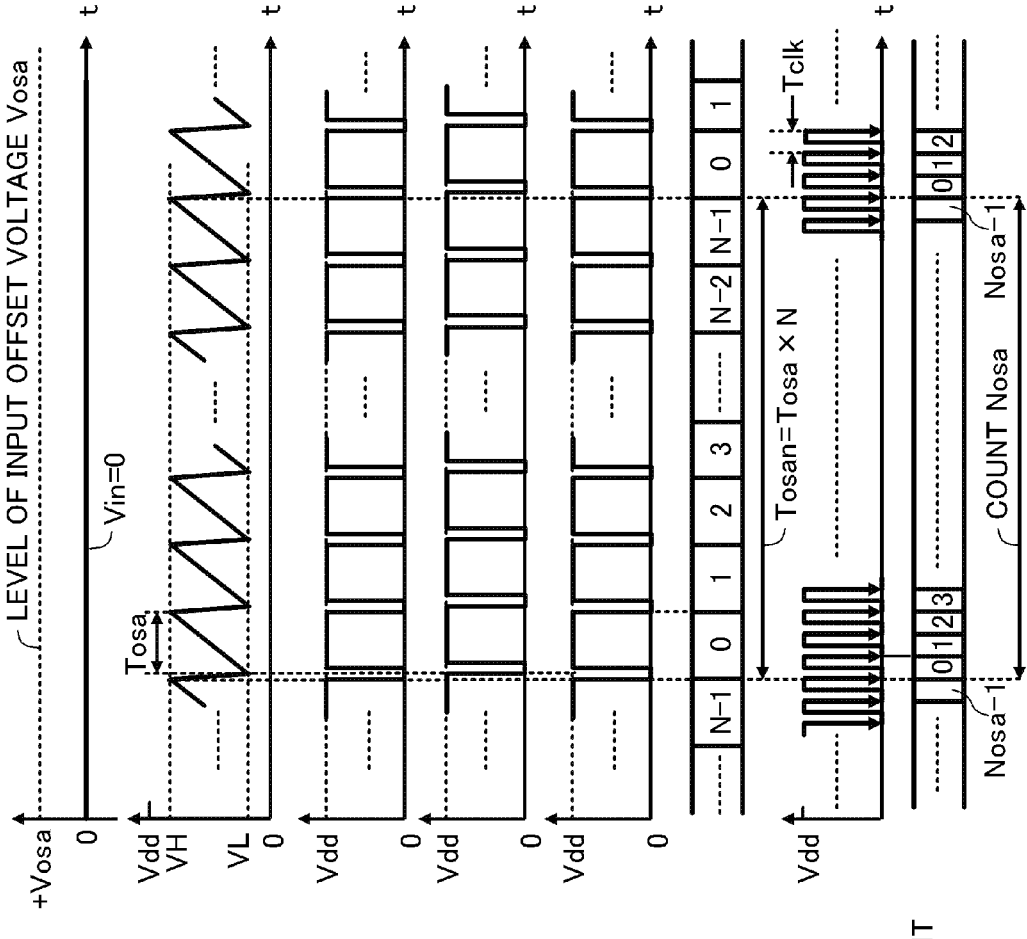

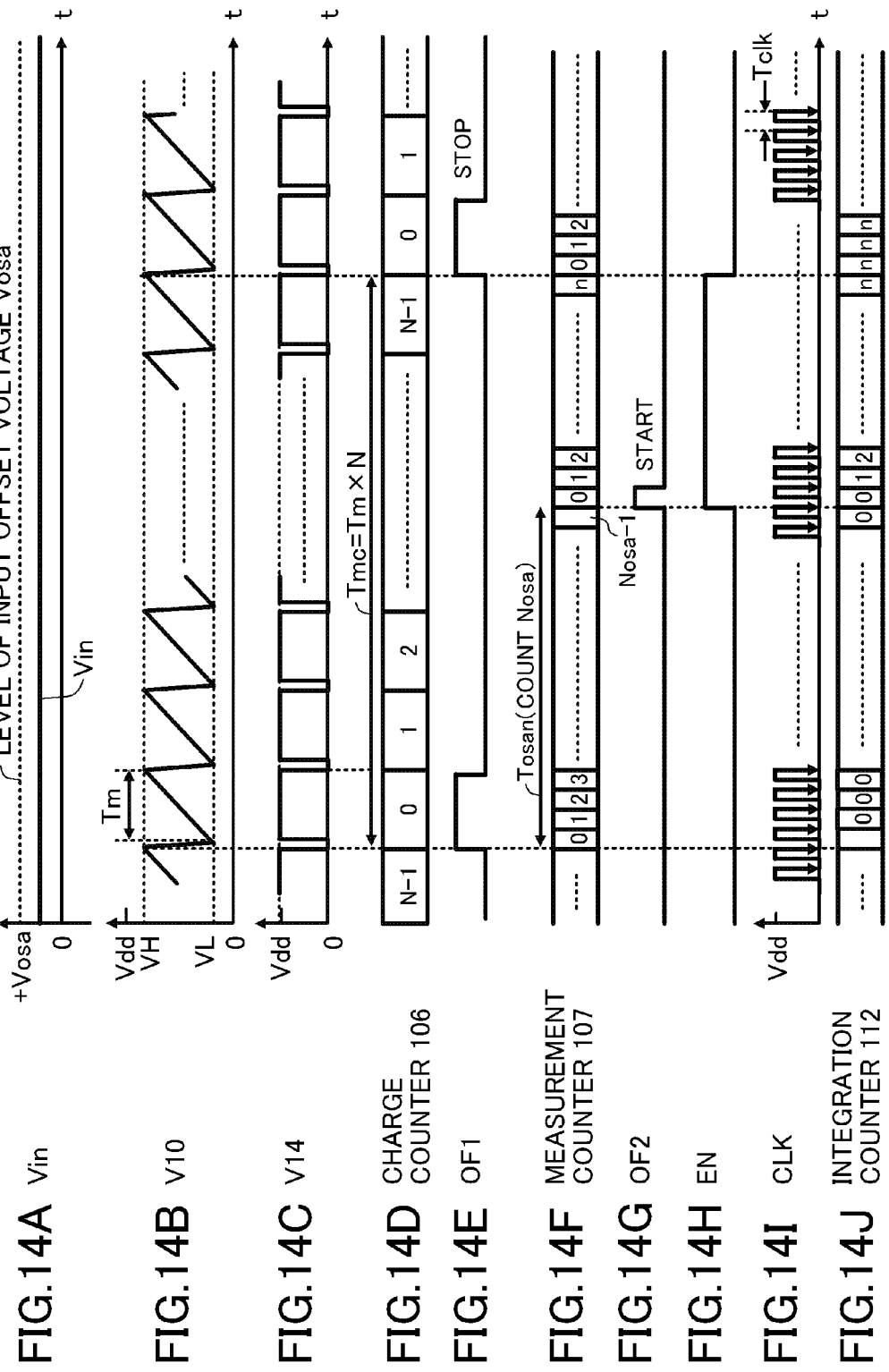

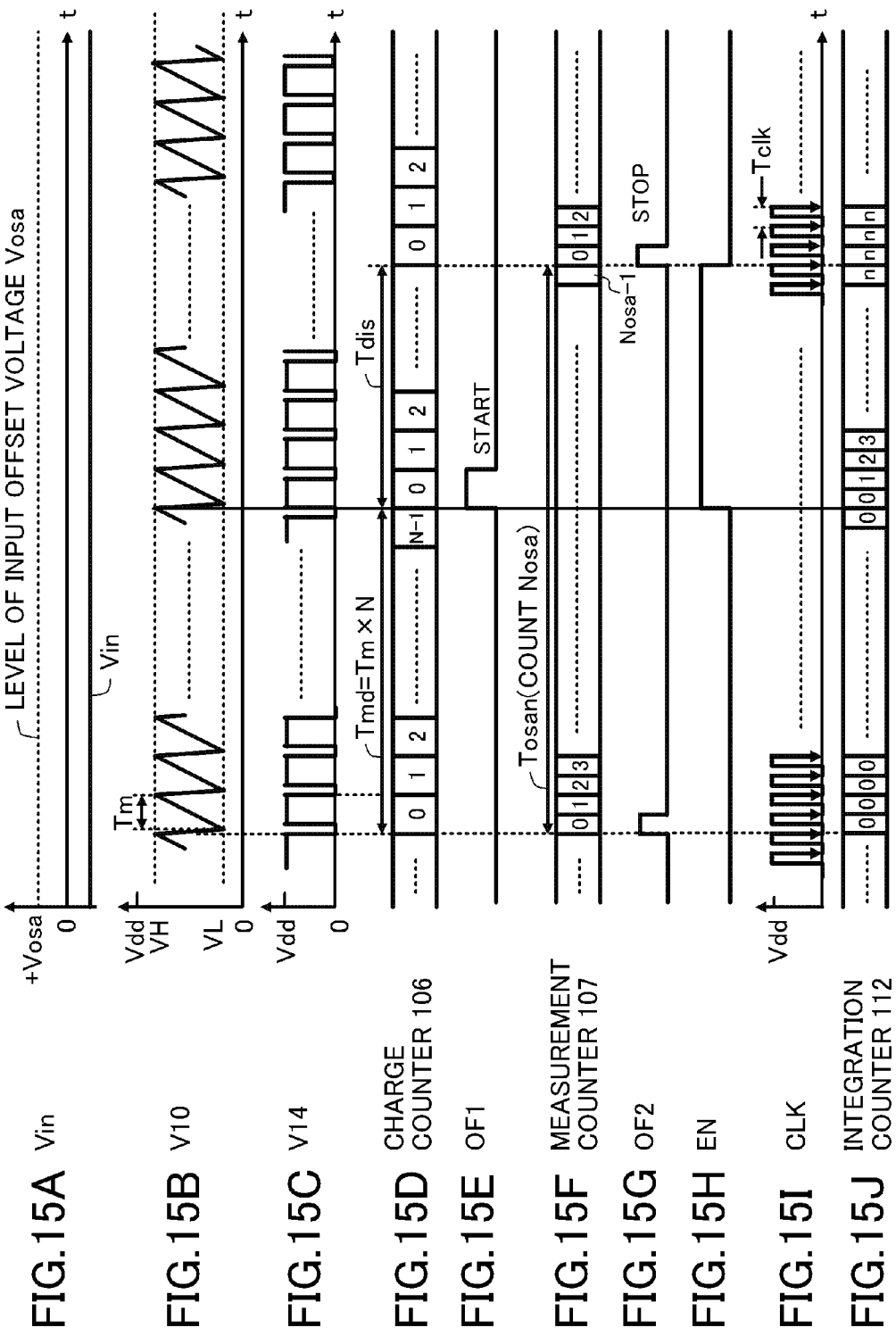

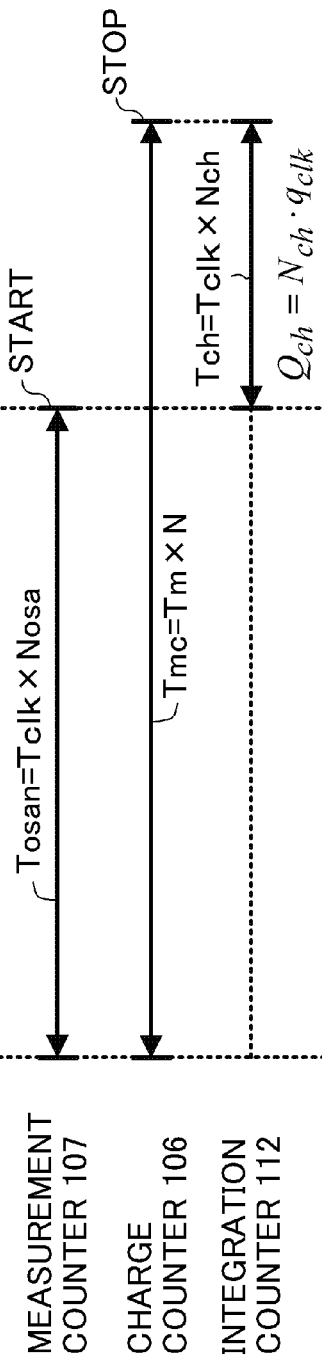
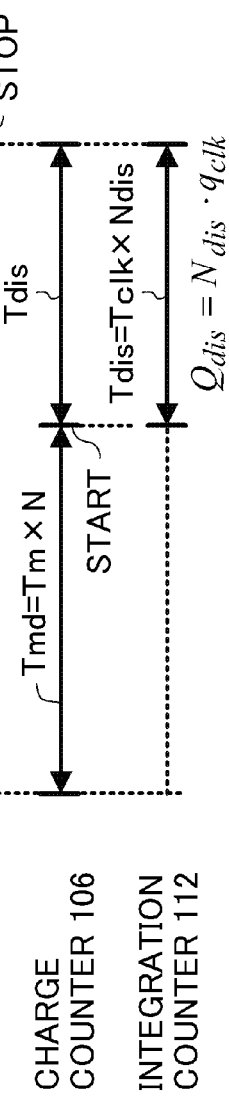
FIG. 16A TRIMMING STEP
FIG. 16B CHARGING
FIG. 16C DISCHARGING

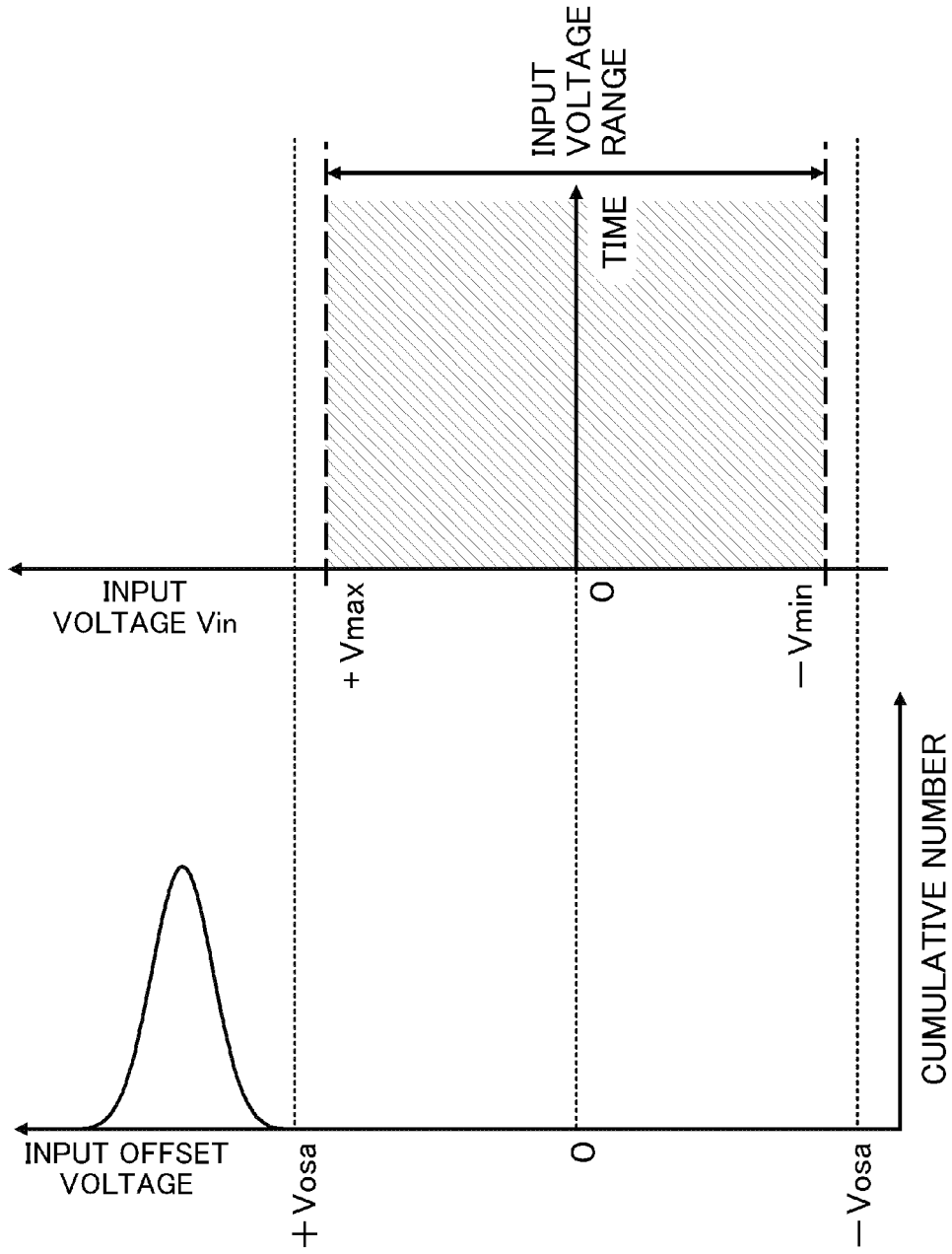

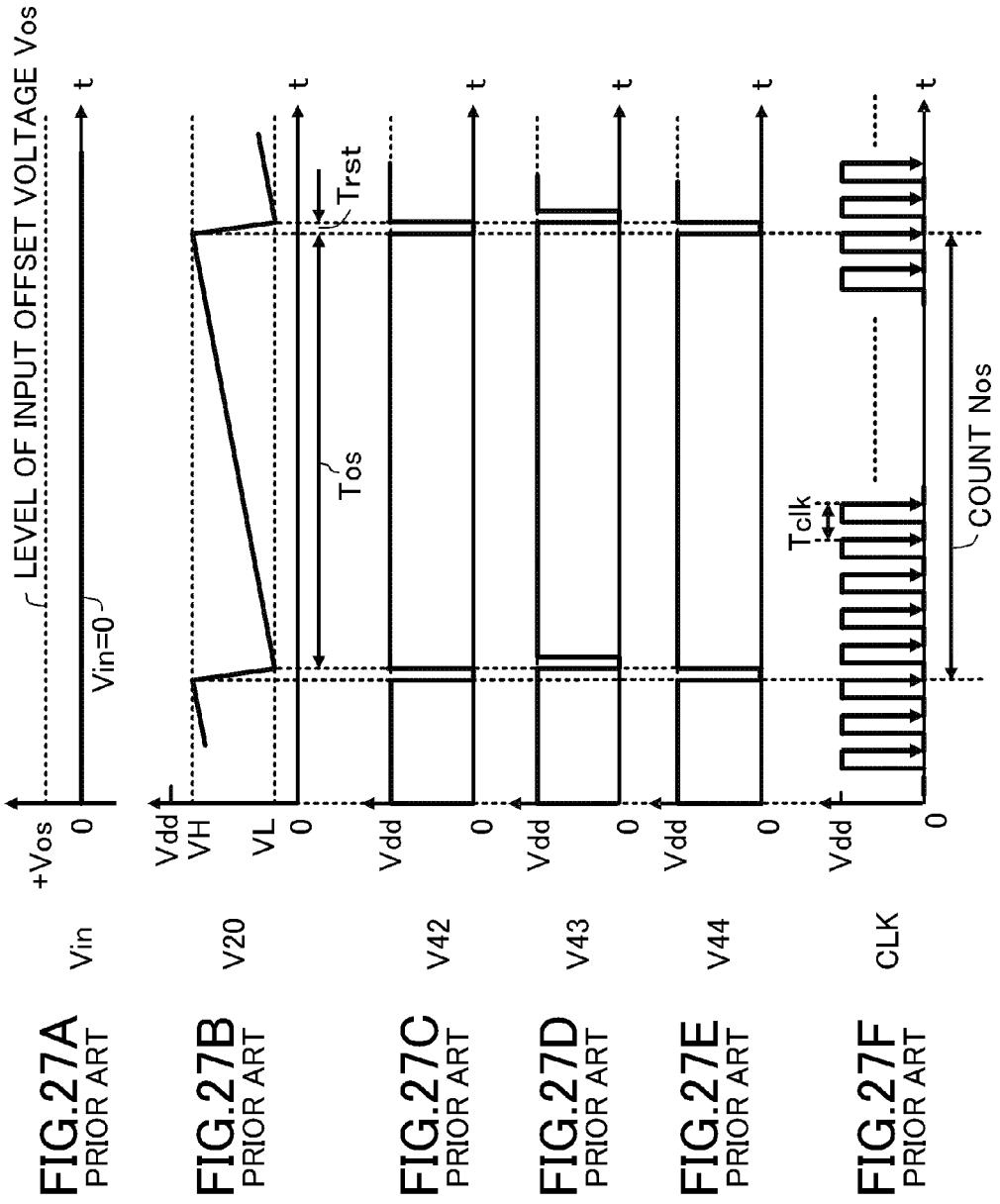

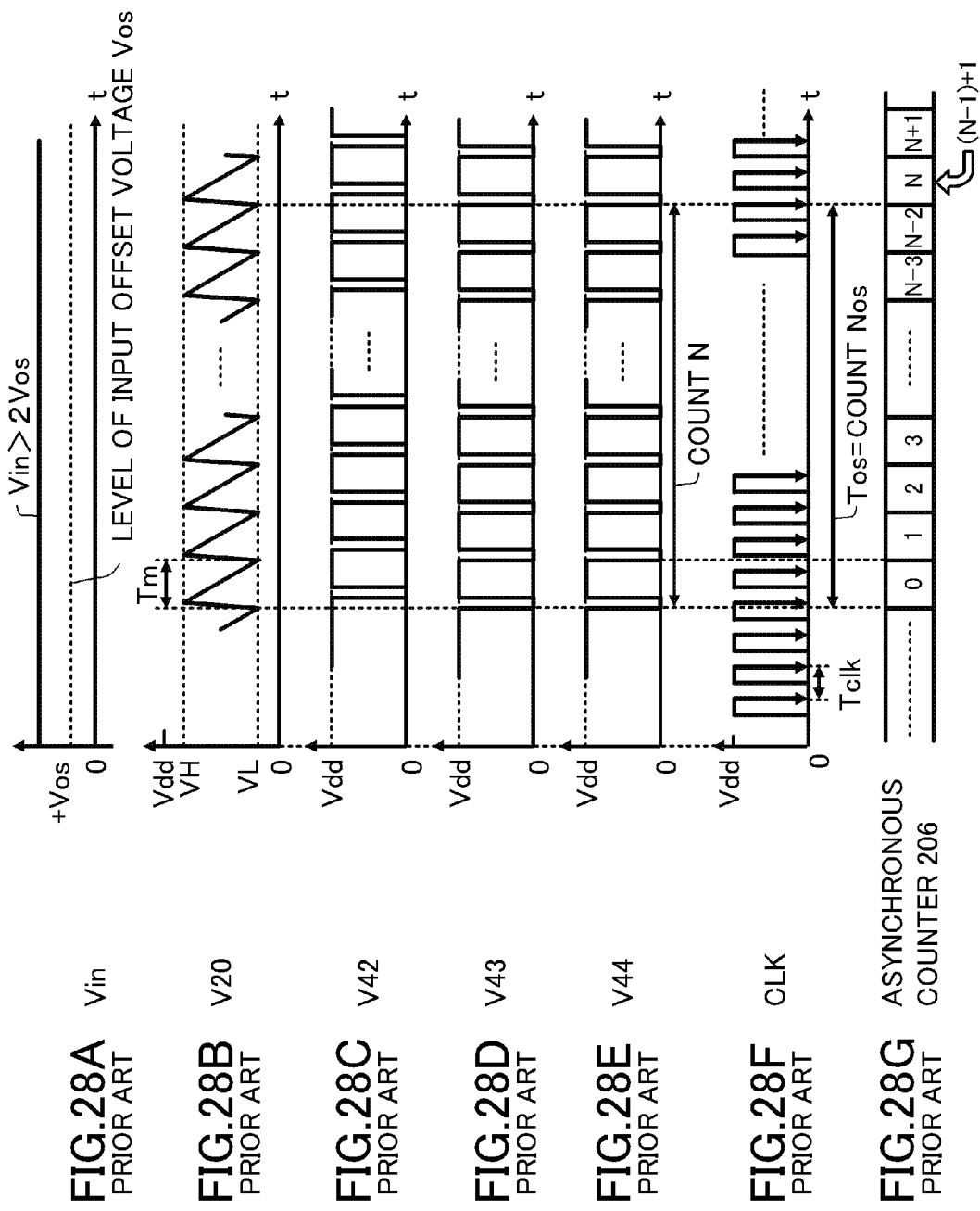

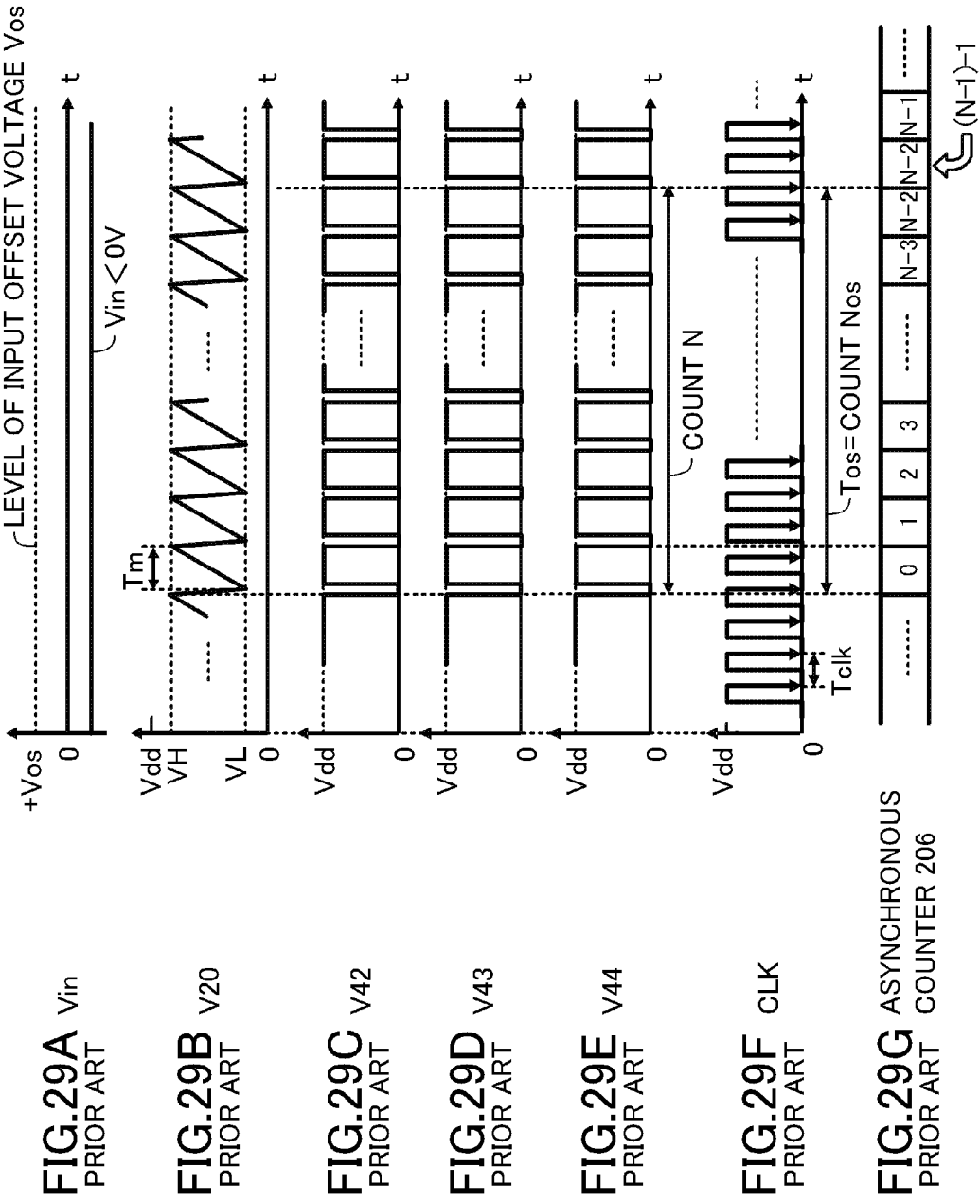

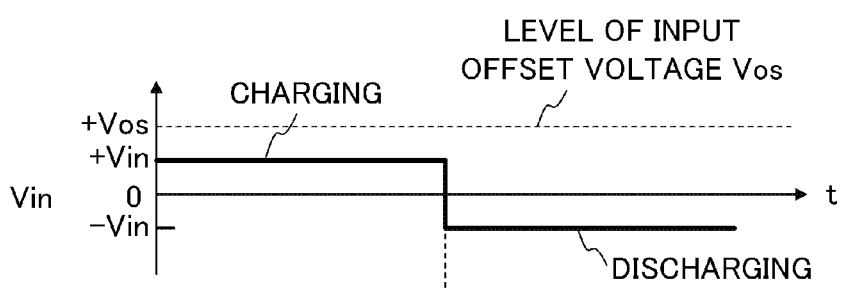
FIG.30A PRIOR ART Vin
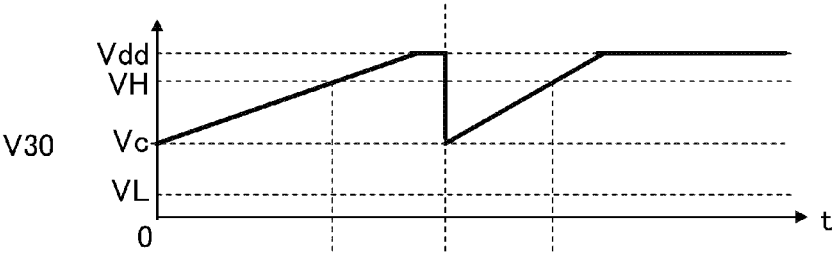
FIG.30B PRIOR ART V30
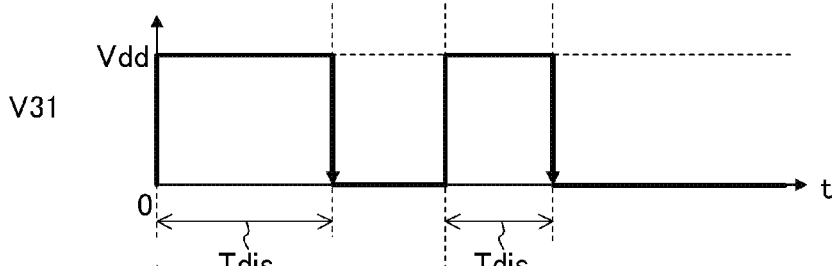
FIG.30C PRIOR ART V31
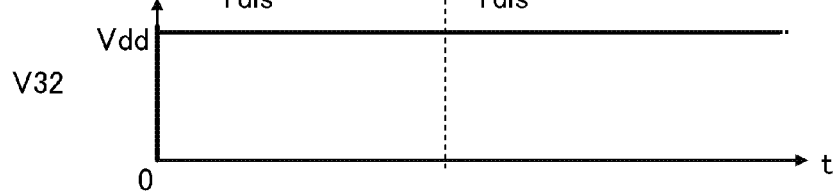
FIG.30D PRIOR ART V32

VOLTAGE POLARITY DETERMINATION CIRCUIT AND CHARGE AMOUNT MEASUREMENT CIRCUIT

CROSS-REFERENCE TO RELATED APPLICATIONS

This is a continuation of PCT International Application PCT/JP2010/001247 filed on Feb. 24, 2010, which claims priority to Japanese Patent Application No. 2009-042206 filed on Feb. 25, 2009, Japanese Patent Application No. 2009-109716 filed on Apr. 28, 2009, and Japanese Patent Application No. 2010-030562 filed on Feb. 15, 2010. The disclosures of these applications including the specifications, the drawings, and the claims are hereby incorporated by reference in their entirety.

BACKGROUND

The present disclosure relates to circuits for determining the polarity of a voltage to be measured. The present disclosure also relates to systems for detecting a consumed current or a charge amount of an electronic device to which power is supplied from a secondary battery, and a charging current or an integrated charge value during charging of the secondary battery, to detect or estimate the remaining capacity of the secondary battery, and more particularly, to circuits for measuring charged and discharged charge amounts of a secondary battery.

In recent years, mobile electronic devices are driven by a rechargeable secondary battery, and most of them have an LSI having a function of displaying the remaining capacity of the secondary battery. The LSI detects a charge amount or a current, and if the secondary battery is being charged, adds the detected charge amount to a post-discharge battery capacity, and if the secondary battery is being discharged, subtracts the detected charge amount from a post-charge battery capacity. The decision about whether to add or subtract is determined based on the polarity of a charging/discharging current which indicates whether the battery is being charged or discharged. The result of the addition or subtraction indicates a remaining capacity (also referred to as a remaining charge amount, a residual capacity, etc.). By displaying this, a state of the secondary battery can be known. A unit which detects such a charge amount or current is referred to as a charge amount measurement circuit (also referred to as a coulomb counter).

An example conventional determination of the polarity of a charging/discharging current and an example conventional charge amount measurement circuit will be described hereinafter. In the charge amount measurement circuit, a sensing resistor connected in series between a secondary battery and a load or a charger in order to detect a charge amount or a current. The sensing resistor has a resistance value of as small as several tens of milliohms to several hundreds of milliohms in order to reduce the influence of its own power consumption and voltage drop on the load.

A current flowing through the sensing resistor depends on the consumed current or charging current of the mobile electronic device. In general, the magnitudes of the consumed current and the charging current are about several amperes. In the above case, for example, if the sensing resistor has a resistance value of 20 mΩ, the maximum charging current is −6.25 A (the sign "−" indicates the direction of a current during charging), and the maximum consumed current is +6.25 A (the sign "+" indicates the direction of a current during discharging), a voltage between both ends of the sensing resistor is ±125 mV. In conventional voltage polarity determination circuits and conventional charge amount measurement circuits, this input voltage is amplified by a differential amplifier circuit, or charge is integrated by an integration circuit including an operational amplifier circuit. The differential amplifier circuit and the operational amplifier circuit typically have an input offset voltage which varies among products within the range of ±several millivolts. For example, the input offset voltage of ±1 mV corresponds to a current of ±50 mA flowing through the sensing resistor. In other words, the measurement range of the conventional voltage polarity determination circuit and the conventional charge amount measurement circuit is, for example, −6.25 A to −50 mA and +50 mA to +6.25 A.

FIG. 24 is a diagram showing a configuration of a conventional voltage polarity determination circuit 303 (see The editorial department of Transistor Technology (editors), "Handbook of Battery Applications," CQ Publishing Co., Ltd., 2005, p. 165, FIG. 2-4-5). The voltage polarity determination circuit 303 includes an integration circuit 300, an initialization circuit 331, a first and a second comparison circuit 601 and 602, and a first and a second counter 603 and 604. The integration circuit 300 includes an operational amplifier circuit 300a which is designed to reduce an input offset voltage Vos. The initialization circuit 331 includes a voltage source which outputs an initial voltage Vc and a switch SW3 which sets an end of a capacitor C1 used in the integration circuit 300 to the initial voltage Vc. The first comparison circuit 601 compares an output voltage V30 of the integration circuit 300 with a first reference voltage VH. The first counter 603 measures the time interval between when the switch SW3 is transitioned to the non-conductive state and is therefore cut off the initial voltage Vc and when an output V31 of the first comparison circuit 601 is inverted. The second comparison circuit 602 compares the output voltage V30 of the integration circuit 300 with a second reference voltage VL. The second counter 604 measures the time interval between when the switch SW3 is transitioned to the non-conductive state and is therefore cut off the initial voltage Vc and when an output V32 of the second comparison circuit 602 is inverted. In the integration circuit 300, the capacitor C1 is connected in parallel between an output terminal e and an inverting input terminal c of the operational amplifier circuit 300a, a resistor R1 is connected between the inverting input terminal c and a terminal a, and a reference voltage GND is connected to a non-inverting input terminal d of the operational amplifier circuit 300a via a GND terminal b.

Next, operation of the conventional voltage polarity determination circuit 303 thus configured will be described with reference to FIGS. 25A-25D.

A charging/discharging current flows through a sensing resistor Rin between the secondary battery and the reference voltage GND, so that an input voltage Vin appears between both ends of the sensing resistor Rin. In this case, the output voltage V30 of the integration circuit 300 is represented by:

$$V_{30} = -\frac{1}{C_1 R_1} \int (V_{in} \pm V_{os}) dt \qquad (1)$$

The slope with respect to time t is represented by:

$$\frac{dV_{30}}{dt} = -\frac{1}{C_1 R_1} \cdot (V_{in} \pm V_{os}) \qquad (2)$$

FIGS. 25A-25D show voltage waveforms obtained when the input voltage Vin>Vos (charging) and voltage waveforms obtained when the input voltage Vin<−Vos (discharging), where the input offset voltage Vos>0.

Initially, in the charge state, if the input offset voltage Vos>0 and the input voltage Vin>Vos, the slope of the output voltage V30 of the integration circuit 300 is calculated by Expression 2 and is represented by:

$$\frac{dV_{30}}{dt} = -\frac{1}{C_1R_1} \cdot (V_{in} - V_{os}) < 0 \quad (3)$$

As shown in FIG. 25B, as time t increases, the output voltage V30 of the integration circuit 300 decreases. Therefore, the output voltage V30 reaches from the initial voltage Vc to the reference voltage GND, so that the output V32 of the second comparison circuit 602 which compares the output voltage V30 with the second reference voltage VL is inverted (FIG. 25D), whereby the conventional voltage polarity determination circuit 303 determines that the second battery is in the charge state.

Next, in the discharge state, if the input offset voltage Vos>0 and the input voltage Vin<−Vos, the slope of the output voltage V30 of the integration circuit 300 is calculated by Expression 2 and is represented by:

$$\frac{dV_{30}}{dt} = -\frac{1}{C_1R_1} \cdot (V_{in} - V_{os}) = \frac{1}{C_1R_1} \cdot (V_{in} + V_{os}) > 0 \quad (4)$$

As shown in FIG. 25B, as time t increases, the output voltage V30 of the integration circuit 300 increases. Therefore, the output voltage V30 reaches from the initial voltage Vc to a reference voltage Vdd, so that the output V31 of the first comparison circuit 601 which compares the output voltage V30 with the first reference voltage VH is inverted (FIG. 25C), whereby the conventional voltage polarity determination circuit 303 determines that the second battery is in the discharge state.

Therefore, the polarity of the charging/discharging current can be correctly determined when the input voltage Vin is within the range represented by:

$$V_{in} < -V_{os}, V_{os} < V_{in} \quad (5)$$

When the input offset voltage Vos<0, the same result as that of Expression 5 is obtained and therefore will not be here described.

FIG. 26 is a diagram showing a configuration of a conventional charge amount measurement circuit 2 (see Japanese Patent Publication No. 2000-241515). The conventional charge amount measurement circuit 2 includes a first switch 101, an integration circuit 200 including an operational amplifier circuit 200a which is designed to reduce an input offset voltage Vos, a first comparison circuit 102 which compares an output voltage V20 of the integration circuit 200 with a first reference voltage VH, a second comparison circuit 103 which compares the output voltage V20 of the integration circuit 200 with a second reference voltage VL, a logic circuit 104 which receives respective output voltages V42 and V43 of the first and second comparison circuits 102 and 103, a second switch 105 whose conductive and non-conductive states are controlled based on an output voltage V44 of the logic circuit 104, an asynchronous counter 206 which counts the number of times of inversion of the output voltage of the first comparison circuit 102 or the second comparison circuit 103, a timer 207 which, when the first switch 101 is switched to a GND terminal b, measures a time interval Tos which elapses until the output voltage of one of the first comparison circuit 102 or the second comparison circuit 103 is inverted, and when the first switch 101 is switched to an input terminal a, indicates the lapse of the time interval Tos, and a register 108 which stores a value measured by the timer 207 and sets the measured value into the timer 207.

In the integration circuit 200, a capacitor C and the second switch 105 are connected together in parallel between an output terminal e and an inverting input terminal c of the operational amplifier circuit 200a, a resistor R is connected between the inverting input terminal c of the operational amplifier circuit 200a and the input terminal a, and a GND terminal b is connected to a non-inverting input terminal d of the operational amplifier circuit 200a.

Next, operation of the conventional charge amount measurement circuit 2 thus configured will be described. Here, to facilitate the understanding of the operation, an example will be described in which a current is constant, i.e., the input voltage Vin is constant, and the input offset voltage Vos>0.

Before measurement of a charge amount during charging/discharging, a trimming step is provided as an information collection period for correcting the influence of the input offset voltage Vos of the operational amplifier circuit 200a.

FIGS. 27A-27F show operation of the trimming step. Initially, the first switch 101 is switched to the GND terminal b, so that the input voltage Vin=0 V (FIG. 27A). In this case, the output voltage V20 of the integration circuit 200 increases from the second reference voltage VL to the first reference voltage VH during the time interval Tos, and therefore, the following is established (FIG. 27B):

$$V_H = -\frac{1}{CR}\int_0^{T_{os}} (0 - V_{os})dt + V_L \quad (6)$$

Here, Vdd>VH>VL>0 V, where Vdd is a power supply voltage.

According to Expression 6, the time interval Tos is represented by:

$$T_{os} = CR \cdot \frac{V_H - V_L}{V_{os}} \quad (7)$$

After the time interval Tos, the output voltage V42 of the first comparison circuit 102 is inverted as shown in FIG. 27C. The inverted output voltage V42 causes the logic circuit 104 to output a signal which causes the second switch 105 to transition to the conductive state (FIG. 27E). When the second switch 105 is transitioned to the conductive state, both ends of the capacitor C are short-circuited, so that the output voltage V20 of the integration circuit 200 decreases (FIG. 27B). When the output voltage V20 of the integration circuit 200 decreases to reach the second reference voltage VL, the output voltage V43 of the second comparison circuit 103 is inverted (FIG. 27D). The inverted output voltage V43 causes the logic circuit 104 to output a signal which causes the second switch 105 to transition to the non-conductive state (FIG. 27E). When the second switch 105 is transitioned to the non-conductive state, the output voltage V20 of the integration circuit 200 increases again (FIG. 27B). The timer 207 measures the time interval Tos which it takes for the output voltage V20 of the integration circuit 200 to reach from the second reference voltage VL to the first reference voltage VH, using a clock CLK having a period Tclk (FIG. 27F). This measured time information Nos is stored in the register 108, and the stored time information Nos is set in the timer 207. The time information Nos represents a charge amount corresponding to the input offset voltage Vos. After the above trimming step, control proceeds to a measurement step.

The measurement step is performed in two states, a charge state and a discharge state. Firstly, operation during charging will be described with reference to FIGS. 28A-28G. Here, operation of the conventional charge amount measurement circuit 2 under a condition which allows the circuit 2 to output a correct result, i.e., the input voltage Vin is twice or more as large as the input offset voltage Vos (Vin>2Vos), will be described (FIG. 28A).

In the measurement step, the first switch 101 is switched to the input terminal a, so that the input terminal a and the GND terminal b are connected to both ends of the sensing resistor Rin. In this case, the output voltage V20 of the integration circuit 200 decreases from the first reference voltage VH to the second reference voltage VL during a time interval Tm, and therefore, the following is established (FIG. 28B):

$$V_L = -\frac{1}{CR}\int_0^{T_m}(V_{in} - V_{os})dt + V_H \tag{8}$$

Because the input voltage Vin is assumed to be constant, the time interval Tm is represented by:

$$T_m = CR \cdot \frac{V_H - V_L}{V_{in} - V_{os}} \tag{9}$$

Also, here, because the input voltage Vin>2Vos, the time interval Tm is shorter than the time interval Tos measured in the trimming step. That is, the following is established:

$$T_m < T_{os} \tag{10}$$

After the time interval Tm, the output voltage V43 of the second comparison circuit 103 is inverted as shown in FIG. 28D. The inverted output voltage V43 causes the logic circuit 104 to output a signal which causes the second switch 105 to transition to the conductive state (FIG. 28E). In this case, the asynchronous counter 206 increments by one (FIG. 28G). When the second switch 105 is transitioned to the conductive state, both ends of the capacitor C are short-circuited, so that the output voltage V20 of the integration circuit 200 increases (FIG. 28B). When the output voltage V20 of the integration circuit 200 increases to reach the first reference voltage VH, the output voltage V42 of the first comparison circuit 102 is inverted (FIG. 28C). The inverted output voltage V42 causes the logic circuit 104 to output a signal which causes the second switch 105 to transition to the non-conductive state (FIG. 28E). When the second switch 105 is transitioned to the non-conductive state, the output voltage V20 of the integration circuit 200 decreases again. When the output voltage V20 of the integration circuit 200 reaches the second reference voltage VL (FIG. 28B), the asynchronous counter 206 increments by one (FIG. 28G). These incremented values are a charge amount obtained by subtracting a charge amount corresponding to the input offset voltage Vos from a charge amount corresponding to the input voltage Vin generated between both ends of the sensing resistor Rin. The above operation is repeated if the input voltage Vin continues to satisfy the condition that Vin>2Vos.

The timer 207 outputs a signal indicating the lapse of the time interval Tos stored in the register 108. Every time the time interval Tos has elapsed, the asynchronous counter 206 increments by one (FIG. 28G). The incremented value is a charge amount corresponding to the input offset voltage Vos measured in the trimming step, and therefore, the charge amount corresponding to the input offset voltage Vos is corrected.

Next, operation during discharging will be described with reference to FIGS. 29A-29G. Here, operation where the input voltage Vin<0 V will be described (FIG. 29A).

Similar to charging, in the measurement step, the first switch 101 is switched to the input terminal a, so that the input terminal a and the GND terminal b are connected to both ends of the sensing resistor Rin. In this case, the output voltage V20 of the integration circuit 200 increases from the second reference voltage VL to the first reference voltage VH during the time interval Tm. Therefore, the following is established:

$$V_H = -\frac{1}{CR}\int_0^{T_m}(V_{in} - V_{os})dt + V_L \tag{11}$$

Because the input voltage Vin is assumed to be constant, the time interval Tm is represented by:

$$T_m = CR \cdot \frac{V_H - V_L}{-V_{in} + V_{os}} \tag{12}$$

Also, here, because the input voltage Vin<0 V, the time interval Tm is shorter than the time interval Tos measured in the trimming step, similar to charging. That is:

$$T_m < T_{os} \tag{13}$$

After the time interval Tm, the output voltage V42 of the first comparison circuit 102 is inverted as shown in FIG. 29C. The inverted output voltage V42 causes the logic circuit 104 to output a signal which causes the second switch 105 to transition to the conductive state (FIG. 29E). In this case, the asynchronous counter 206 increments by one (FIG. 29G). When the second switch 105 is transitioned to the conductive state, both ends of the capacitor C are short-circuited, the output voltage V20 of the integration circuit 200 decreases (FIG. 29B). When the output voltage V20 of the integration circuit 200 decreases to reach the second reference voltage VL, the output voltage V43 of the second comparison circuit 103 is inverted (FIG. 29D). The inverted output voltage V43 causes the logic circuit 104 to output a signal which causes the second switch 105 to transition to the non-conductive state (FIG. 29E). When the second switch 105 is transitioned to the non-conductive state, the output voltage V20 of the integration circuit 200 increases again. When the output voltage V20 of the integration circuit 200 reaches the first reference voltage VH (FIG. 29B), the asynchronous counter 206 increments by one (FIG. 29G). These incremented values include a charge amount corresponding to the input voltage Vin occurring between both ends of the sensing resistor Rin and a charge amount corresponding to the input offset voltage Vos. When the input voltage Vin continues to satisfy the condition that Vin<0 V, the above operation is repeated.

The timer 207 outputs a signal indicating the lapse of the time interval Tos stored in the register 108. Every time the time interval Tos has elapsed, the asynchronous counter 206 decrements by one (FIG. 29G). The decremented value is a charge amount corresponding to the input offset voltage Vos measured in the trimming step, and the charge amount corresponding to the input offset voltage Vos is corrected.

Thus, the conventional charge amount measurement circuit 2 corrects the influence of the input offset voltage Vos during both charging and discharging under the following condition which is the same as that indicated by Expressions 10 and 13:

$$T_m < T_{os} \tag{14}$$

The conventional voltage polarity determination circuit 303 has the input offset voltage Vos which is not intended in the operational amplifier circuit 300a used in the integration circuit 300. Therefore, under some conditions of the input voltage Vin, the state of the output voltage V30 of the integration circuit 300 is not changed, so that two problems arise that the polarity of the charging/discharging current cannot be determined and that there is an input voltage range within which the polarity of the charging/discharging current cannot be correctly determined.

As to the first problem, when the input voltage Vin is equal to the input offset voltage Vos, Expression 1 is rewritten by:

$$Tc = C_1 R_1 \cdot \frac{V_H - V_L}{V_{in} \pm V_{os}} = \begin{cases} \infty & (V_{in} = -V_{os}) \\ \infty & (V_{in} = V_{os}) \end{cases} \tag{15}$$

where Tc represents both of the time interval between the initial voltage Vc and the second reference voltage VL and the time interval between the initial voltage Vc and the first reference voltage VH.

None of the output voltages V31 and V32 of the first and second comparison circuits 601 and 602 may be inverted, and therefore, the polarity of the charging/discharging current may not be determined.

As to the second problem, the polarity of the charging/discharging current may be incorrectly determined under some conditions of the input voltage Vin and the input offset voltage Vos.

Here, by checking the slope of the output voltage V30 of the integration circuit 300 within each voltage range of the input voltage Vin where the input offset voltage Vos>0, the result of determination by the conventional voltage polarity determination circuit 303 is compared.

When Vos>0, the output voltage V30 of the integration circuit 300 is:

$$V_{30} = -\frac{1}{C_1 R_1} \int (V_{in} - V_{os}) dt \tag{16}$$

The slope of the output voltage V30 of the integration circuit 300 is represented by:

$$\frac{dV_{30}}{dt} = -\frac{1}{C_1 R_1} \cdot (V_{in} - V_{os}) \tag{17}$$

When Vin>Vos, i.e., charging is performed, the following is established:

$$\frac{dV_{30}}{dt} = -\frac{1}{C_1 R_1} \cdot (V_{in} - V_{os}) < 0 \tag{18}$$

The result of determination by the conventional voltage polarity determination circuit 303 indicates charging, which is correct.

When 0<Vin<Vos, i.e., charging is performed, the following is established:

$$\frac{dV_{30}}{dt} = -\frac{1}{C_1 R_1} \cdot (V_{in} - V_{os}) > 0 \tag{19}$$

The result of determination by the conventional voltage polarity determination circuit 303 indicates discharging, which is incorrect.

When Vin<0, i.e., discharging is performed, the following is established:

$$\frac{dV_{30}}{dt} = -\frac{1}{C_1 R_1} \cdot (V_{in} - V_{os}) > 0 \tag{20}$$

The result of determination by the conventional voltage polarity determination circuit 303 indicates discharging, which is correct.

Similarly, when Vos<0, the output voltage V30 of the integration circuit 300 is:

$$V_{30} = -\frac{1}{C_1 R_1} \int (V_{in} + V_{os}) dt \tag{21}$$

The slope of the output voltage V30 of the integration circuit 300 is represented by:

$$\frac{dV_{30}}{dt} = -\frac{1}{C_1 R_1} \cdot (V_{in} + V_{os}) \tag{22}$$

When Vin>0, i.e., charging is performed, the following is established:

$$\frac{dV_{30}}{dt} = -\frac{1}{C_1 R_1} \cdot (V_{in} + V_{os}) < 0 \tag{23}$$

The result of determination by the conventional voltage polarity determination circuit 303 indicates charging, which is correct.

When −Vos<Vin<0, i.e., discharging is performed, the following is established:

$$\frac{dV_{30}}{dt} = -\frac{1}{C_1 R_1} \cdot (V_{in} + V_{os}) < 0 \tag{24}$$

The result of determination by the conventional voltage polarity determination circuit 303 indicates charging, which is incorrect.

When Vin<−Vos, i.e., discharging is performed, the following is established:

$$\frac{dV_{30}}{dt} = -\frac{1}{C_1 R_1} \cdot (V_{in} + V_{os}) > 0 \qquad (25)$$

The result of determination by the conventional voltage polarity determination circuit 303 indicates discharging, which is correct.

FIGS. 30A-30D show example operation of the conventional voltage polarity determination circuit 303 when the input voltage Vin is 0<Vin<Vos (charge state) and when Vin<0 (discharge state), where the input offset voltage Vos>0. In both the charge state and the discharge state, the output voltage V30 of the integration circuit 300 reaches the first reference voltage VH, and only the output V31 of one of the first and second comparison circuits 601 and 602 is inverted, and therefore, the polarity of the charging/discharging current is incorrectly determined in the charge state.

FIG. 31 is a diagram showing whether the result of determination by the conventional voltage polarity determination circuit 303 is correct or incorrect with respect to the input offset voltage Vos and the input voltage range of the input voltage Vin. As can be seen from FIG. 31, the conventional voltage polarity determination circuit 303 has a range within which the determination result is incorrect, with respect to the input voltage range.

As described above, in the conventional voltage polarity determination circuit 303, none of the output voltages V31 and V32 of the first and second comparison circuits 601 and 602 may be inverted, due to the input offset voltage Vos of the operational amplifier circuit 300a used in the integration circuit 300, so that the polarity of the charging/discharging current may fail to be determined, and moreover, the polarity of the charging/discharging current may be incorrectly determined within some input voltage ranges.

Also, the conventional charge amount measurement circuit 2 have problems that it takes a long time to perform the trimming step when the input offset voltage Vos is close to 0 V and that there is a range within which measurement is not allowed and which is called a dead zone, within the input voltage range, under some input conditions.

As to the first problem, in the trimming step, when the input offset voltage Vos is close to 0 V, Expression 7 is rewritten as:

$$T_{os} = CR \cdot \frac{V_H - V_L}{V_{os}} \approx \infty \;(V_{os} \approx 0V) \qquad (26)$$

It may takes a long time for the output voltages of both the first and second comparison circuits 102 and 103 to be inverted. In other words, the trimming step takes a long time, which is disadvantageous to the mass production of the product. Moreover, when the trimming step takes a longer time, the timer 207 which measure information over a longer time and the register 108 which stores the information require a larger number of bits, resulting in an increase in circuit size, which causes an increase in area.

The second problem is that the conventional charge amount measurement circuit 2 has a dead zone. In the measurement step, when the input voltage Vin is within the dead zone range, the measurement time may be longer than the time interval Tos measured in the trimming step, so that the output voltage V20 of the integration circuit 200 may not increase, and the asynchronous counter 206 may not increment. Therefore, the charge amount may not be measured during charging/discharging.

FIGS. 32A and 32B are diagrams showing a distribution of the input offset voltage Vos and ranges of the input voltage Vin, of the operational amplifier circuit 200a of the integration circuit 200 included the conventional charge amount measurement circuit 2. The input offset voltage Vos of the operational amplifier circuit 200a cannot be caused to be 0 V for all mass-produced products, i.e., there are invariably variations in the input offset voltage Vos (FIG. 32A). For example, when the input offset voltage of a product is +Vos, the time interval Tm which it takes for the output voltage V20 of the integration circuit 200 to reach from the second reference voltage VL to the first reference voltage VH in the conventional charge amount measurement circuit 2, is represented by Expression 9 above.

When Vin<0 V and Vin>2Vos, Tm<Tos, and therefore, the conventional charge amount measurement circuit 2 can correct the influence of the input offset voltage Vos.

However, when the input voltage Vin is within the range of 0 V≤Vin≤2Vos, the following is established:

$$T_m > T_{os} \qquad (27)$$

The conventional charge amount measurement circuit 2 does not have a function of correcting the influence of the input offset voltage Vos under this input condition, and therefore, cannot measure a correct charge amount. Similarly, if the input offset voltage of a product including the conventional charge amount measurement circuit 2 is −Vos, then when −2Vos≤Vin<0 V, the conventional charge amount measurement circuit 2 cannot measure a correct charge amount.

Therefore, when the input offset voltages Vos of mass-produced products vary within the range of −Vos to +Vos, there is a range within which the charge amount cannot be correctly measured, such as the range of −2Vos to +2Vos, i.e., a dead zone (FIG. 32B). For example, the input offset voltage of ±1.5 mV corresponds to a current of ±150 mA flowing through the sensing resistor Rin. The conventional charge amount measurement circuit 2 has measurement ranges of −2.0 A to −300 mA and +300 mA to +2.0 A and a dead zone of −300 mA to +300 mA.

If the standby current of a mobile electronic device having a secondary battery whose capacity is 2400 mAh is 15 mA, the charge amount (quantity of electricity) of 2400 mAh is exhausted in about one week, i.e., the actual remaining capacity is zero. However, because the conventional charge amount measurement circuit 2 has a dead zone, the remaining capacity is displayed as 2400 mAh.

As described above, in the conventional charge amount measurement circuit 2, when the input offset voltage Vos of the operational amplifier circuit 200a used in the integration circuit 200 is close to 0 V, it takes a long time to perform the trimming step, and therefore, the circuit sizes of the timer 207 for measuring information for a long time and the register 108 for storing the information increase, leading to an increase in area. Moreover, there is a problem that there is a dead zone and therefore there is an input voltage range within which measurement cannot be correctly performed.

SUMMARY

The present disclosure describes implementations of a voltage polarity determination circuit which correctly determines the polarity of a voltage to be measured.

The present disclosure also describes implementation of a technique of measuring a charge amount or a current value over the entire measurement range of an input voltage without suffering a dead zone.

An example voltage polarity determination circuit according to the present disclosure includes an integration circuit, a switch, and a time measurement circuit. The integration circuit includes an operational amplifier circuit having an input offset voltage which is larger than the maximum value of a voltage input to the integration circuit or smaller than the minimum value of the input voltage of the integration circuit. The switch switches the input voltage of the integration circuit between a voltage whose polarity is to be determined and a reference voltage. The time measurement circuit measures a time interval which it takes for the output voltage of the integration circuit to reach a set voltage, and based on the result of the measurement, determines the polarity of the input voltage of the integration circuit.

In the voltage polarity determination circuit, the input offset voltage of the operational amplifier circuit used in the integration circuit is larger than the absolute value of the input voltage of the integration circuit. Therefore, the polarity of the input voltage, i.e., the polarity of the voltage whose polarity is to be determined, can be correctly determined within a continuous input voltage range smaller than the input offset voltage. Moreover, the state that the input voltage is equal to the input offset voltage is avoided, and therefore, the polarity of the input voltage, i.e., the polarity of the voltage whose polarity is to be determined, can be invariably determined.

Preferably, the time measurement circuit includes a first comparison circuit, a second comparison circuit, a logic circuit, a counter, and a determination circuit. The first comparison circuit compares the output voltage of the integration circuit with a first reference voltage, and outputs the result of the comparison. The second comparison circuit compares the output voltage of the integration circuit with a second reference voltage, and outputs the result of the comparison. The logic circuit outputs a voltage which is set or reset in response to inversion of the output voltage of the first comparison circuit or inversion of the output voltage of the second comparison circuit. The counter measures a time interval which it takes for the output of the logic circuit to reach a set value. The determination circuit measures a time interval between when the input voltage of the integration circuit is switched by the switch and when the value measured by the counter reaches a set value, and based on the result of the measurement, determines the polarity of the input voltage of the integration circuit. The voltage polarity determination circuit further includes an initialization circuit which initializes the output voltage of the integration circuit in response to the output of the logic circuit.

In the voltage polarity determination circuit, the input offset voltage of the operational amplifier circuit used in the integration circuit is larger than the absolute value of the input voltage of the integration circuit. Therefore, the polarity of the input voltage, i.e., the polarity of the voltage whose polarity is to be determined, can be correctly determined within a continuous input voltage range smaller than the input offset voltage. Moreover, the state that the input voltage is equal to the input offset voltage is avoided, and therefore, the polarity of the input voltage, i.e., the polarity of the voltage whose polarity is to be determined, can be invariably determined.

Moreover, even in a system in which a time interval is measured by measuring the number of clocks using a counter, the polarity can be correctly measured over the entire input voltage range.

Preferably, the voltage whose polarity is to be determined is a voltage between both ends of a sensing resistor connected in series to a predetermined power supply. In this case, the polarity of a current flowing through the sensing resistor can be determined.

An example charge amount measurement circuit according to the present disclosure includes a voltage-to-charge conversion circuit configured to convert an input voltage into pulses corresponding to a charge amount, a charging measurement circuit and a discharging measurement circuit each configured to count the output pulses of the voltage-to-charge conversion circuit, and a storage circuit configured to store a count value of the charging measurement circuit which is obtained when the input voltage is 0 V, and set the count value into the charging measurement circuit. When the count value of the charging measurement circuit reaches overflow, a count value of the discharging measurement circuit is subtracted, and when the count value of the discharging measurement circuit reaches overflow, the count value of the charging measurement circuit is subtracted. The voltage-to-charge conversion circuit includes an integration circuit including an operational amplifier circuit having an input offset voltage which is larger than a maximum value of the input voltage or smaller than a minimum value of the input voltage.

Another example charge amount measurement circuit according to the present disclosure includes a voltage-to-charge conversion circuit configured to convert an input voltage into pulses corresponding to a charge amount, a charge measurement circuit configured to count the output pulses of the voltage-to-charge conversion circuit, and a time measurement circuit configured to measure a time interval which it takes for the charge measurement circuit to overflow when the input voltage is 0 V using a clock, and indicate the lapse of a measurement time during measurement of a charge amount, a charge integration circuit configured to count the number of clocks corresponding to a difference in overflow time between the charge measurement circuit and the time measurement circuit, and a storage circuit configured to store a count value of the time measurement circuit which is obtained when the input voltage is 0 V, and set the count value into the time measurement circuit. The voltage-to-charge conversion circuit includes an integration circuit including an operational amplifier circuit having an input offset voltage which is larger than a maximum value of the input voltage or smaller than a minimum value of the input voltage.

According to the present disclosure, the input offset voltage of the operational amplifier circuit used in the integration circuit is larger than the absolute value of the input voltage. Therefore, a charge amount during charging/discharging can be correctly determined within a continuous input voltage range smaller than the input offset voltage.

According to the voltage polarity determination circuit of the present disclosure, the polarity of the input voltage, i.e., the polarity of the voltage whose polarity is to be determined, can be correctly determined over the entire input voltage range.

According to the charge amount measurement circuit of the present disclosure, a charge amount or a current value can be measured over the entire measurement range of the input voltage without suffering a dead zone.

BRIEF DESCRIPTION OF THE DRAWINGS

FIG. 8A is a diagram of a waveform in operation of the charge amount measurement circuit of FIG. 7 in a trimming step, showing an input voltage of the charge amount measurement circuit.

FIG. 8B is a diagram of a waveform in the operation of the charge amount measurement circuit of FIG. 7 in the trimming step, showing an output voltage of an integration circuit.

FIG. 8C is a diagram of a waveform in the operation of the charge amount measurement circuit of FIG. 7 in the trimming step, showing an output voltage of a first comparison circuit.

FIG. 8D is a diagram of a waveform in the operation of the charge amount measurement circuit of FIG. 7 in the trimming step, showing an output voltage of a second comparison circuit.

FIG. 8E is a diagram of a waveform in the operation of the charge amount measurement circuit of FIG. 7 in the trimming step, showing an output voltage of a logic circuit.

FIG. 8F is a diagram of a waveform in the operation of the charge amount measurement circuit of FIG. 7 in the trimming step, showing a state of a charge counter.

FIG. 8G is a diagram of a waveform in operation of the charge amount measurement circuit of FIG. 7 in the trimming step, showing a voltage of a clock.

FIG. 8H is a diagram of a waveform in the operation of the charge amount measurement circuit of FIG. 7 in the trimming step, showing a state of a measurement counter.

FIG. 9A is a diagram of a waveform in operation of the charge amount measurement circuit of FIG. 7 during charging, showing an input voltage of the charge amount measurement circuit.

FIG. 9B is a diagram of a waveform in the operation of the charge amount measurement circuit of FIG. 7 during charging, showing an output voltage of the integration circuit.

FIG. 9C is a diagram of a waveform in the operation of the charge amount measurement circuit of FIG. 7 during charging, showing an output voltage of the logic circuit.

FIG. 9D is a diagram of a waveform in the operation of the charge amount measurement circuit of FIG. 7 during charging, showing a state of the charge counter.

FIG. 9E is a diagram of a waveform in the operation of the charge amount measurement circuit of FIG. 7 during charging, showing a voltage of the clock.

FIG. 9F is a diagram of a waveform in the operation of the charge amount measurement circuit of FIG. 7 during charging, showing a state of the measurement counter.

FIG. 9G is a diagram of a waveform in the operation of the charge amount measurement circuit of FIG. 7 during charging, showing a state of a charging counter.

FIG. 10A is a diagram of a waveform in operation of the charge amount measurement circuit of FIG. 7 during discharging, showing an input voltage of the charge amount measurement circuit.

FIG. 10B is a diagram of a waveform in the operation of the charge amount measurement circuit of FIG. 7 during discharging, showing an output voltage of the integration circuit.

FIG. 10C is a diagram of a waveform in the operation of the charge amount measurement circuit of FIG. 7 during discharging, showing an output voltage of the logic circuit.

FIG. 10D is a diagram of a waveform in the operation of the charge amount measurement circuit of FIG. 7 during discharging, showing a state of the charge counter.

FIG. 10E is a diagram of a waveform in the operation of the charge amount measurement circuit of FIG. 7 during discharging, showing a state of a discharging counter.

FIG. 10F is a diagram of a waveform in the operation of the charge amount measurement circuit of FIG. 7 during discharging, showing a state of the measurement counter.

FIG. 10G is a diagram of a waveform in the operation of the charge amount measurement circuit of FIG. 7 during discharging, showing a voltage of the clock.

FIG. 11A is a diagram of times in the measurement counter and the charge counter represented by number lines, showing a temporal relationship in a trimming step.

FIG. 11B is a diagram of times in the measurement counter and the charge counter represented by number lines, showing a temporal relationship during charging.

FIG. 11C is a diagram of times in the measurement counter and the charge counter represented by number lines, showing a temporal relationship during discharging.

FIG. 13A is a diagram of a waveform in operation of the charge amount measurement circuit of FIG. 12 in a trimming step, showing an input voltage of the charge amount measurement circuit.

FIG. 13B is a diagram of a waveform in the operation of the charge amount measurement circuit of FIG. 12 in the trimming step, showing an output voltage of an integration circuit.

FIG. 13C is a diagram of a waveform in the operation of the charge amount measurement circuit of FIG. 12 in the trimming step, showing an output voltage of a first comparison circuit.

FIG. 13D is a diagram of a waveform in the operation of the charge amount measurement circuit of FIG. 12 in the trimming step, showing an output voltage of a second comparison circuit.

FIG. 13E is a diagram of a waveform in the operation of the charge amount measurement circuit of FIG. 12 in the trimming step, showing an output voltage of a logic circuit.

FIG. 13F is a diagram of a waveform in the operation of the charge amount measurement circuit of FIG. 12 in the trimming step, showing a state of a charge counter.

FIG. 13G is a diagram of a waveform in the operation of the charge amount measurement circuit of FIG. 12 in the trimming step, showing a voltage of a clock.

FIG. 13H is a diagram of a waveform in the operation of the charge amount measurement circuit of FIG. 12 in the trimming step, showing a state of a measurement counter.

FIG. 14A is a diagram of a waveform in operation of the charge amount measurement circuit of FIG. 12 during charging, showing an input voltage of the charge amount measurement circuit.

FIG. 14B is a diagram of a waveform in the operation of the charge amount measurement circuit of FIG. 12 during charging, showing an output voltage of the integration circuit.

FIG. 14C is a diagram of a waveform in the operation of the charge amount measurement circuit of FIG. 12 during charging, showing an output voltage of a logic circuit.

FIG. 14D is a diagram of a waveform in the operation of the charge amount measurement circuit of FIG. 12 during charging, showing a state of the charge counter.

FIG. 14E is a diagram of a waveform in the operation of the charge amount measurement circuit of FIG. 12 during charging, showing an overflow signal of the charge counter.

FIG. 14F is a diagram of a waveform in the operation of the charge amount measurement circuit of FIG. 12 during charging, showing a state of the measurement counter.

FIG. 14G is a diagram of a waveform in the operation of the charge amount measurement circuit of FIG. 12 during charging, showing an overflow signal of the measurement counter.

FIG. 14H is a diagram of a waveform in the operation of the charge amount measurement circuit of FIG. 12 during charging, showing an enable signal from a start/stop control circuit.

FIG. 14I is a diagram of a waveform in the operation of the charge amount measurement circuit of FIG. 12 during charging, showing a voltage of the clock.

FIG. 14J is a diagram of a waveform in the operation of the charge amount measurement circuit of FIG. 12 during charging, showing a state of an integration counter.

FIG. 15A is a diagram of a waveform in operation of the charge amount measurement circuit of FIG. 12 during discharging, showing an input voltage of the charge amount measurement circuit.

FIG. 15B is a diagram of a waveform in the operation of the charge amount measurement circuit of FIG. 12 during discharging, showing an output voltage of the integration circuit.

FIG. 15C is a diagram of a waveform in the operation of the charge amount measurement circuit of FIG. 12 during discharging, showing an output voltage of the logic circuit.

FIG. 15D is a diagram of a waveform in the operation of the charge amount measurement circuit of FIG. 12 during discharging, showing a state of the charge counter.

FIG. 15E is a diagram of a waveform in the operation of the charge amount measurement circuit of FIG. 12 during discharging, showing an overflow signal of the charge counter.

FIG. 15F is a diagram of a waveform in the operation of the charge amount measurement circuit of FIG. 12 during discharging, showing a state of the measurement counter.

FIG. 15G is a diagram of a waveform in the operation of the charge amount measurement circuit of FIG. 12 during discharging, showing an overflow signal of the measurement counter.

FIG. 15H is a diagram of a waveform in the operation of the charge amount measurement circuit of FIG. 12 during discharging, showing an enable signal from the start/stop control circuit.

FIG. 15I is a diagram of a waveform in the operation of the charge amount measurement circuit of FIG. 12 during discharging, showing a voltage of the clock.

FIG. 15J is a diagram of a waveform in the operation of the charge amount measurement circuit of FIG. 12 during discharging, showing a state of the integration counter.

FIG. 16A is a diagram of times in the measurement counter, the charge counter, and the integration counter represented by number lines, showing a temporal relationship in a trimming step.

FIG. 16B is a diagram of times in the measurement counter, the charge counter, and the integration counter represented by number lines, showing a temporal relationship during charging.

FIG. 16C is a diagram of times in the measurement counter, the charge counter, and the integration counter represented by number lines, showing a temporal relationship during discharging.

FIGS. 17A and 17B are diagrams showing a distribution of an input offset voltage and an input voltage range of the integration circuit of FIGS. 8 and 12.

FIG. 27A is a diagram of a waveform indicating operation of the charge amount measurement circuit of FIG. 26 in a trimming step, showing an input voltage of the charge amount measurement circuit.

FIG. 27B is a diagram of a waveform indicating the operation of the charge amount measurement circuit of FIG. 26 in the trimming step, showing an output voltage of the integration circuit.

FIG. 27C is a diagram of a waveform indicating the operation of the charge amount measurement circuit of FIG. 26 in the trimming step, showing an output voltage of the first comparison circuit.

FIG. 27D is a diagram of a waveform indicating the operation of the charge amount measurement circuit of FIG. 26 in the trimming step, showing an output voltage of the second comparison circuit.

FIG. 27E is a diagram of a waveform indicating the operation of the charge amount measurement circuit of FIG. 26 in the trimming step, showing an output voltage of a logic circuit.

FIG. 27F is a diagram of a waveform indicating the operation of the charge amount measurement circuit of FIG. 26 in the trimming step, showing a voltage of a clock.

FIG. 28A is a diagram of a waveform indicating operation of the charge amount measurement circuit of FIG. 26 during charging, showing an input voltage of the charge amount measurement circuit.

FIG. 28B is a diagram of a waveform indicating the operation of the charge amount measurement circuit of FIG. 26 during charging, showing an output voltage of the integration circuit.

FIG. 28C is a diagram of a waveform indicating the operation of the charge amount measurement circuit of FIG. 26 during charging, showing an output voltage of the first comparison circuit.

FIG. 28D is a diagram of a waveform indicating the operation of the charge amount measurement circuit of FIG. 26 during charging, showing an output voltage of the second comparison circuit.

FIG. 28E is a diagram of a waveform indicating the operation of the charge amount measurement circuit of FIG. 26 during charging, showing an output voltage of the logic circuit.

FIG. 28F is a diagram of a waveform indicating the operation of the charge amount measurement circuit of FIG. 26 during charging, showing a voltage of the clock.

FIG. 28G is a diagram of a waveform indicating the operation of the charge amount measurement circuit of FIG. 26 during charging, showing a state of an asynchronous counter.

FIG. 29A is a diagram of a waveform indicating operation of the charge amount measurement circuit of FIG. 26 during discharging, showing an input voltage of the charge amount measurement circuit.

FIG. 29B is a diagram of a waveform indicating the operation of the charge amount measurement circuit of FIG. 26 during discharging, showing an output voltage of the integration circuit.

FIG. 29C is a diagram of a waveform indicating the operation of the charge amount measurement circuit of FIG. 26 during discharging, showing an output voltage of the first comparison circuit.

FIG. 29D is a diagram of a waveform indicating the operation of the charge amount measurement circuit of FIG. 26 during discharging, showing an output voltage of the second comparison circuit.

FIG. 29E is a diagram of a waveform indicating the operation of the charge amount measurement circuit of FIG. 26 during discharging, showing an output voltage of the logic circuit.

FIG. 29F is a diagram of a waveform indicating the operation of the charge amount measurement circuit of FIG. 26 during discharging, showing a voltage of the clock.

FIG. 29G is a diagram of a waveform indicating the operation of the charge amount measurement circuit of FIG. 26 during discharging, showing a state of an asynchronous counter.

FIG. 30A is a diagram of a voltage waveform where an input voltage of the conventional voltage polarity determination circuit is smaller than an input offset voltage, showing the input voltage of the voltage polarity determination circuit.

FIG. 30B is a diagram of a voltage waveform where an input voltage of the conventional voltage polarity determination circuit is smaller than an input offset voltage, showing an output voltage of the integration circuit.

FIG. 30C is a diagram of a voltage waveform where an input voltage of the conventional voltage polarity determination circuit is smaller than an input offset voltage, showing an output voltage of the first comparison circuit.

FIG. 30D is a diagram of a voltage waveform where an input voltage of the conventional voltage polarity determination circuit is smaller than an input offset voltage, showing an output voltage of the second comparison circuit.

DETAILED DESCRIPTION

Embodiments of the present disclosure will be described with reference to the drawings.

First Embodiment

Figure 1:
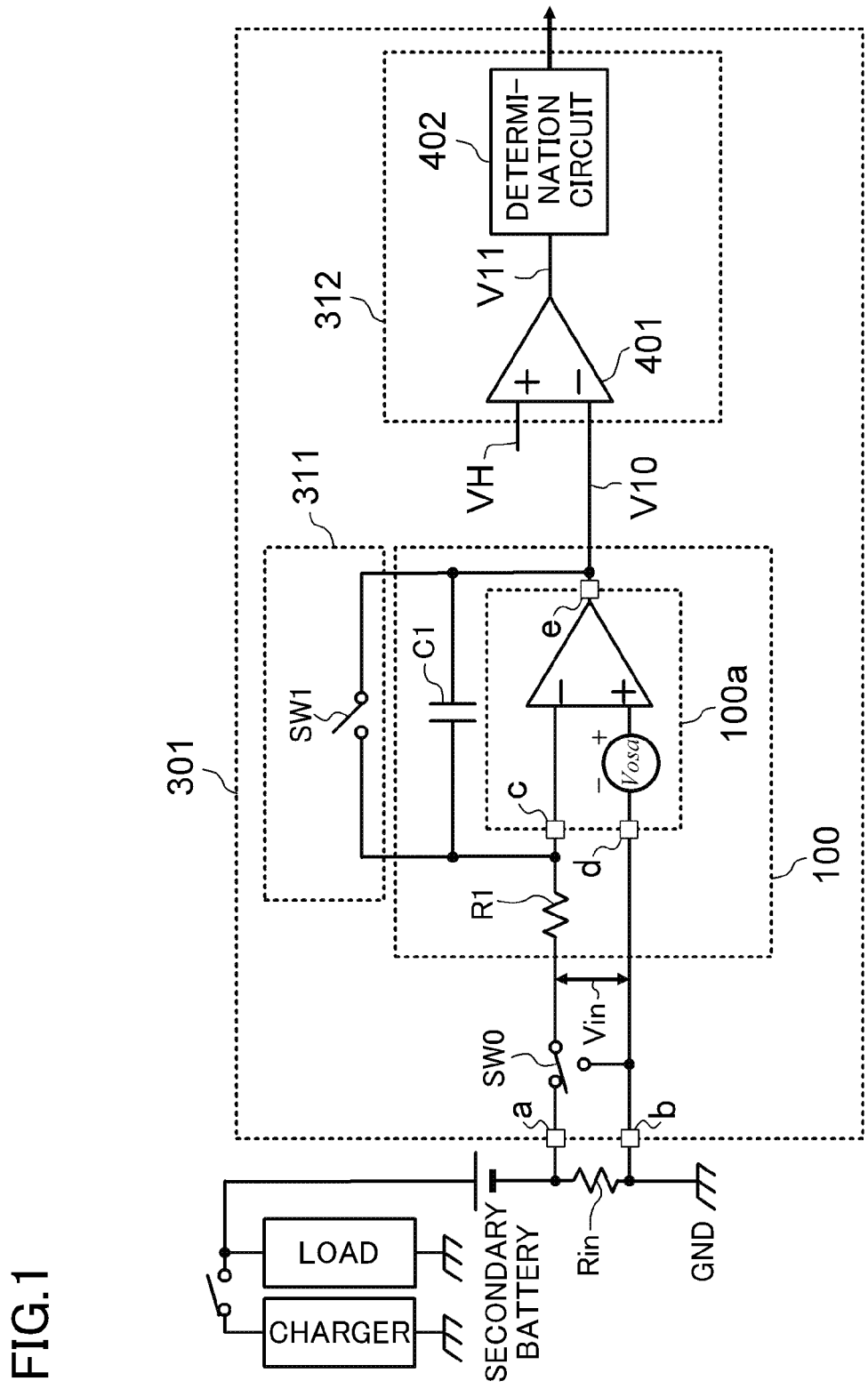
FIG. 1 is a diagram showing a voltage polarity determination circuit according to a first embodiment.

FIG. 1 is a diagram showing a configuration of a voltage polarity determination circuit 301 according to a first embodiment. The voltage polarity determination circuit 301 includes a switch SW0, an integration circuit 100, an initialization circuit 311, and a time measurement circuit 312.

The integration circuit 100 includes an operational amplifier circuit 100a, a capacitor C1, and a resistor R1. The capacitor C1 is connected between an output terminal e and an inverting input terminal c of the operational amplifier circuit 100a. The resistor R1 is connected between the inverting input terminal c of the operational amplifier circuit 100a and the switch SW0. A non-inverting input terminal d of the operational amplifier circuit 100a is connected via a GND terminal b to a reference voltage GND. The operational amplifier circuit 100a has an input offset voltage Vosa having a level outside an input voltage range. Here, the term "outside an input voltage range" means a region which is larger than the maximum value of an input voltage Vin of the integration circuit 100 or smaller than the minimum value of the input voltage Vin of the integration circuit 100. The input offset voltage Vosa is desirably set to a level outside the input voltage range of the input voltage Vin, or alternatively, may be set to a region close to the maximum or minimum value in which the frequency of occurrence of the input voltage Vin is small.

The switch SW0 switches the connection destination of the inverting input terminal c of the operational amplifier circuit 100a between the input terminal a and the GND terminal b.

The input terminal a is connected to a node between the negative electrode of a secondary battery and a sensing resistor Rin.

The initialization circuit 311 includes a switch SW1. The switch SW1 is connected between the output terminal e and inverting input terminal c of the operational amplifier circuit 100a and in parallel to the capacitor C1.

The time measurement circuit 312 includes a comparison circuit 401 and a determination circuit 402. The comparison circuit 401 compares an output voltage V10 of the integration circuit 100 with a reference voltage VH, and outputs the result. The determination circuit 402 measures a time interval (Tdis or Tch) between when the switch SW0 switches the connection destination of the inverting input terminal c to the input terminal a or the GND terminal b and when an output voltage V11 of the comparison circuit 401 is inverted.

Next, operation of the voltage polarity determination circuit 301 thus configured will be described with reference to FIGS. 2A-2C. Here, to facilitate the understanding of the operation, an example will be described in which a current is constant, i.e., the input voltage Vin is constant, and the input offset voltage Vosa>0.

Figure 2:
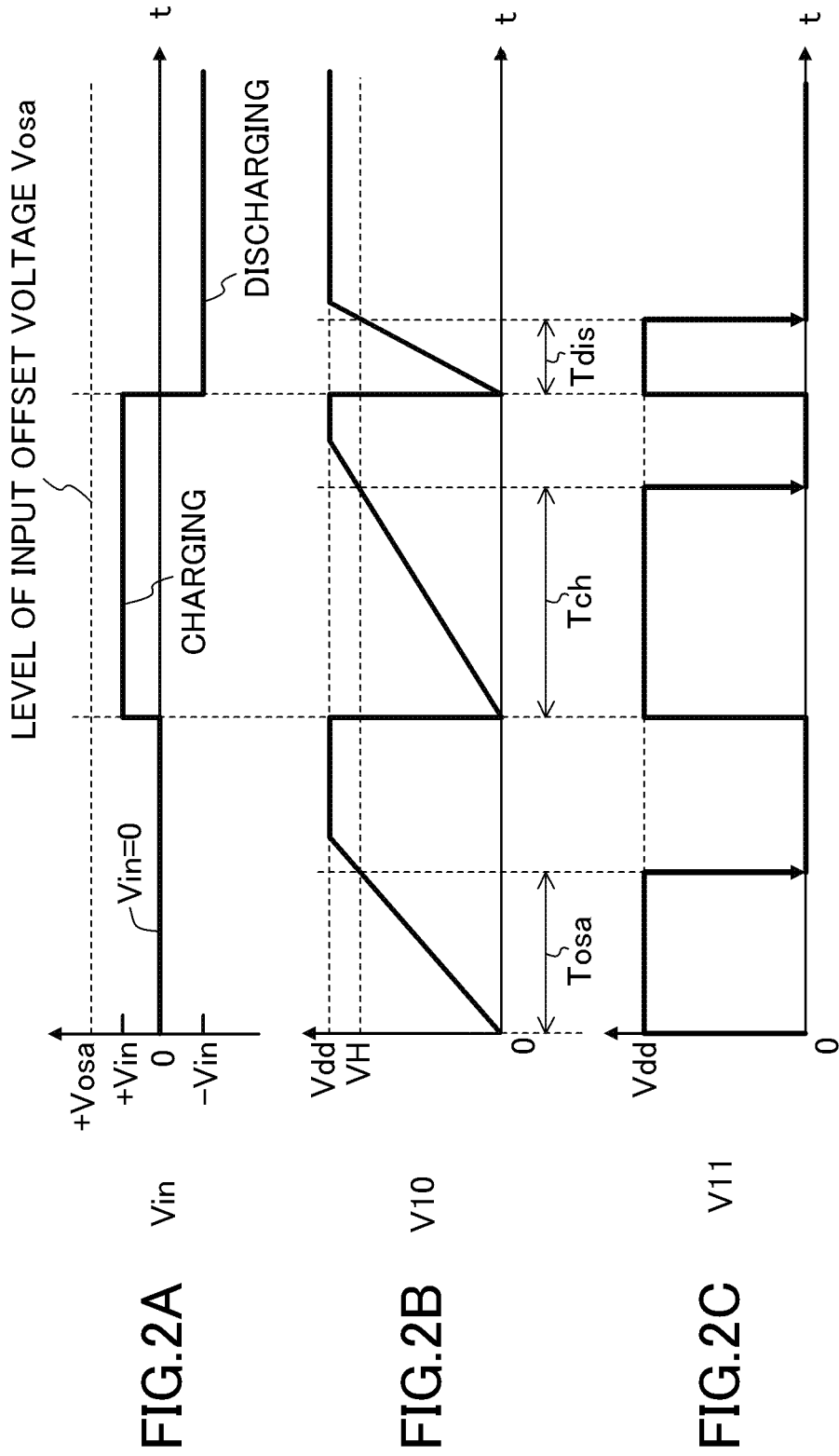
FIG. 2A is a diagrams showing a waveform of an input voltage of the voltage polarity determination circuit.
FIG. 2B is a diagram showing a waveform of an output voltage of an integration circuit.
FIG. 2C is a diagram showing a waveform of an output voltage of a comparison circuit.

Initially, the switch SW0 is switched to the reference voltage GND (=0 V), so that the input voltage Vin=0 V as shown in FIG. 2A, and a reference time interval for determination of charging/discharging is measured. In this case, the output voltage V10 of the integration circuit 100 reaches from the reference voltage GND to the reference voltage VH. The reference voltage VH is represented by:

$$V_H = -\frac{1}{C_1 R_1} \int_0^{T_{osa}} (0 - V_{osa}) dt \quad (28)$$

where Tosa is the reference time interval for determination of charging/discharging.

According to Expression 28, the time interval Tosa is represented by:

$$T_{osa} = C_1 R_1 \cdot \frac{V_H}{V_{osa}} \quad (29)$$

After the lapse of the time interval Tosa, the output voltage V11 of the comparison circuit 401 is inverted as shown in FIG. 2C. The time interval Tosa is used as the reference time interval for determining the polarity of charging/discharging.

Next, the switch SW0 is switched to the input terminal a, and a time interval corresponding to the charge or discharge state is measured. In this case, the input voltage Vin having a polarity differing between charging and discharging of the secondary battery is applied.

When the secondary battery is being charged, a current flows into the positive electrode of the battery and then flows out from the negative electrode of the battery through the reference voltage GND (=0 V). Therefore, the input voltage Vin>0 V (FIG. 2A, charging). In this case, because the input offset voltage Vosa is set to be larger than the input voltage range (Vosa>Vin), the output voltage V10 of the integration circuit 100 satisfies, within an input voltage range (0 V<Vin<Vosa) during charging:

$$V_H = -\frac{1}{C_1 R_1} \int_0^{T_{ch}} (-V_{in} - V_{osa}) dt \quad (30)$$

where Tch is the time interval which it takes for the output voltage V10 of the integration circuit 100 to reach from the reference voltage GND to the reference voltage VH (FIG. 2B, charging).

According to Expression 30, the time interval Tch is represented by:

$$T_{ch} = C_1 R_1 \cdot \frac{V_H}{V_{in} + V_{osa}} \quad (31)$$

After the lapse of the time interval Tch, the output voltage V11 of the comparison circuit 401 is inverted (FIG. 2C, charging). In this case, the time interval Tch is longer than the time interval Tosa.

When the secondary battery is being discharged, a current flows from the positive electrode of the battery through the reference voltage GND (=0 V) to the negative electrode of the battery, and therefore, the input voltage Vin<0 V (FIG. 2A, discharging). In this case, because the input offset voltage Vosa is larger than the input voltage range (Vosa>Vin), the output voltage V10 of the integration circuit 100 satisfies, within an input voltage range (−Vosa<Vin<0 V) during discharging:

$$V_H = -\frac{1}{C_1 R_1} \int_0^{T_{dis}} (V_{in} - V_{osa}) dt \quad (32)$$

where Tdis is the time interval which it takes for the output voltage V10 of the integration circuit 100 to reach from the reference voltage GND to the reference voltage VH (FIG. 2B, discharging).

According to Expression 32, the time interval Tdis is represented by:

$$T_{dis} = C_1 R_1 \cdot \frac{V_H}{-V_{in} + V_{osa}} \quad (33)$$

After the lapse of the time interval Tdis, the output voltage V11 of the comparison circuit 401 is inverted (FIG. 2C, discharging). In this case, the time interval Tdis is shorter than the time interval Tosa.

Therefore, the following relationship is established within the input voltage range (−Vosa<Vin<Vosa) of the input voltage Vin:

$$T_{dis} < T_{osa} < T_{ch} \quad (34)$$

Therefore, the time interval Tosa may be initially, or regularly or irregularly, measured before the time interval Tdis or Tch may be measured and compared with the time interval Tosa, whereby the charge/discharge state can be determined.

Figure 3:
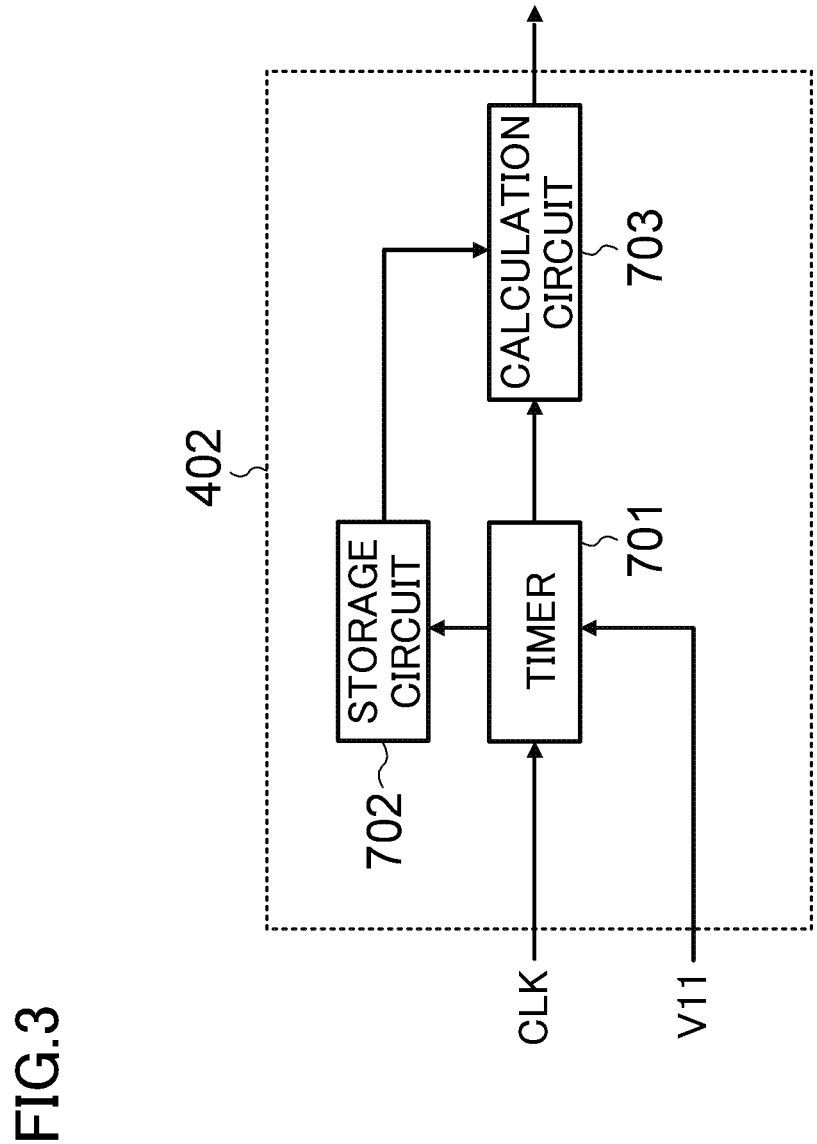
FIG. 3 is a block diagram showing an example internal configuration of a determination circuit of FIG. 1.

This comparison is performed as follows. In the determination circuit 402, the results of measurement of the time intervals Tosa, Tdis, and Tch are stored in a storage circuit, such as a register etc., and for example, the time intervals Tdis and Tch are subtracted from the time interval Tosa. For example, as shown in FIG. 3, the determination circuit 402 includes a timer 701 which measures, using a clock CLK, the time interval between when the input voltages to the integration circuit 100 are switched by the switch SW0 and when the output voltage V11 of the comparison circuit 401 is inverted, a storage circuit 702 which stores the result of measurement by the timer 701, and a calculation circuit 703 which compares the measurement result. The determination circuit 402 may be a down counter in which the result of measurement of the time interval Tosa is set. Note that the process of the determination circuit 402 may be performed by a microcomputer or a dedicated calculation circuit which is provided outside the voltage polarity determination circuit 301.

Thus, according to this embodiment, the input offset voltage Vosa of the operational amplifier circuit 100a used in the integration circuit 100 is caused to be larger than the input voltage Vin, whereby the polarity of a charging/discharging current can be correctly determined within a continuous range of the input voltage Vin, i.e., −Vosa<Vin<Vosa. Also, if the input voltage value Vin and the input offset voltage value Vosa are set to satisfy the condition that Vin<Vosa and have an appropriate difference, the state that Vin=Vosa can be avoided. Therefore, in this case, the output voltage V11 of the comparison circuit 401 is invariably inverted, whereby the polarity of the charging/discharging current can be determined.

Note that, in this embodiment, the time which it takes for the output voltage V10 of the integration circuit 100 to reach the reference voltage VH with respect to the input voltage Vin is compared to determine the polarity of the charging/discharging current. Alternatively, a reference time interval may be set, and a level which the output voltage V10 of the integration circuit 100 reaches after the lapse of the reference time interval may be measured and compared with a level of the output voltage V10 of the integration circuit 100 which is obtained when the input voltage Vin=0 V. In this case, an advantage similar to this embodiment is obtained.

Second Embodiment

Figure 4:
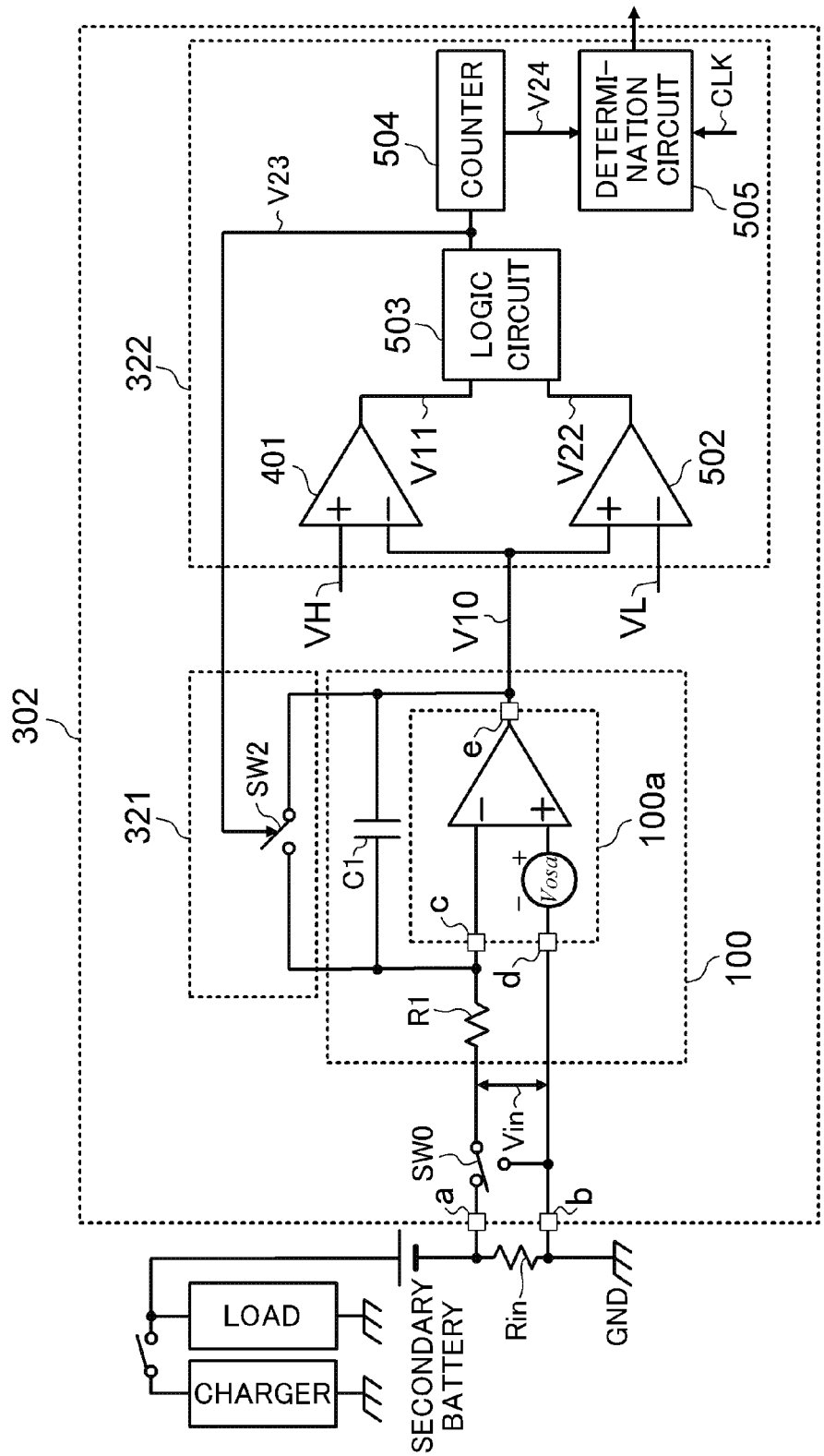
FIG. 4 is a diagram showing a voltage polarity determination circuit according to a second embodiment.

FIG. 4 is a diagram showing a configuration of a voltage polarity determination circuit 302 according to a second embodiment. The voltage polarity determination circuit 302 includes a switch SW0, an integration circuit 100, an initialization circuit 321, and a time measurement circuit 322.

The integration circuit 100 includes an operational amplifier circuit 100a, a capacitor C1, and a resistor R1. The capacitor C1 is connected between an output terminal e and an inverting input terminal c of the operational amplifier circuit 100a. The resistor R1 is connected between an inverting input terminal c of the operational amplifier circuit 100a and the switch SW0. A non-inverting input terminal d of the operational amplifier circuit 100a is connected via a GND terminal b to a reference voltage GND. The operational amplifier circuit 100a has an input offset voltage Vosa outside an input voltage range. As in the first embodiment, the term "outside an input voltage range" means a region which is larger than the maximum value of an input voltage Vin of the integration circuit 100 or smaller than the minimum value of the input voltage Vin of the integration circuit 100. The input offset voltage Vosa is desirably set to a level outside the input voltage range of the input voltage Vin, or alternatively, may be set to a region close to the maximum or minimum value in which the frequency of occurrence of the input voltage Vin is small.

The switch SW0 switches the connection destination of the inverting input terminal c of the operational amplifier circuit 100a between an input terminal a and the GND terminal b. The input terminal a is connected to a node between the negative electrode of a secondary battery and a sensing resistor Rin.

The time measurement circuit 322 includes a first and a second comparison circuit 401 and 502, a logic circuit 503, a counter 504, and a determination circuit 505. The first comparison circuit 401 compares an output voltage V10 of the integration circuit 100 with a first reference voltage VH, and outputs the result. The second comparison circuit 502 compares the output voltage V10 of the integration circuit 100 with a second reference voltage VL, and outputs the result. The logic circuit 503 receives an output voltage V11 of the first comparison circuit 401 and an output voltage V22 of the second comparison circuit 502, and outputs a voltage V23. The output voltage V23 of the logic circuit 503 is reset (V23=0 V) in response to a fall of the voltage V11 (Vdd→0), and is set (V23=Vdd) in response to a fall of the voltage V22 (Vdd→0). The counter 504 measures the output voltage V23 of the logic circuit 503 until the voltage V23 reaches a set value. The determination circuit 505 measures the time interval between when the connection destination of the inverting input terminal c is switched to the input terminal a or the GND terminal b by the switch SW0 and when the measurement value of the counter 504 reaches a set value, to determine the polarity of a charging/discharging current. The measurement value of the counter 504 is represented by V24, and a clock input to the determination circuit 505 is represented by CLK.

The initialization circuit 321 includes a switch SW2. The switch SW2 is connected between the output terminal e and inverting input terminal c of the operational amplifier circuit 100a and in parallel to the capacitor C1. The switch SW2 switches between the conductive state and the non-conductive state in response to the output voltage V23 of the logic circuit 503.

Next, operation of the voltage polarity determination circuit 302 thus configured will be described with reference to FIGS. 5A-5G. Here, also, to facilitate the understanding of the operation, an example will be described in which a current is constant, i.e., the input voltage Vin is constant, and the input offset voltage Vosa>0.

Figure 5:
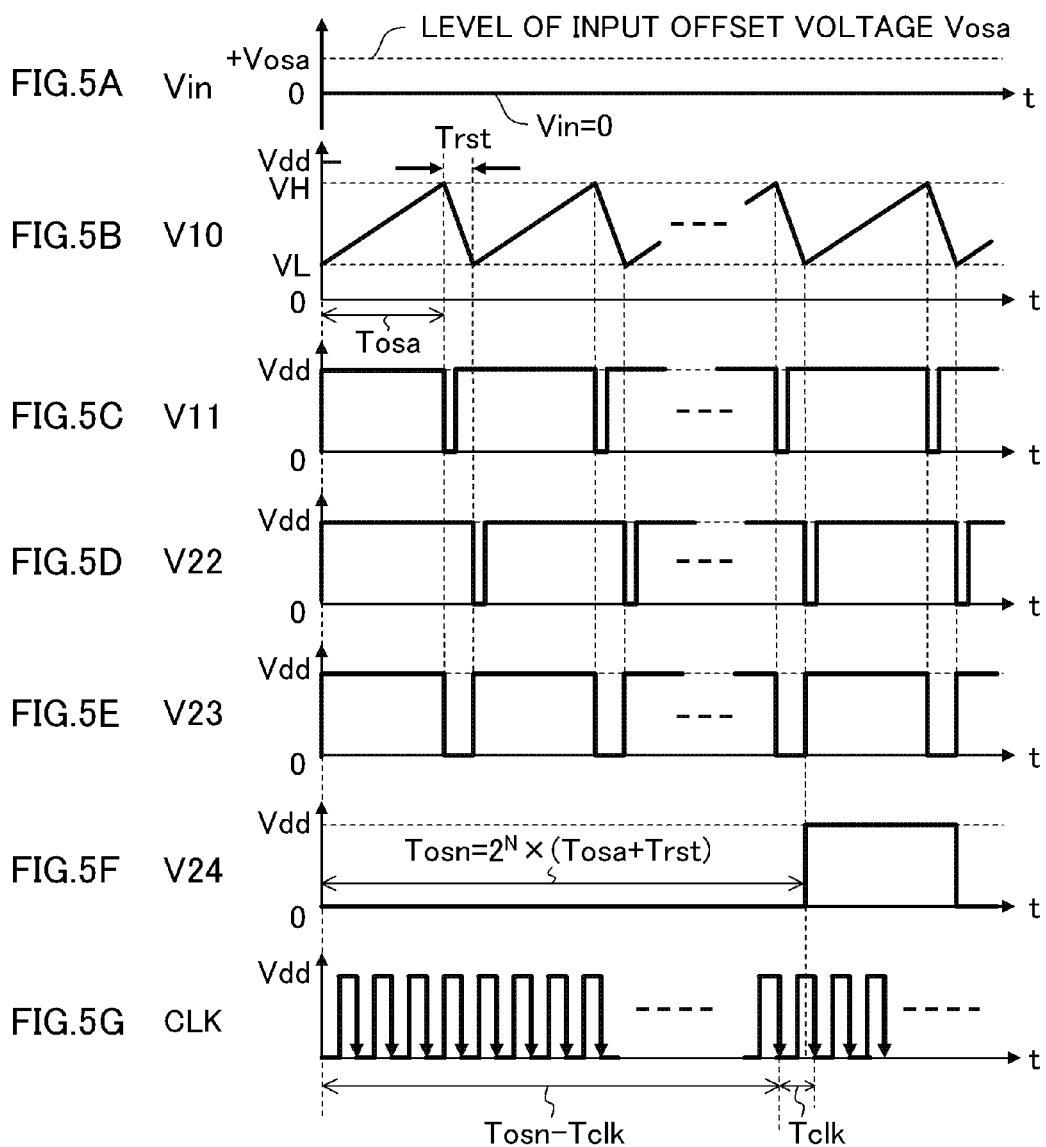
FIG. 5A is a diagram showing a waveform of an input voltage of the voltage polarity determination circuit.
FIG. 5B is a diagram showing a waveform of an output voltage of an integration circuit.
FIGS. 5C and 5D are diagrams each showing a waveform of an output voltage of a comparison circuit.
FIG. 5E is a diagram showing a waveform of an output voltage of a logic circuit.
FIG. 5F is a diagram showing a waveform of an output voltage of a counter.
FIG. 5G is a diagram showing a waveform of a clock.

Initially, the switch SW0 is switched to the reference voltage GND (=0 V), so that the input voltage Vin=0 V as shown in FIG. 5A, and a reference time interval for determining charging/discharging is measured. In this case, as shown in FIG. 5B, the output voltage V10 of the integration circuit 100 reaches from the second reference voltage VL to the first reference voltage VH. The first reference voltage VH is represented by:

$$V_H = -\frac{1}{C_1 R_1} \int_0^{T_{osa}} (0 - V_{osa}) dt + V_L \tag{35}$$

where Tosa is the time interval which it takes for the output voltage V10 of the integration circuit 100 to reach from the second reference voltage VL to the first reference voltage VH.

According to Expression 35, the time interval Tosa is represented by:

$$T_{osa} = C_1 R_1 \cdot \frac{V_H - V_L}{V_{osa}} \tag{36}$$

After the lapse of the time interval Tosa, the first output voltage V11 of the comparison circuit 401 is inverted as shown in FIG. 5C (Vdd→0). In response to this, the output voltage V23 of the logic circuit 503 is reset (V23=0 V) as shown in FIG. 5E, so that the switch SW2 of the initialization circuit 321 is transitioned to the conductive state. As a result, the capacitor C1 is discharged, so that the output voltage V10 of the integration circuit 100 reaches the second reference voltage VL (FIG. 5B). The following is established:

$$V_L = V_H \cdot e^{-\frac{T_{rst}}{C_1 R_1}} \tag{37}$$

where Trst is the time interval which it takes for the output voltage V10 of the integration circuit 100 to reach from the first reference voltage VH to the second reference voltage VL.

According to Expression 37, the time interval Trst is represented by:

$$T_{rst} = C_1 R_1 \cdot \ln \frac{V_H}{V_L} \tag{38}$$

After the lapse of the time interval Trst, the output voltage V22 of the second comparison circuit 502 is inverted as shown in FIG. 5D (Vdd→0). In response to this, the output voltage V23 of the logic circuit 503 is set (V23=Vdd) as shown in FIG. 5E, so that the switch SW2 of the initialization circuit 321 is transitioned to the non-conductive state. As a result, the output voltage V10 of the integration circuit 100 reaches from the second reference voltage VL to the first reference voltage VH again. Thereafter, this process is repeated until a set number of iterations is reached.

The time interval of one cycle of the output voltage V10 of the integration circuit 100 is represented by:

$$T_{osa} + T_{rst} \tag{39}$$

Therefore, if the set number of iterations is 2 to the power of N, a time interval Tosn which elapses until the set number of iterations is reached (FIG. 5F) is represented by:

$$T_{osn} = 2^N \cdot (T_{osa} + T_{rst}) \tag{40}$$

In the case of a system in which a time interval is measured by measuring the number of clocks CLK using a counter, the measured time interval may contain a maximum error corresponding to one clock due to a timing offset from the clock CLK (FIG. 5G). That is:

$$T_{osn} - T_{clk} = 2^N \cdot (T_{osa} + T_{rst}) - T_{clk} \tag{41}$$

If the set number of iterations N may be set to satisfy the following, whereby the influence of the period Tclk of the clock CLK is reduced, and therefore, the accuracy can be improved:

$$2^N \cdot (T_{osa} + T_{rst}) \gg T_{clk} \tag{42}$$

This time interval Tosn is used as the reference time interval for determining the polarity of charging/discharging.

Next, when the switch SW0 is switched to the input terminal a, the input voltage Vin having a polarity differing between charging and discharging of the secondary battery is applied.

In these charge and discharge operations, the operation of the circuit is similar to that of FIGS. 5A-5G, except that the measurement time differs between charging and discharging, and therefore, is not shown.

If a time interval during which the secondary battery is being discharged is represented by Tdisn, and a time interval during which the secondary battery is being charged is represented by Tchn, Tosn in FIG. 5F is replaced with Tdisn during discharging, and Tosn in FIG. 5F is replaced with Tchn during charging.

Therefore, an error caused by the clock CLK is subtracted from the time interval Tdisn during discharging:

$$T_{disn} - T_{clk} = 2^N \cdot (T_{dis} + T_{rst}) - T_{clk} \tag{43}$$

The error caused by the clock CLK is also subtracted from the time interval Tchn during charging:

$$T_{chn} - T_{clk} = 2^N \cdot (T_{ch} + T_{rst}) - T_{clk} \tag{44}$$

Thus, the following relationship is established:

$$T_{disn} < T_{osn} < T_{chn} \tag{45}$$

Therefore, the time interval Tosn may be initially, or regularly or irregularly, measured before the time interval Tdisn or Tchn may be measured and compared with the time interval Tosn, whereby the charge/discharge state can be correctly determined.

Figure 6:
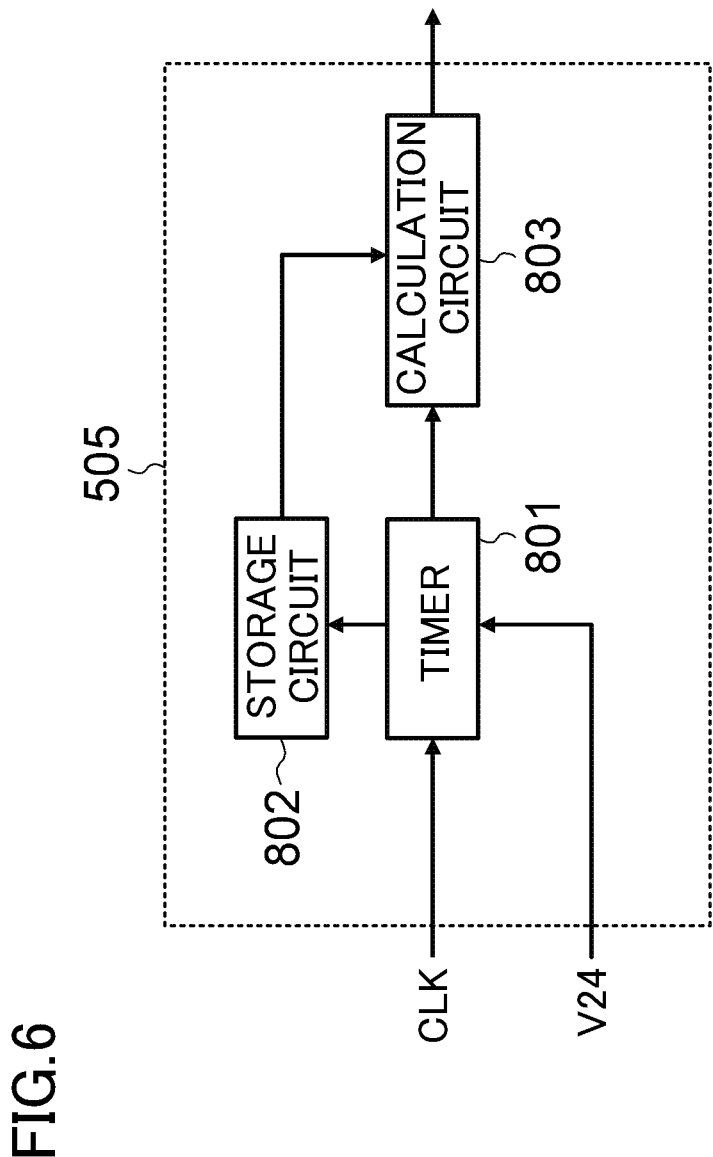
FIG. 6 is a block diagram showing an example internal configuration of a determination circuit of FIG. 4.

This comparison is performed as follows. In the determination circuit 505, the results of measurement of the time intervals Tosn, Tdisn, and Tchn are stored in a storage circuit, such as a register etc., and for example, the time intervals Tdisn and Tchn are subtracted from the time interval Tosn. For example, as shown in FIG. 6, the determination circuit 505 includes a timer 801 which measures, using a clock CLK, the time interval between when the input voltages to the integration circuit 100 are switched by the switch SW0 and when the value V24 measured by the counter 504 reaches the set value, a storage circuit 802 which stores the result of measurement by the timer 801, and a calculation circuit 803 which compares the measurement result. The determination circuit 505 may be a down counter in which the result of measurement of the time interval Tosn is set. Note that the process of the determination circuit 505 may be performed by a microcomputer or a dedicated calculation circuit which is provided outside the voltage polarity determination circuit 302.

Thus, according to this embodiment, even in a system in which a time interval is measured by measuring the number of clocks using a counter, the polarity of a charging/discharging current can be correctly determined over the entire range. Also, if the input voltage value Vin and the input offset voltage value Vosa are set to satisfy the condition that Vin<Vosa and have an appropriate difference, the state that Vin=Vosa can be avoided. Therefore, in this case, the output voltages V11 and V22 of the first and second comparison circuits 401 and 502 are invariably inverted, whereby the polarity of the charging/discharging current can be determined.

Third Embodiment

Figure 7:
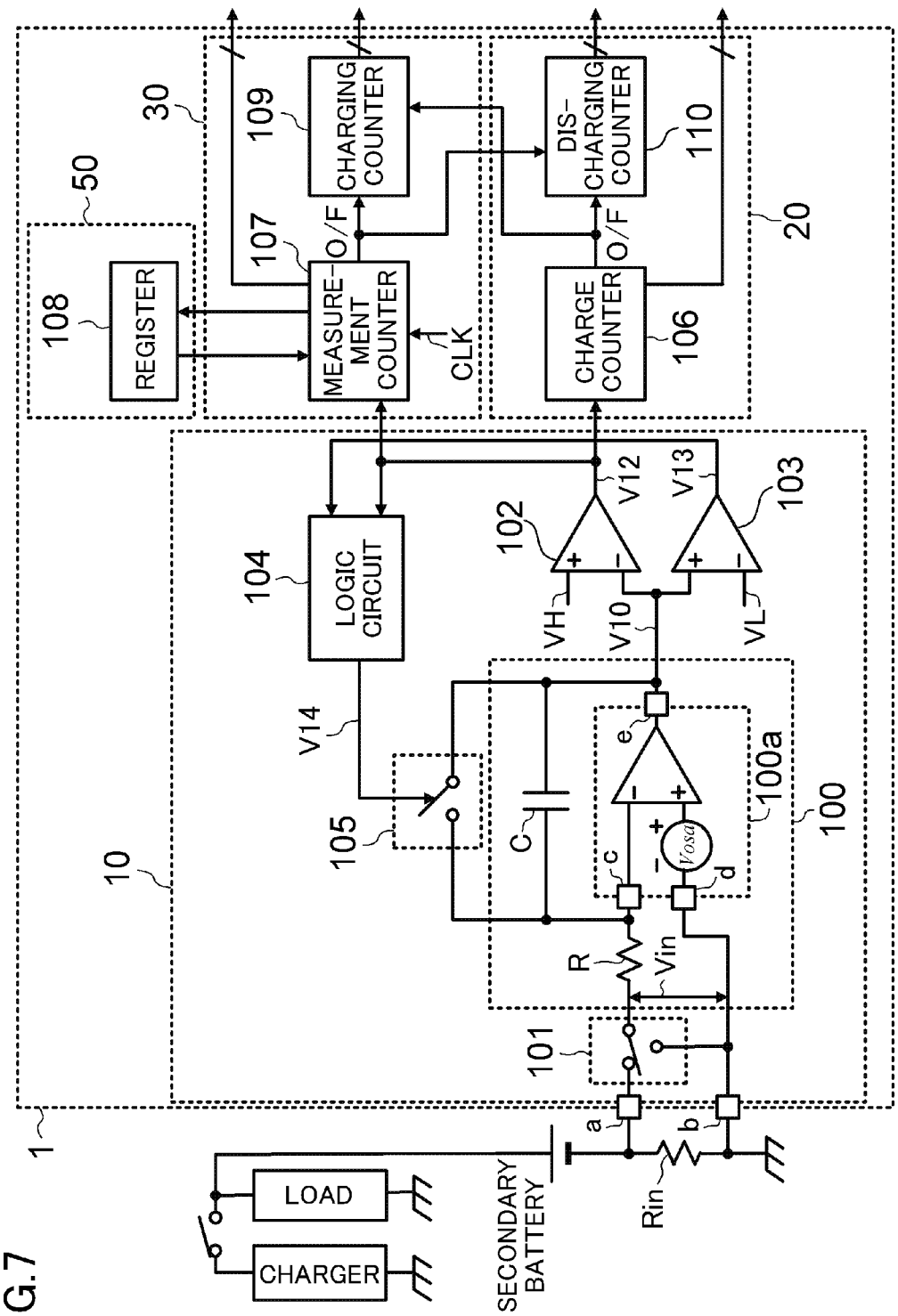
FIG. 7 is a block diagram showing a configuration of a charge amount measurement circuit according to a third embodiment of the present disclosure.

FIG. 7 is a diagram showing a configuration of a charge amount measurement circuit 1 according to a third embodiment of the present disclosure. The charge amount measurement circuit 1 includes a first switch 101, a voltage-to-charge conversion circuit 10 which converts an input voltage into pulses corresponding to a charge amount, a charging measurement circuit 30 which counts the output pulses of the voltage-to-charge conversion circuit 10 and subtracts a count value of a discharging measurement circuit 20 from the pulse count, the discharging measurement circuit 20 which counts the output pulses of the voltage-to-charge conversion circuit 10 and subtracts the count value of the charging measurement circuit 30 from the pulse count, and a storage circuit 50 which stores the count value of the charging measurement circuit 30 which is obtained when an input voltage Vin is 0 V, and sets the count value into the charging measurement circuit 30. The voltage-to-charge conversion circuit 10 includes an integration circuit 100 including an operational amplifier circuit 100a having an input offset voltage Vosa which is larger than the maximum value of the input voltage Vin and is smaller than the minimum value of the input voltage Vin.

The voltage-to-charge conversion circuit 10 includes the integration circuit 100 including the operational amplifier circuit 100a having the input offset voltage Vosa, the first switch 101 which switches the connection destination of the input voltage Vin of the integration circuit 100 between an input terminal a and a GND terminal b, a first comparison circuit 102 which compares an output voltage V10 of the integration circuit 100 with a first reference voltage VH, and outputs the result of the comparison, a second comparison circuit 103 which compares the output voltage V10 of the integration circuit 100 with a second reference voltage VL, and outputs the result of the comparison, a logic circuit 104 which outputs a voltage which is set or reset in response to the inversion of an output voltage V12 of the first comparison circuit 102 or the inversion of an output voltage V13 of the second comparison circuit 103, and a second switch 105 whose conductive and non-conductive states are controlled based on an output voltage V14 of the logic circuit 104.

The charging measurement circuit 30 includes a measurement counter 107 which, when the first switch 101 is switched to the GND terminal b (i.e., a trimming step), measures a time interval Tosa which it takes for a charge counter 106 to reach overflow (O/F) using a clock CLK, and when the first switch 101 is connected to the input terminal a (i.e., a measurement step), indicates the lapse of a measurement time using the clock CLK, and a charging counter 109 which increments by one when the measurement counter 107 overflows, and decrements by one when the charge counter 106 overflows.

The discharging measurement circuit 20 includes the charge counter 106 which counts the number of times of inversion of the output voltage of the first comparison circuit 102 or the second comparison circuit 103, and a discharging counter 110 which increments by one when the charge counter 106 overflows, and decrements by one when the measurement counter 107 overflows.

In the integration circuit 100, the capacitor C and the second switch 105 are connected together in parallel between the output terminal e and inverting input terminal c of the operational amplifier circuit 100a. A resistor R is connected between the inverting input terminal c of the operational amplifier circuit 100a and the input terminal a. The GND terminal b is connected to the non-inverting input terminal d of the operational amplifier circuit 100a. The operational amplifier circuit 100a has the input offset voltage Vosa whose level is outside an input voltage range. Here, the term "outside an input voltage range" means a region which is larger than the maximum value of the input voltage Vin of the integration circuit 100 or smaller than the minimum value of the input voltage Vin of the integration circuit 100. The input offset voltage Vosa is desirably set to a level outside the input voltage range of the input voltage Vin, or alternatively, may be set to a region close to the maximum or minimum value in which the frequency of occurrence of the input voltage Vin is small.

Next, operation of the charge amount measurement circuit 1 of this embodiment of the present disclosure thus configured will be described. Here, to facilitate the understanding of the operation, an example will be described in which a current is constant, i.e., the input voltage Vin is constant, and the input offset voltage Vosa>0.

Before measuring a charge amount during charging/discharging, the trimming step is provided as an information collection period during which the influence of the input offset voltage Vosa set in the operational amplifier circuit 100a is corrected.

FIGS. 8A-8H show operation of the trimming step where the set input offset voltage Vosa>0 V. Initially, the first switch 101 is switched to the GND terminal b, so that the input voltage Vin=0 V (FIG. 8A). In this case, the output voltage V10 of the integration circuit 100 increases from the second reference voltage VL to the first reference voltage VH during the time interval Tosa, and therefore, the following is established (FIG. 8B):

$$V_H = -\frac{1}{CR}\int_0^{Tosa}(0 - V_{osa})dt + V_L \quad (46)$$

According to Expression 46, the time interval Tosa is represented by:

$$T_{osa} = CR \cdot \frac{V_H - V_L}{V_{osa}} \quad (47)$$

After the time interval Tosa, the output voltage V10 of the integration circuit 100 reaches the first reference voltage VH, so that the output voltage V12 of the first comparison circuit 102 is inverted as shown in FIG. 8C. The inverted output voltage V12 causes the logic circuit 104 to output a signal which causes the second switch 105 to transition to the conductive state (FIG. 8E). When the second switch 105 is transitioned to the conductive state, both ends of the capacitor C are short-circuited, so that the output voltage V10 of the integration circuit 100 decreases (FIG. 8B). When the output voltage V10 of the integration circuit 100 decreases to reach the second reference voltage VL, the output voltage V13 of the second comparison circuit 103 is inverted (FIG. 8D). The inverted output voltage V13 causes the logic circuit 104 to output a signal which causes the second switch 105 to transition to the non-conductive state (FIG. 8E). When the second switch 105 is transitioned to the non-conductive state, the output voltage V10 of the integration circuit 100 increases again (FIG. 8B). The measurement counter 107 measures a time interval Tosan (FIG. 8F) which it takes for the number of times of inversion of the output voltage V14 of the logic circuit 104 to reach N which is a value set in the charge counter 106 using a clock CLK (FIG. 8G) having a period Tclk (FIG. 8H). This time information Nosa is stored in a register 108, and the stored time information Nosa is set in the measurement counter 107. The time information Nosa indicates a charge amount corresponding to the set input offset voltage Vosa.

Note that when the second switch 105 is transitioned to the conductive state, so that the output voltage V10 of the integration circuit 100 is changed from the first reference voltage VH to the second reference voltage VL, there is a time interval Trst because the second switch 105 has a resistance (FIG. 27B), however, the value of the time interval Trst is generally small and therefore is here ignored. If the resistance of the second switch 105 in the conductive state is large, the time interval Trst may be measured and corrected.

After the above trimming step, control proceeds to the measurement step. The measurement step is performed in two states, a charge state and a discharge state. Firstly, operation during charging will be described with reference to FIGS. 9A-9G. Here, operation where 0 V<Vin<Vosa (FIG. 9A) will be described.

In the measurement step, the first switch 101 is switched to the input terminal a, so that the input terminal a and the GND terminal b are connected to both ends of a sensing resistor Rin. In this case, the output voltage V10 of the integration circuit 100 increases from the second reference voltage VL to the first reference voltage VH during a time interval Tm. Therefore, the following is established (FIG. 9B):

$$V_H = -\frac{1}{CR}\int_0^{T_m}(V_{in} - V_{osa})dt + V_L \quad (48)$$

Because it is assumed that the input voltage Vin is constant, the time interval Tm is represented by:

$$T_m = CR \cdot \frac{V_H - V_L}{-V_{in} + V_{osa}} \quad (49)$$

Also, here, because the input voltage Vin is 0 V<Vin<Vosa, the time interval Tm is longer than the time interval Tosa measured in the trimming step. That is:

$$T_m > T_{osa} \quad (50)$$

After the time interval Tm, the output voltage V10 of the integration circuit 100 reaches the first reference voltage VH, so that the output voltage V12 of the first comparison circuit 102 is inverted. The inverted output voltage V12 causes the logic circuit 104 to output a signal which causes the second switch 105 to transition to the conductive state (FIG. 9C). Also, in this case, the charge counter 106 increments by one (FIG. 9D). When the second switch 105 is transitioned to the conductive state, both ends of the capacitor C are short-circuited, so that the output voltage V10 of the integration circuit 100 decreases (FIG. 9B). When the output voltage V10 of the integration circuit 100 decreases to reach the second reference voltage VL, the output voltage V13 of the second comparison circuit 103 is inverted. The inverted output voltage V13 causes the logic circuit 104 to output a signal which causes the second switch 105 to transition to the non-conductive state (FIG. 9C). When the second switch 105 is transitioned to the non-conductive state, the output voltage V10 of the integration circuit 100 increases again. When the output voltage V10 of the integration circuit 100 reaches the first reference voltage VH (FIG. 9B), the charge counter 106 increments by one (FIG. 9D). When the input voltage Vin continues to be input, the above operation is repeated.

The measurement counter 107 counts the time information Nosa stored in the register 108 (FIG. 9F). The charging counter 109 increments by one every time the measurement counter 107 counts the time information Nosa, i.e., the time interval Tosan has elapsed, and decrements by one when the charge counter 106 overflows, i.e., exceeds a set value N (FIG. 9G). The incremented value contains a charge amount corresponding to the input voltage Vin occurring between both ends of the sensing resistor Rin, and a charge amount corresponding to the set input offset voltage Vosa. The decremented value is a charge amount corresponding to the input offset voltage Vosa measured and set in the trimming step, and is subtracted from the count value of the charging counter 109, whereby the charge amount corresponding to the input offset voltage Vosa is corrected.

Next, operation during discharging will be described with reference to FIGS. 10A-10G. Here, operation where the input voltage Vin is −Vosa<Vin<0 V (FIG. 10A) will be described.

Similar to charging, in the measurement step, the first switch 101 is switched to the input terminal a, so that the input terminal a and the GND terminal b are connected to both ends of the sensing resistor Rin. In this case, the output voltage V10 of the integration circuit 100 increases from the second reference voltage VL to the first reference voltage VH during a time interval Tm, and therefore, the following is established (FIG. 10B):

$$V_H = -\frac{1}{CR}\int_0^{T_m}(V_{in} - V_{osa})dt + V_L \quad (51)$$

Because it is assumed that the input voltage Vin is constant, the time interval Tm is represented by:

$$T_m = CR \cdot \frac{V_H - V_L}{-V_{in} + V_{osa}} \quad (52)$$

Also, here, the input voltage Vin<0 V, and therefore, the time interval Tm is shorter than the time interval Tosa measured in the trimming step. That is:

$$T_m < T_{osa} \quad (53)$$

After the time interval Tm, the output voltage V10 of the integration circuit 100 reaches the first reference voltage VH, so that the output voltage V12 of the first comparison circuit 102 is inverted. The inverted output voltage V12 causes the logic circuit 104 to output a signal which causes the second switch 105 to transition to the conductive state (FIG. 10C). Also, in this case, the charge counter 106 increments by one (FIG. 10D). When the second switch 105 is transitioned to the conductive state, both ends of the capacitor C are short-circuited, so that the output voltage V10 of the integration circuit 100 decreases (FIG. 10B). When the output voltage V10 of the integration circuit 100 decreases to reach the second reference voltage VL, the output voltage V13 of the second comparison circuit 103 is inverted. The inverted output voltage V13 causes the logic circuit 104 to output a signal which causes the second switch 105 to transition to the non-conductive state (FIG. 10C). When the second switch 105 is transitioned to the non-conductive state, the output voltage V10 of the integration circuit 100 increases again. When the output voltage V10 of the integration circuit 100 reaches the first reference voltage VH (FIG. 10B), the charge counter 106 increments by one (FIG. 10D). When the input voltage Vin continues to be applied, the above operation is repeated, similar to the charge state.

The measurement counter 107 counts the time information Nosa stored in the register 108 (FIG. 10F). The discharging counter 110 increments by one every time the count of the charge counter 106 reaches the set value N, and decrements by one when the measurement counter 107 overflows, i.e., exceeds the set value Nosa (FIG. 10E). The incremented value contains a charge amount corresponding to the input voltage Vin occurring between both ends of the sensing resistor Rin, and a charge amount corresponding to the set input offset voltage Vosa. The decrement value is a charge amount corresponding to the input offset voltage Vosa measured and set in the trimming step, and is subtracted from the count value of the discharging counter 110, whereby the charge amount corresponding to the set input offset voltage Vosa is corrected.

Next, a method of obtaining a charge amount from the charge amount measurement circuit 1 of this embodiment of the present disclosure which operates as described above will be described.

In the trimming step, a charge amount qosa per count of the charge counter 106 and a charge amount qclk per clock of the measurement counter 107 are detected.

Initially, the charge amount qosa per count of the charge counter 106 is obtained.

The time interval Tosa which it takes for the output voltage V10 of the integration circuit 100 to reach from the first reference voltage VH to the second reference voltage VL is represented by Expression 47 above. Here, it is assume that a virtual current Iosa flows through the sensing resistor Rin, so that the voltage Vosa occurs between both ends of the sensing resistor Rin. In this case, the following is established:

$$V_{osa} = R_{in} \cdot I_{osa} \tag{54}$$

Expression 47 is rewritten as:

$$T_{osa} = CR \cdot \frac{V_H - V_L}{R_{in} \cdot I_{osa}} \tag{55}$$

The product of the time interval Tosa and the current Iosa represents a charge amount, which is represented by qosa. In this case, the following is established:

$$q_{osa} = T_{osa} \cdot I_{osa} = CR \cdot \frac{V_H - V_L}{R_{in}} \tag{56}$$

The charge amount qosa may be considered to be a charge amount corresponding to the set input offset voltage Vosa. In Expression 56, the element constants (C, R, and Rin) can be measured using a measurement device, such as an impedance analyzer etc. For LSIs, the voltage levels (VH and VL) (terminal voltages) may be observed using an oscilloscope etc. in a test mode. Therefore, the charge amount qosa represented by Expression 56 can be easily obtained.

Next, the charge amount qclk per clock of the measurement counter 107 is obtained.

FIG. 11A shows a temporal relationship in the measurement counter 107 and the charge counter 106 in the trimming step. The charge amount qosa is a charge amount per count of the charge counter 106. Therefore, when the count of the charge counter 106 reaches the set value N, i.e., the charge counter 106 overflows, a charge amount Qosa is represented by:

$$Q_{osa} = N \cdot q_{osa} \tag{57}$$

The time interval Tosan which it takes for the count of the charge counter 106 to reach the set value N, i.e., it takes for the charge amount to reach Qosa, is measured by the measurement counter 107 using the clock CLK. The count value in this case is Nosa, which is stored in the register 108.

The charge amount qclk per clock of the measurement counter 107 is represented, using the count value Nosa, by:

$$q_{clk} = \frac{Q_{osa}}{N_{osa}} = \frac{N}{N_{osa}} \cdot q_{osa} \tag{58}$$

Because the count values N and Nosa and the charge amount qosa in Expression 58 are known, the charge amount qclk can be easily obtained.

In the charge state in the measurement step, a charge amount is obtained using the charge amounts qosa and qclk obtained in the trimming step.

FIG. 11B shows a temporal relationship in the measurement counter 107 and the charge counter 106 during charging. A time interval Tmc of the charge counter 106 is a time interval during which the charge counter 106 overflows after the count reaches N due to the influence of the input voltage Vin and the set input offset voltage Vosa. In this case, the charge amount has reached Qosa.

On the other hand, in the measurement counter 107, when the charge counter 106 reaches the time interval Tmc, the following time has elapsed:

$$T_{osan} + T_{ch} \tag{59}$$

The time interval Tosan of the measurement counter 107 is a time interval during which the charge counter 106 reaches overflow after the count reaches N due to only the influence of the set input offset voltage Vosa.

Therefore, the time interval Tch relating to only the input voltage Vin is a time interval obtained by subtracting the time interval Tosan from the time interval Tmc. That is:

$$T_{ch} = T_{mc} - T_{osan} \tag{60}$$

A charge amount Qch corresponding to the time interval Tch is obtained by:

$$Q_{ch} = \frac{T_{ch}}{T_{osan}} \cdot Q_{osa} = \frac{N_{ch} \cdot T_{clk}}{N_{osa} \cdot T_{clk}} \cdot N_{osa} \cdot q_{clk} = N_{ch} \cdot q_{clk} \tag{61}$$

Therefore, in the measurement counter 107 and the charging counter 109 of the charge amount measurement circuit 1 of FIG. 7, a count value Nch which is obtained by subtracting the count value Nosa corresponding to the charge amount Qosa remains. By multiplying the count value Nch by the charge amount qclk obtained in the trimming step, the charge amount Qch during charging is obtained as shown in Expression 61.

Similarly, in the discharge state in the measurement step, a charge amount is obtained using the charge amounts qosa and qclk obtained in the trimming step.

FIG. 11C shows a temporal relationship in the measurement counter 107 and the charge counter 106 during discharging. When the measurement counter 107 reaches the time interval Tosan, i.e., the measurement counter 107 overflows after the count reaches Nosa, the following time has elapsed in the charge counter 106:

$$T_{md} + T_{dis} \tag{62}$$

A time interval Tmd of the charge counter 106 is a time interval during which the charge counter 106 overflows after the count reaches N due to the influence of the input voltage Vin and the set input offset voltage Vosa. In this case, the charge amount has reached Qosa.

The time interval Tosan of the measurement counter 107 is a time interval during which the charge counter 106 reaches overflow after the count reaches N due to only the influence of the set input offset voltage Vosa.

Therefore, a time interval Tdis relating to only the input voltage Vin is a time interval which is obtained by subtracting the time interval Tmd from the time interval Tosan of the measurement counter 107:

$$T_{dis} = T_{osan} - T_{md} \tag{63}$$

A charge amount Qdis corresponding to the time interval Tdis is obtained by:

$$Q_{dis} = \frac{T_{dis}}{T_{md}} \cdot Q_{osa} = \frac{N_{dis} \cdot T_m}{N \cdot T_m} \cdot N \cdot q_{osa} = N_{dis} \cdot q_{osa} \tag{64}$$

Therefore, in the charge counter 106 and the discharging counter 110 of the charge amount measurement circuit 1 of FIG. 7, a count value Ndis obtained by subtracting the count value Nosa corresponding to the charge amount Qosa remains. By multiplying the count value Ndis by the charge amount qosa obtained in the trimming step, the charge amount Qdis during discharging is obtained as shown in Expression 64.

A current is obtained by dividing the amount of a change in a charge amount by an elapsed time. Therefore, charging and discharging currents can be easily obtained using charge amounts obtained during charging and discharging.

For example, a charging current Ich is obtained by:

$$I_{ch} = \frac{Q_{ch}}{T_{osan} + T_{ch}} = \frac{N_{ch} \cdot q_{clk}}{(N_{osa} + N_{ch}) \cdot T_{clk}} \tag{65}$$

A discharge current Idis is obtained by:

$$I_{dis} = \frac{Q_{dis}}{T_{osan}} = \frac{N_{dis} \cdot q_{osa}}{N_{osa} \cdot T_{clk}} \tag{66}$$

Fourth Embodiment

Figure 12:
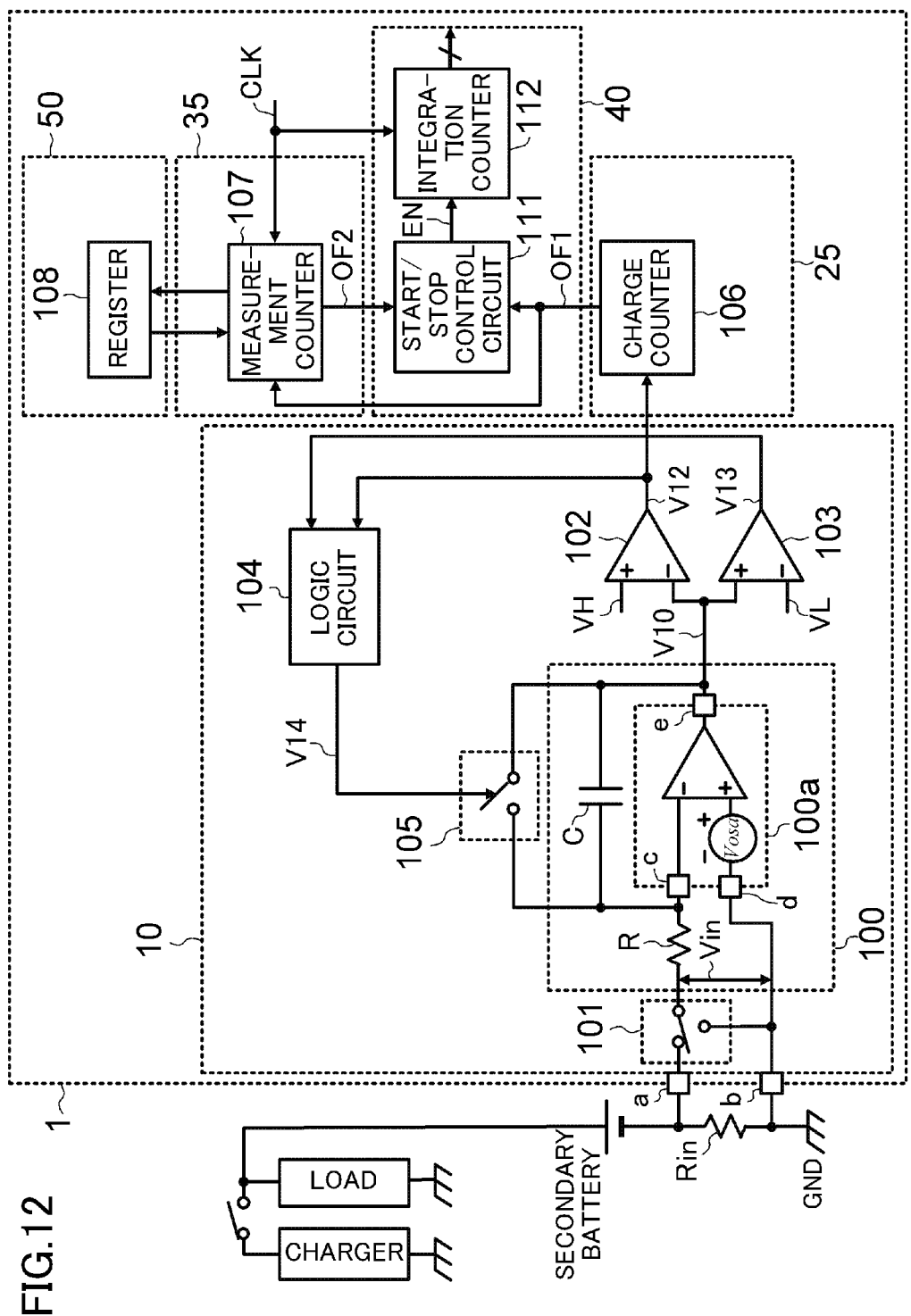
FIG. 12 is a block diagram showing a configuration of a charge amount measurement circuit according to a fourth embodiment of the present disclosure.

FIG. 12 is a diagram showing a configuration of a charge amount measurement circuit 1 according to a fourth embodiment of the present disclosure. The charge amount measurement circuit 1 includes a first switch 101, a voltage-to-charge conversion circuit 10 which converts an input voltage Vin into pulses corresponding to a charge amount, a charge measurement circuit 25 which counts the output pulses of the voltage-to-charge conversion circuit 10, a time measurement circuit 35 which measures a time interval which it takes for the charge measurement circuit 25 to overflow when the input voltage Vin is 0 V, using a clock CLK, and indicates the lapse of a measurement time during measurement of a charge amount, a charge integration circuit 40 which counts the number of clocks CLK corresponding to the difference in overflow time between the charge measurement circuit 25 and the time measurement circuit 35, a storage circuit 50 which stores the count value of the time measurement circuit 35 which is obtained when the input voltage Vin is 0 V, and sets the count value into the time measurement circuit 35. The voltage-to-charge conversion circuit 10 includes the integration circuit 100 including an operational amplifier circuit 100a having an input offset voltage Vosa which is larger than the maximum value of the input voltage Vin or smaller than the minimum value of the input voltage Vin.

The voltage-to-charge conversion circuit 10 includes the integration circuit 100 including the operational amplifier circuit 100a having the input offset voltage Vosa, the first switch 101 which switches the connection destination of the input voltage Vin of the integration circuit 100 between an input terminal a and a GND terminal b, a first comparison circuit 102 which compares an output voltage V10 of the integration circuit 100 with a first reference voltage VH, and outputs the result of the comparison, a second comparison circuit 103 which compares the output voltage V10 of the integration circuit 100 with a second reference voltage VL, and outputs the result of the comparison, a logic circuit 104 which outputs a voltage which is set or reset in response to the inversion of an output voltage V12 of the first comparison circuit 102 or an output voltage V13 of the second comparison circuit 103, and a second switch 105 whose conductive and non-conductive states are controlled based on an output voltage V14 of the logic circuit 104.

The charge measurement circuit 25 includes a charge counter 106 which counts the number of times of inversion of the output voltage of the first comparison circuit 102 or the second comparison circuit 103.

The charge measurement circuit 35 includes a measurement counter 107 which, when the first switch 101 is switched to the GND terminal b (i.e., a trimming step), measures a time interval Tosa which it takes for the charge counter 106 to reach overflow using the clock CLK, and when the first switch 101 is connected to the input terminal a (i.e., a measurement step), indicates the lapse of a measurement time using the clock CLK.

The charge integration circuit 40 includes a start/stop control circuit 111 which generates an enable signal EN indicating a time interval between when one of an overflow signal (first overflow signal) OF1 of the charge counter 106 and an overflow signal (second overflow signal) OF2 of the measurement counter 107 is input earlier and when the other is input later, and an integration counter 112 which is controlled based on the enable signal EN of the start/stop control circuit 111 to count or stop counting.

The storage circuit 50 includes a register 108 which stores a value which is measured by the measurement counter 107 when the input voltage Vin is 0 V, and sets the measured value into the measurement counter 107.

In the integration circuit 100, a capacitor C and the second switch 105 are connected together in parallel between an output terminal e and the inverting input terminal c of the operational amplifier circuit 100a, a resistor R is connected between the inverting input terminal c of the operational amplifier circuit 100a and the input terminal a, and the GND terminal b is connected to a non-inverting input terminal d of the operational amplifier circuit 100a. The operational amplifier circuit 100a has the input offset voltage Vosa whose level is outside an input voltage range. Here, the term "outside an input voltage range" means a region which is larger than the maximum value of the input voltage Vin of the integration circuit 100 or smaller than the minimum value of the input voltage Vin of the integration circuit 100. The input offset voltage Vosa is desirably set to a level outside the input voltage range of the input voltage Vin, or alternatively, may be set to a region close to the maximum or minimum value in which the frequency of occurrence of the input voltage Vin is small.

Next, operation of the charge amount measurement circuit 1 of this embodiment of the present disclosure thus configured will be described. Here, to facilitate the understanding of the operation, an example will be described in which a current is constant, i.e., the input voltage Vin is constant, and the input offset voltage Vosa>0.

Before measuring a charge amount during charging/discharging, the trimming step is provided as an information collection period during which the influence of the input offset voltage Vosa set in the operational amplifier circuit 100a is corrected.

FIGS. 13A-13H show operation of the trimming step where the set input offset voltage Vosa>0 V. Initially, the first switch 101 is switched to the GND terminal b, so that the input voltage Vin=0 V (FIG. 13A). In this case, the output voltage V10 of the integration circuit 100 increases from the second reference voltage VL to the first reference voltage VH during the time interval Tosa, and therefore, the following is established (FIG. 13B):

$$V_H = -\frac{1}{CR}\int_0^{T_{osa}} (0 - V_{osa})dt + V_L \quad (67)$$

According to Expression 67, the time interval Tosa is represented by:

$$T_{osa} = CR \cdot \frac{V_H - V_L}{V_{osa}} \quad (68)$$

After the time interval Tosa, the output voltage V10 of the integration circuit 100 reaches the first reference voltage VH, so that the output voltage V12 of the first comparison circuit 102 is inverted as shown in FIG. 13C. The inverted output voltage V12 causes the logic circuit 104 to output a signal which causes the second switch 105 to transition to the conductive state (FIG. 13E). When the second switch 105 is transitioned to the conductive state, both ends of the capacitor C are short-circuited, so that the output voltage V10 of the integration circuit 100 decreases (FIG. 13B). When the output voltage V10 of the integration circuit 100 decreases to reach the second reference voltage VL, the output voltage V13 of the second comparison circuit 103 is inverted (FIG. 13D). The inverted output voltage V13 causes the logic circuit 104 to output a signal which causes the second switch 105 to transition to the non-conductive state (FIG. 13E). When the second switch 105 is transitioned to the non-conductive state, the output voltage V10 of the integration circuit 100 increases again (FIG. 13B). The measurement counter 107 measures a time interval Tosan (FIG. 13F) which it takes for the number of times of inversion of the output voltage V14 of the logic circuit 104 to reach N which is a value set in the charge counter 106, using a clock CLK (FIG. 13G) having a period Tclk (FIG. 13H). This time information Nosa is stored in a register 108, and the stored time information Nosa is set in the measurement counter 107. The time information Nosa indicates a charge amount corresponding to the set input offset voltage Vosa.

Note that when the second switch 105 is transitioned to the conductive state, so that the output voltage V10 of the integration circuit 100 is changed from the first reference voltage VH to the second reference voltage VL, there is a time interval Trst because the second switch 105 has a resistance (FIG. 27B), however, the value of the time interval Trst is generally small and therefore is here ignored. If the resistance of the second switch 105 in the conductive state is large, the time interval Trst may be measured and corrected.

After the above trimming step, control proceeds to the measurement step. The measurement step is performed in two states, a charge state and a discharge state. Firstly, operation during charging will be described with reference to FIGS. 14A-14J. Here, operation where 0 V<Vin<Vosa (FIG. 14A) will be described.

In the measurement step, the first switch 101 is switched to the input terminal a, so that the input terminal a and the GND terminal b are connected to both ends of a sensing resistor Rin. In this case, the output voltage V10 of the integration circuit 100 increases the second reference voltage VL to the first reference voltage VH during a time interval Tm. Therefore, the following is established (FIG. 14B):

$$V_H = -\frac{1}{CR}\int_0^{T_m} (V_{in} - V_{osa})dt + V_L \quad (69)$$

Because it is assumed that the input voltage Vin is constant, the time interval Tm is represented by:

$$T_m = CR \cdot \frac{V_H - V_L}{-V_{in} + V_{osa}} \quad (70)$$

Also, here, because the input voltage Vin is 0 V<Vin<Vosa, the time interval Tm is longer than the time interval Tosa measured in the trimming step. That is:

$$T_m > T_{osa} \quad (71)$$

After the time interval Tm, the output voltage V10 of the integration circuit 100 reaches the first reference voltage VH, so that the output voltage V12 of the first comparison circuit 102 is inverted. The inverted output voltage V12 causes the logic circuit 104 to output a signal which causes the second switch 105 to transition to the conductive state (FIG. 14C). Also, in this case, the charge counter 106 increments by one (FIG. 14D). When the second switch 105 is transitioned to the conductive state, both ends of the capacitor C are short-circuited, so that the output voltage V10 of the integration circuit 100 decreases (FIG. 14B). When the output voltage V10 of the integration circuit 100 decreases to reach the second reference voltage VL, the output voltage V13 of the second comparison circuit 103 is inverted. The inverted output voltage V13 causes the logic circuit 104 to output a signal which causes the second switch 105 to transition to the non-conductive state (FIG. 14C). When the second switch 105 is transitioned to the non-conductive state, the output voltage V10 of the integration circuit 100 increases again. When the output voltage V10 of the integration circuit 100 reaches the first reference voltage VH (FIG. 14B), the charge counter 106 increments by one (FIG. 14D). When the input voltage Vin continues to be input, the above operation is repeated.

The charge counter 106 outputs the first overflow signal OF1 (FIG. 14E) every time the count reaches a set value N (FIG. 14D). On the other hand, the measurement counter 107 outputs the second overflow signal OF2 (FIG. 14G) every time the count reaches the time information Nosa stored in the register 108, i.e., the time interval Tosan has elapsed (FIG. 14F). The start/stop control circuit 111 outputs the enable signal EN (FIG. 14H) which starts in response to the second overflow signal OF2 of the measurement counter 107 (FIG. 14G) and stops in response to the first overflow signal OF1 of the charge counter 106 (FIG. 14E). The integration counter 112 counts the number of clocks CLK (FIG. 14I) during a period of time that the start/stop control circuit 111 outputs the enable signal EN (FIG. 14J). The length of a period of time that the integration counter 112 stops indicates a charge amount corresponding to the set input offset voltage Vosa, and the length of a period of time from the start to the end of the integration counter 112 indicates a charge amount corresponding to the input voltage Vin occurring between both ends of the sensing resistor Rin. Therefore, the integration counter 112 calculates the cumulative sum of only charge amounts to be measured which correspond to the input voltage Vin.

Next, operation during discharging will be described with reference to FIGS. 15A-15J. Here, operation where the input voltage Vin is −Vosa<Vin<0 V (FIG. 15A) will be described.

Similar to charging, in the measurement step, the first switch 101 is switched to the input terminal a, so that the input terminal a and the GND terminal b are connected to both ends of the sensing resistor Rin. In this case, the output voltage V10 of the integration circuit 100 increases from the second reference voltage VL to the first reference voltage VH during a time interval Tm, and therefore, the following is established (FIG. 15B):

$$V_H = -\frac{1}{CR}\int_0^{T_m}(V_{in} - V_{osa})dt + V_L \tag{72}$$

Because it is assumed that the input voltage Vin is constant, the time interval Tm is represented by:

$$T_m = CR \cdot \frac{V_H - V_L}{-V_{in} + V_{osa}} \tag{73}$$

Also, here, the input voltage Vin<0 V, and therefore, the time interval Tm is shorter than the time interval Tosa measured in the trimming step. That is:

$$T_m < T_{osa} \tag{74}$$

After the time interval Tm, the output voltage V10 of the integration circuit 100 reaches the first reference voltage VH, so that the output voltage V12 of the first comparison circuit 102 is inverted. The inverted output voltage V12 causes the logic circuit 104 to output a signal which causes the second switch 105 to transition to the conductive state (FIG. 15C). Also, in this case, the charge counter 106 increments by one (FIG. 15D). When the second switch 105 is transitioned to the conductive state, both ends of the capacitor C are short-circuited, so that the output voltage V10 of the integration circuit 100 decreases (FIG. 15B). When the output voltage V10 of the integration circuit 100 decreases to reach the second reference voltage VL, the output voltage V13 of the second comparison circuit 103 is inverted. The inverted output voltage V13 causes the logic circuit 104 to output a signal which causes the second switch 105 to transition to the non-conductive state (FIG. 15C). When the second switch 105 is transitioned to the non-conductive state, the output voltage V10 of the integration circuit 100 increases again. When the output voltage V10 of the integration circuit 100 reaches the first reference voltage VH (FIG. 15B), the charge counter 106 increments by one (FIG. 15D). When the input voltage Vin continues to be applied, the above operation is repeated, similar to the charge state.

The charge counter 106 outputs the first overflow signal OF1 (FIG. 15E) every time the count reaches the set value N (FIG. 15D). On the other hand, the measurement counter 107 outputs the second overflow signal OF2 (FIG. 15G) every time the count reaches the time information Nosa stored in the register 108, i.e., the time interval Tosan has elapsed (FIG. 15F). The start/stop control circuit 111 outputs the enable signal EN (FIG. 15H) which starts in response to the first overflow signal OF1 of the charge counter 106 (FIG. 15E) and stops in response to the second overflow signal OF2 of the measurement counter 107 (FIG. 15G). The integration counter 112 counts the number of clocks CLK (FIG. 15I) during a period of time that the start/stop control circuit 111 outputs the enable signal EN (FIG. 15J). The length of a period of time that the integration counter 112 stops indicates a charge amount corresponding to the set input offset voltage Vosa, and the length of a period of time from the start to the end of the integration counter 112 indicates a charge amount corresponding to the input voltage Vin occurring between both ends of the sensing resistor Rin. Therefore, the integration counter 112 calculates the cumulative sum of only charge amounts to be measured which correspond to the input voltage Vin.

The operation during charging may be the same as the operation during discharging, except that the starting and stopping of the charge counter 106 and the measurement counter 107 in response to the overflow signals OF1 and OF2 are reversed.

Next, a method of obtaining a charge amount from the charge amount measurement circuit 1 of this embodiment of the present disclosure which operates as described above will be described.

In the trimming step, a charge amount qosa per count of the charge counter 106 and a charge amount qclk per clock of the measurement counter 107 are detected.

Initially, the charge amount qosa per count of the charge counter 106 is obtained.

The time interval Tosa which it takes for the output voltage V10 of the integration circuit 100 to reach from the first reference voltage VH to the second reference voltage VL is represented by Expression 68 above. Here, it is assume that a virtual current Iosa flows through the sensing resistor Rin, so that a voltage Vosa occurs between both ends of the sensing resistor Rin. In this case, the following is established:

$$V_{osa} = R_{in} \cdot I_{osa} \tag{75}$$

Expression 68 is rewritten as:

$$T_{osa} = CR \cdot \frac{V_H - V_L}{R_{in} \cdot I_{osa}} \tag{76}$$

The product of the time interval Tosa and the current Iosa represents a charge amount, which is represented by qosa. In this case, the following is established:

$$q_{osa} = T_{osa} \cdot I_{osa} = CR \cdot \frac{V_H - V_L}{R_{in}} \tag{77}$$

The charge amount qosa may be considered to be a charge amount corresponding to the set input offset voltage Vosa. In Expression 77, the element constants (C, R, and Rin) can be measured using a measurement device, such as an impedance analyzer etc. For LSIs, the voltage levels (VH and VL) (terminal voltages) may be observed using an oscilloscope etc. in a test mode. Therefore, the charge amount qosa represented by Expression 77 can be easily obtained.

Next, the charge amount qclk per clock of the measurement counter 107 is obtained.

FIG. 16A shows a temporal relationship in the measurement counter 107 and the charge counter 106 in the trimming step. The charge amount qosa is a charge amount per count of the charge counter 106. Therefore, when the count of the charge counter 106 reaches the set value N, i.e., the charge counter 106 overflows, a charge amount Qosa is represented by:

$$Q_{osa} = N \cdot q_{osa} \qquad (78)$$

The time interval Tosan which it takes for the count of the charge counter 106 to reach the set value N, i.e., it takes for the charge amount to reach Qosa, is measured by the measurement counter 107 using the clock CLK. The count value in this case is Nosa, which is stored in the register 108.

The charge amount qclk per clock of the measurement counter 107 is represented, using the count value Nosa, by:

$$q_{clk} = \frac{Q_{osa}}{N_{osa}} = \frac{N}{N_{osa}} \cdot q_{osa} \qquad (79)$$

Because the count values N and Nosa and the charge amount qosa in Expression 79 are known, the charge amount qclk can be easily obtained.

In the charge state in the measurement step, a charge amount is obtained using the charge amount qclk obtained in the trimming step.

FIG. 16B shows a temporal relationship in the measurement counter 107, the charge counter 106, and the integration counter 112 during charging. A time interval Tmc of the charge counter 106 is a time interval during which the charge counter 106 overflows after the count reaches N due to the influence of the input voltage Vin and the set input offset voltage Vosa. In this case, the charge amount has reached Qosa. The time interval Tosan of the measurement counter 107 is a time interval during which the charge counter 106 overflows after the count reaches N due to only the influence of the input offset voltage Vosa set in the trimming step. The integration counter 112 starts counting after the measurement counter 107 outputs the second overflow signal OF2, and stops counting when the charge counter 106 outputs the first overflow signal OF1. A time Tch counted by the integration counter 112 is a time difference between the time interval Tmc and the time interval Tosan which corresponds to a time interval affected by only the input voltage Vin. During the time difference Tch, the integration counter 112 counts the number of clocks CLK (Nch). Therefore, the time difference Tch is represented by:

$$T_{ch} = N_{ch} \cdot T_{clk} \qquad (80)$$

A charge amount Qch corresponding to the time difference Tch is obtained by:

$$Q_{ch} = \frac{T_{ch}}{T_{osan}} \cdot Q_{osa} = \frac{N_{ch} \cdot T_{clk}}{N_{osa} \cdot T_{clk}} \cdot N_{osa} \cdot q_{clk} = N_{ch} \cdot q_{clk} \qquad (81)$$

Therefore, the integration counter 112 of the charge amount measurement circuit 1 of FIG. 12 counts the number of clocks CLK corresponding to the difference Tch in overflow time between the charge counter 106 and the measurement counter 107. By multiplying the count value Nch by the charge amount qclk obtained in the trimming step, the charge amount Qch during charging is obtained as shown in Expression 81.

Similarly, in the discharge state in the measurement step, a charge amount is obtained using the charge amount qclk obtained in the trimming step.

FIG. 16C shows a temporal relationship in the measurement counter 107, the charge counter 106, and the integration counter 112 during discharging.

A time interval Tmd of the charge counter 106 is a time interval during which the charge counter 106 overflows after the count reaches N due to the influence of the input voltage Vin and the set input offset voltage Vosa. In this case, the charge amount has reached Qosa. A time interval Tosan of the measurement counter 107 is a time interval during which the measurement counter 107 reaches overflow after the count reaches Nosa due to only the influence of the set input offset voltage Vosa. The integration counter 112 starts counting after the charge counter 106 outputs the first overflow signal OF1, and stops counting when the measurement counter 107 outputs the second overflow signal OF2. A time Tdis counted by the integration counter 112 is a time difference between the time interval Tosan and the time interval Tmd which corresponds to a time interval affected by only the input voltage Vin. During the time difference Tdis, the integration counter 112 counts the number of clocks CLK (Nch). Therefore, the time difference Tdis is represented by:

$$T_{dis} = N_{dis} \cdot T_{clk} \qquad (82)$$

A charge amount Qdis corresponding to the time difference Tdis is obtained by:

$$Q_{dis} = \frac{T_{dis}}{T_{osan}} \cdot Q_{osa} = \frac{N_{dis} \cdot T_{clk}}{N_{osa} \cdot T_{clk}} \cdot N_{osa} \cdot q_{clk} = N_{dis} \cdot q_{clk} \qquad (83)$$

Therefore, the integration counter 112 of the charge amount measurement circuit 1 of FIG. 12 counts the number of clocks CLK corresponding to the difference Tdis in overflow time between the charge counter 106 and the measurement counter 107. By multiplying the count value Ndis by the charge amount qclk obtained in the trimming step, the charge amount Qdis during discharging is obtained as shown in Expression 83.

A current is obtained by dividing the amount of a change in a charge amount by an elapsed time. Therefore, charging and discharging currents can be easily obtained using charge amounts obtained during charging and discharging.

For example, a charging current Ich is obtained by:

$$I_{ch} = \frac{Q_{ch}}{T_{osan} + T_{ch}} = \frac{N_{ch} \cdot q_{clk}}{(N_{osa} + N_{ch}) \cdot T_{clk}} \qquad (84)$$

A discharge current Idis is obtained by:

$$I_{dis} = \frac{Q_{dis}}{T_{osan}} = \frac{N_{dis} \cdot q_{clk}}{N_{osa} \cdot T_{clk}} \qquad (85)$$

FIGS. 17A and 17B show a distribution of the input offset voltage Vosa of the operational amplifier circuit 100a of the integration circuit 100 included in the charge amount measurement circuit 1 of the third and fourth embodiments, and a range of the input voltage Vin.

In the embodiments of the present disclosure, as in the conventional art, there are variations in the input offset voltage Vosa of the operational amplifier circuit 100a during mass production of the product. In the embodiments of the present disclosure, the input offset voltage Vosa is set outside the input voltage range while there are variations in the input offset voltage (FIG. 17A).

When $-Vmin \leq Vin<0$ V, Tm<Tosa, and therefore, as in the conventional charge amount measurement circuit 2, the influence of the input offset voltage Vosa is corrected, whereby a correct charge amount can be measured.

On the other hand, when $0$ V$<Vin \leq +Vmax$, Tm>Tosa. Even in this case, the charge amount measurement circuit 1 of the present disclosure has a function of correcting the influence of the input offset voltage Vosa as described above regarding the operation during charging, whereby a correct charge amount can be measured.

As described above, according to the third and fourth embodiments, by setting the input offset voltage Vosa in the operational amplifier circuit 100a used in the integration circuit 100, a charge amount flowing through the sensing resistor Rin can be measured over the entire measurement range of the input voltage Vin. Also, if the input voltage value Vin and the input offset voltage value Vosa are set to satisfy the condition that Vin<Vosa and have an appropriate difference, the state that Vin=Vosa can be avoided. Therefore, in this case, the output voltage V12 of the first comparison circuit 102 is invariably inverted, whereby a charge amount flowing through the sensing resistor Rin can be measured.

Figure 18:
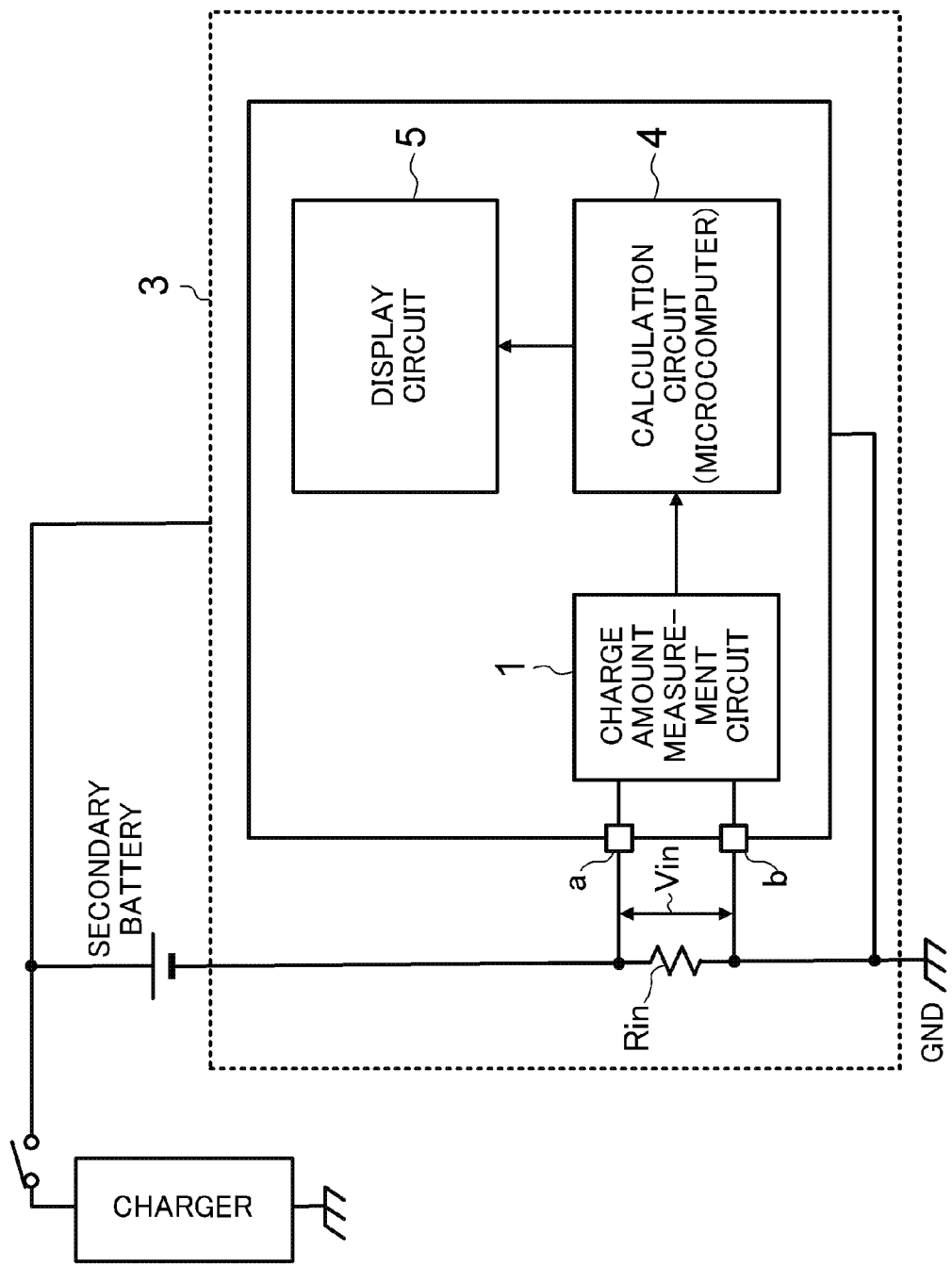
FIG. 18 is a diagram showing an application of the embodiments of the present disclosure.

FIG. 18 shows a mobile electronic device 3 which is an example application of the third and fourth embodiments. The mobile electronic device 3 includes a sensing resistor Rin which converts a current flowing during charging/discharging of a secondary battery into an input voltage Vin, a charge amount measurement circuit 1 which measures a charge amount or current flowing through the sensing resistor Rin from the input voltage Vin, a calculation circuit (microcomputer) 4 which calculates the remaining capacity of the secondary battery from the charge amount measured by the charge amount measurement circuit 1, and a display circuit 5 which displays the result of calculation by the microcomputer 4.

As in the third and fourth embodiments, the charge amount measurement circuit 1 includes an integration circuit 100 including an operational amplifier circuit 100a having an input offset voltage Vosa which is larger than the maximum value of the input voltage Vin or smaller than the minimum value of the input voltage Vin. Therefore, the mobile electronic device 3 can measure a charge amount or a current amount over the entire measurement range of the input voltage Vin without suffering a dead zone.

FIGS. 19-23 show examples of the operational amplifier circuits 100a of the first to fourth embodiments which provide the input offset voltage Vosa.

Figure 19:
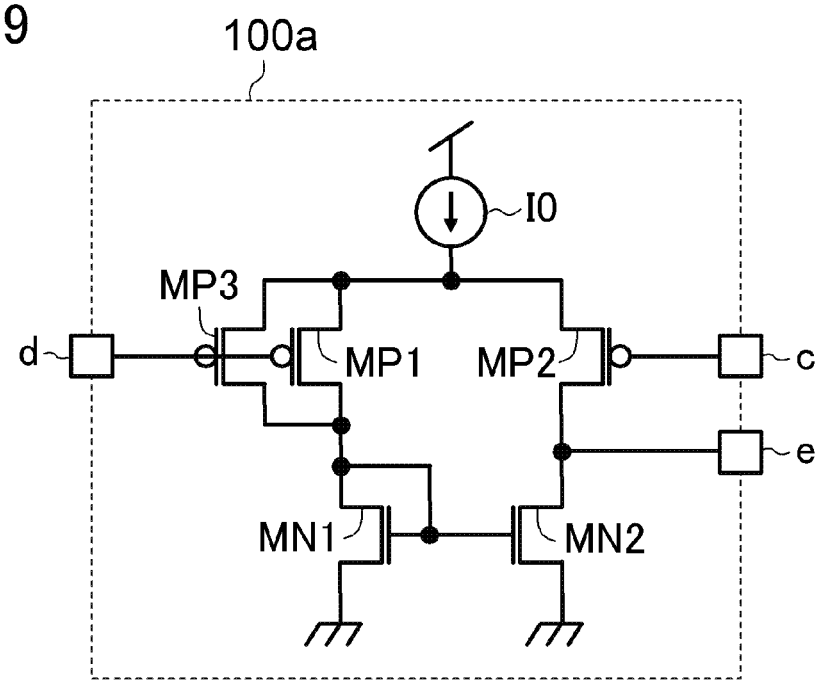
FIG. 19 is a circuit diagram of an operational amplifier circuit according to an embodiment of the present disclosure in which a pair of transistors are provided at a differential input stage, which have different sizes, thereby providing an input offset voltage.
Figure 20:
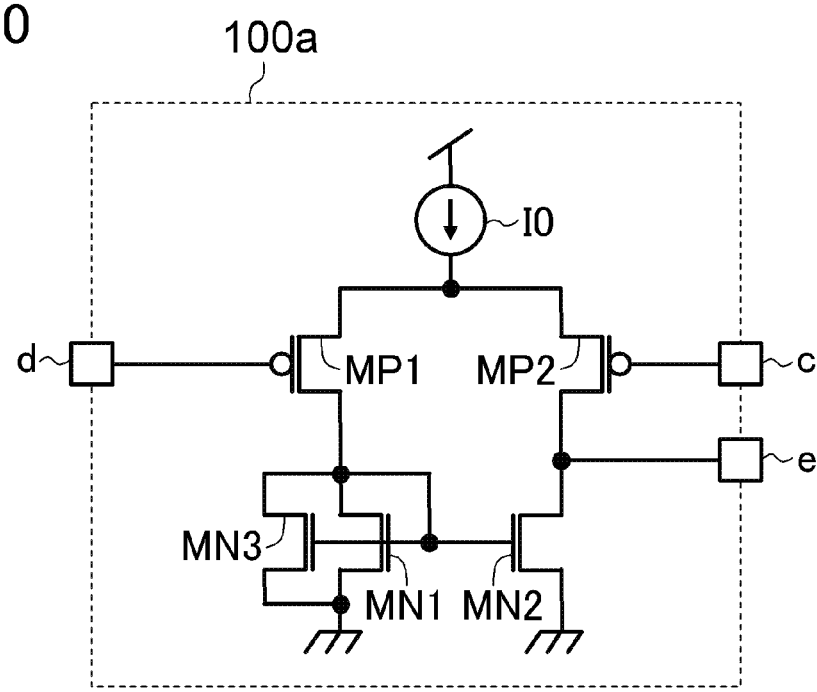
FIG. 20 is a circuit diagram of an operational amplifier circuit according to an embodiment of the present disclosure in which a current source which provides different amounts of current is provided, thereby providing an input offset voltage.

FIG. 19 shows an example in which a pair of transistors at a differential input stage which are frequently used in an operational amplifier circuit have different sizes so that the input offset voltage Vosa is set. Here, one of the pair of transistors at the differential input stage includes a plurality of transistors connected together in parallel, whereby the pair of transistors have different sizes. The operational amplifier circuit 100a of FIG. 19 includes a current source I0, P-channel MOS transistors MP1-MP3, and N-channel MOS transistors MN1 and MN2. FIG. 20 shows an example in which a current source frequently used in an operational amplifier circuit provides different current amounts so that the input offset voltage Vosa is set. Here, one of a pair of transistors constituting a current mirror as a current source includes a plurality of transistors connected together in parallel, whereby the pair of transistors have different sizes, and therefore, different current amounts are provided. The operational amplifier circuit 100a of FIG. 20 includes a current source I0, P-channel MOS transistors MP1 and MP2, and N-channel MOS transistors MN1-MN3.

Figure 21:
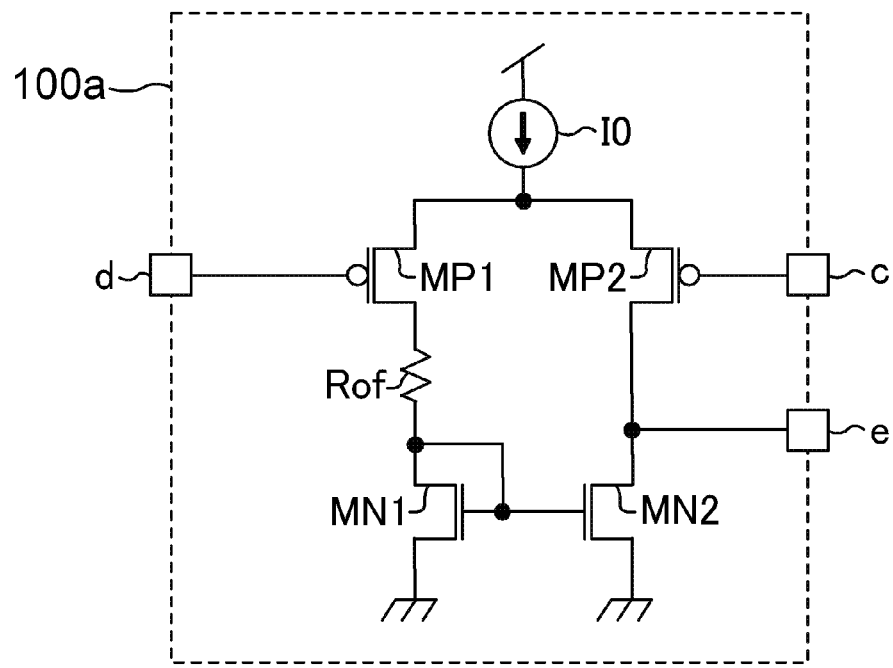
FIG. 21 is a circuit diagram of an operational amplifier circuit according to an embodiment of the present disclosure in which a pair of transistors are provided at a differential input stage, and offset resistors having different resistance values are connected to the pair of transistors, thereby providing an input offset voltage.
Figure 22:
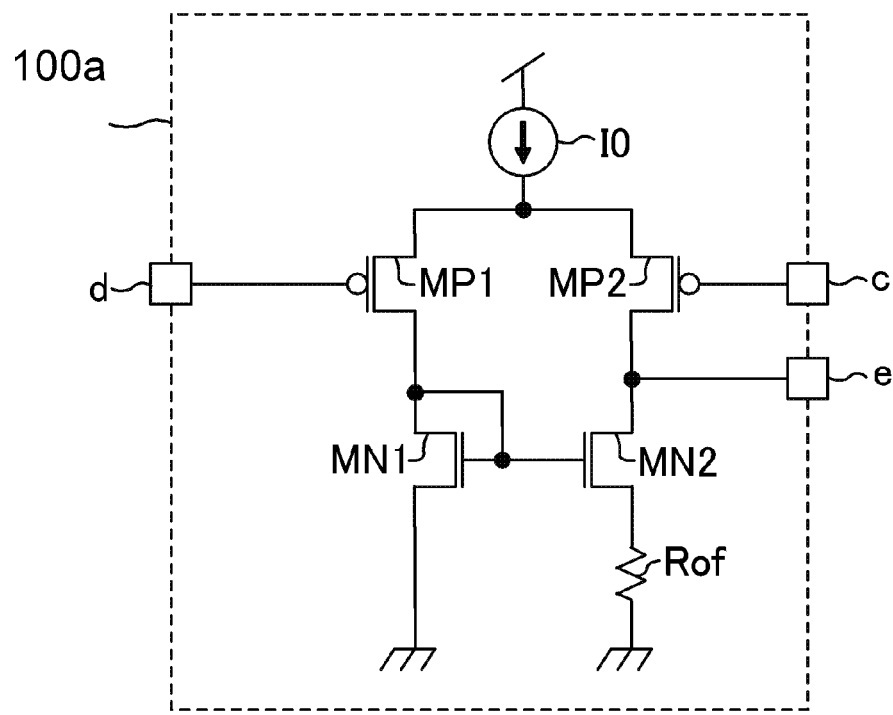
FIG. 22 is a circuit diagram of an operational amplifier circuit according to an embodiment of the present disclosure in which offset resistors having different resistance values are connected to a current source, thereby providing an input offset voltage.

FIG. 21 shows an example in which offset resistors connected to a pair of transistors at a differential input stage which are frequently used in an operational amplifier circuit have different resistance values so that the input offset voltage Vosa is set. Here, an offset resistor Rof is connected to only one of the pair of transistors at the differential input stage, whereby the offset resistors have different resistance values. FIG. 22 shows an example in which offset resistors connected to current sources which are frequently used in an operational amplifier circuit have different resistance values so that the input offset voltage Vosa is set. Here, an offset resistor Rof is connected to only one of the current sources, whereby the offset resistors have different resistance values.

Although typical operational amplifier circuits have been described in FIGS. 19-22, other differential or operational amplifier circuits, such as a folded cascode differential amplifier circuit, a rail-to-rail amplifier circuit, etc., may, of course, be used to obtain similar advantages.

Figure 23:
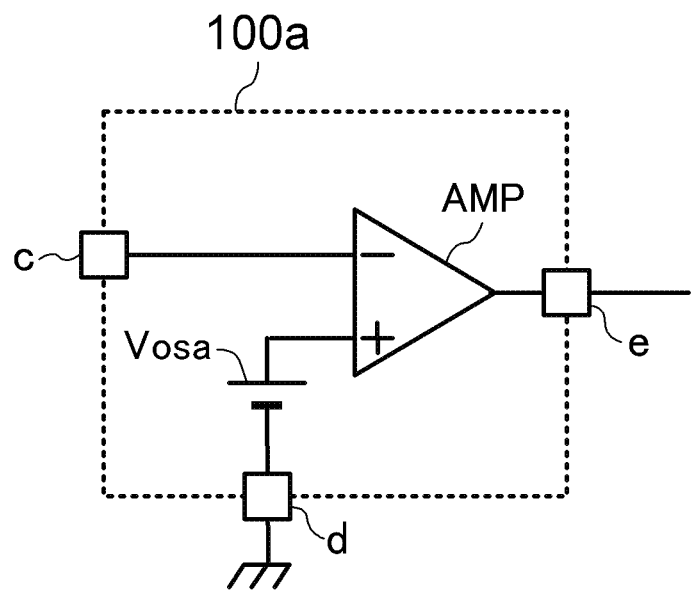
FIG. 23 is a circuit diagram of an operational amplifier circuit according to an embodiment of the present disclosure in which an input offset voltage is set using a bias voltage.
Figure 24:
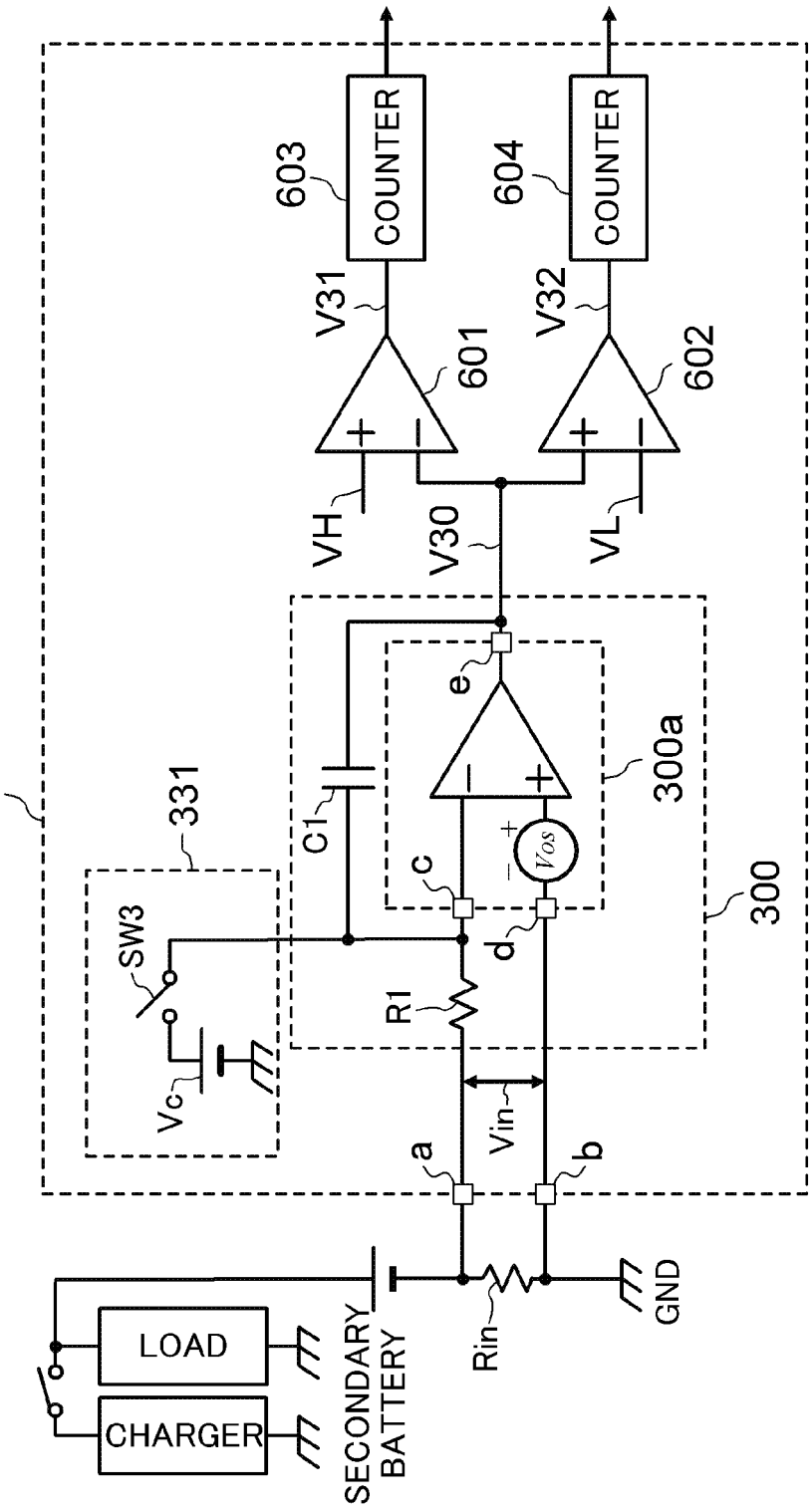
FIG. 24 is a diagram showing a conventional voltage polarity determination circuit.
Figure 25:
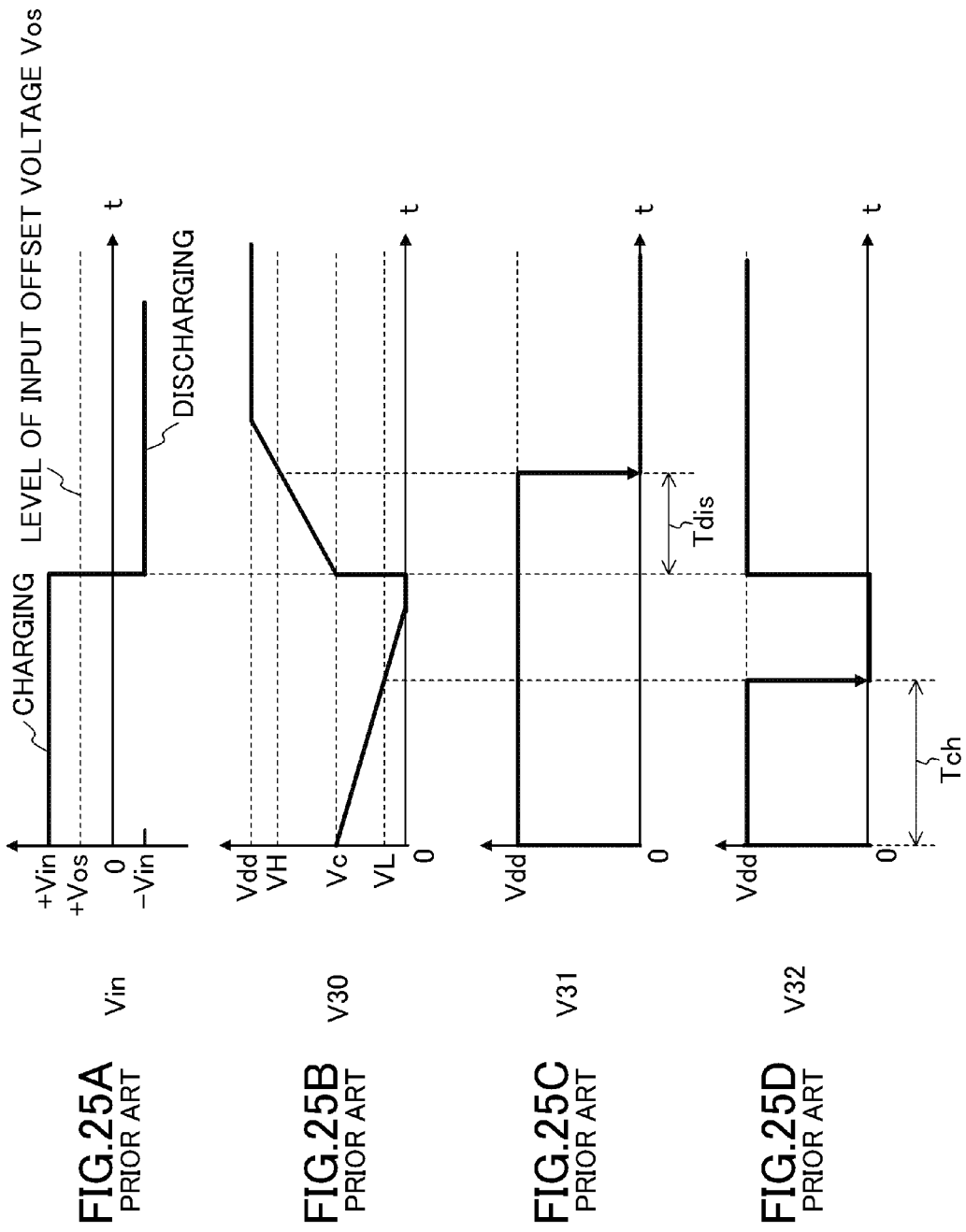
FIG. 25A is a diagram of a voltage waveform where an input voltage of the conventional voltage polarity determination circuit is larger than an input offset voltage, showing the input voltage of the voltage polarity determination circuit.
FIG. 25B is a diagram of a voltage waveform where an input voltage of the conventional voltage polarity determination circuit is larger than an input offset voltage, showing an output voltage of an integration circuit.
FIG. 25C is a diagram of a voltage waveform where an input voltage of the conventional voltage polarity determination circuit is larger than an input offset voltage, showing an output voltage of a first comparison circuit.
FIG. 25D is a diagram of a voltage waveform where an input voltage of the conventional voltage polarity determination circuit is larger than an input offset voltage, showing an output voltage of a second comparison circuit.
Figure 26:
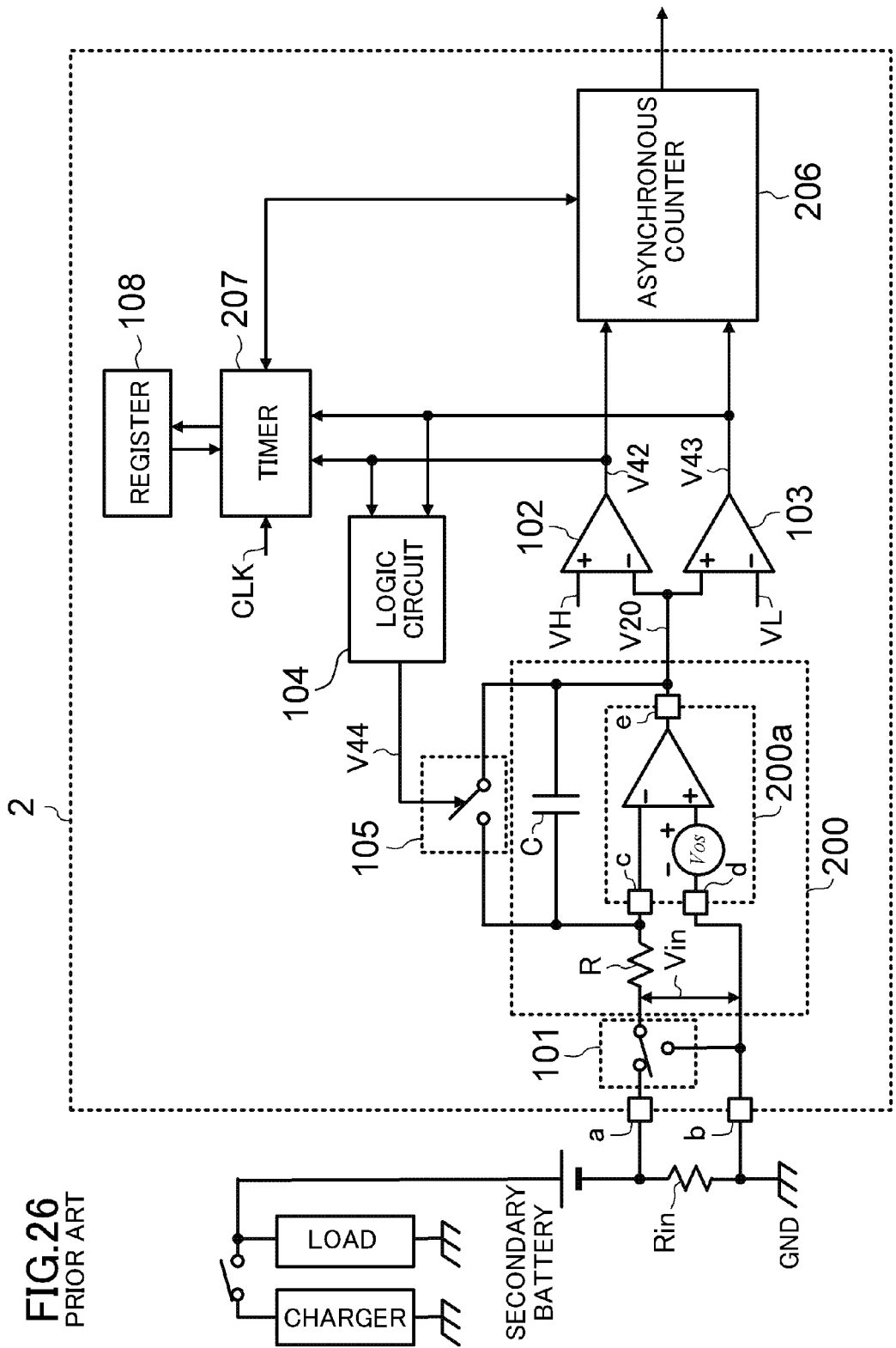
FIG. 26 is a block diagram showing a configuration of the conventional charge amount measurement circuit.
Figure 31:
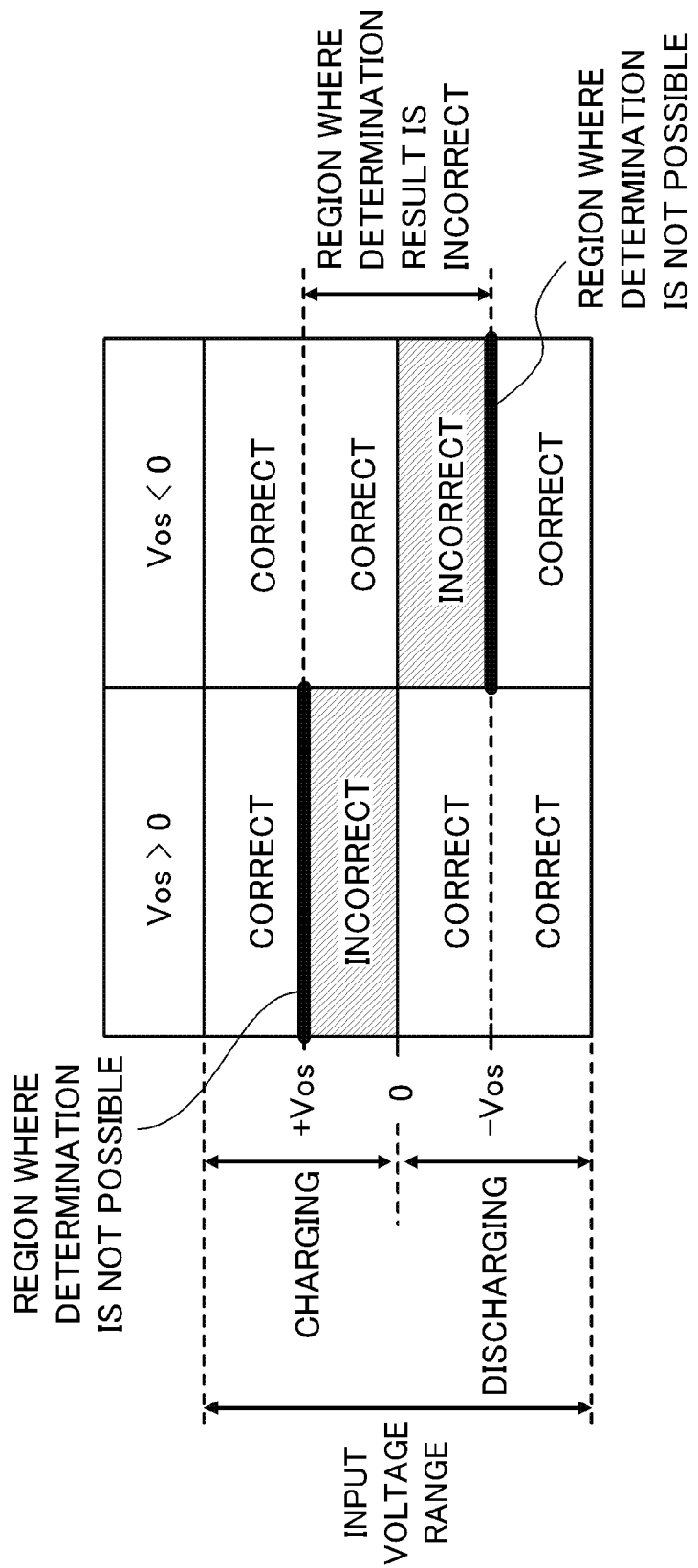
FIG. 31 is a diagram showing whether the result of determination by the conventional voltage polarity determination circuit is correct or incorrect with respect to the input offset voltage and an input voltage range of the input voltage.
Figure 32B:
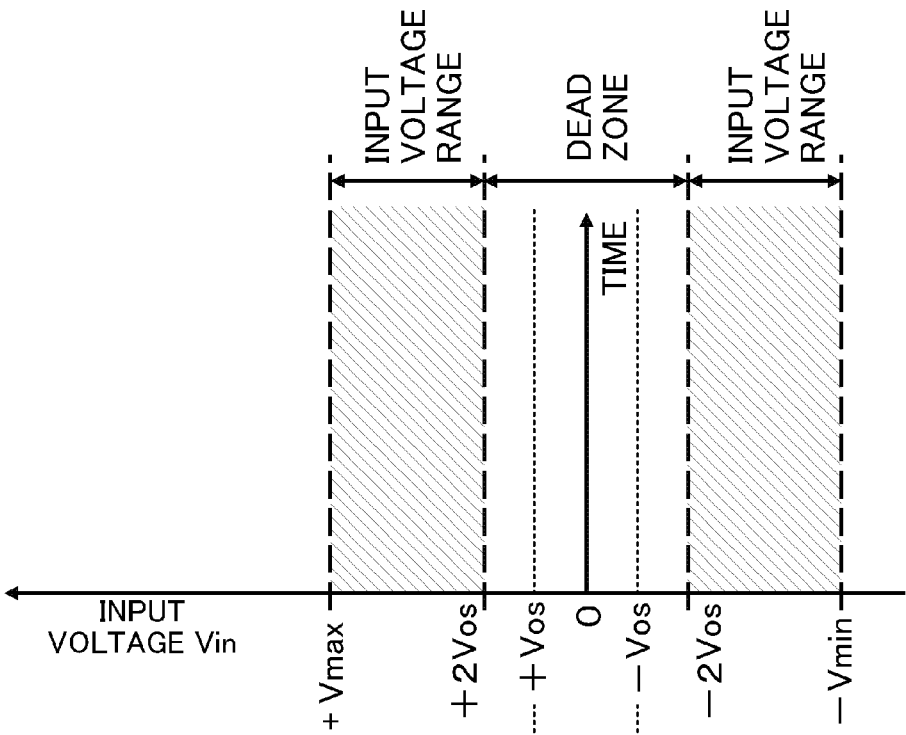
FIGS. 32A and 32B are diagrams showing a distribution of an input offset voltage and an input voltage range of the integration circuit of FIG. 26.
Figure 32A:
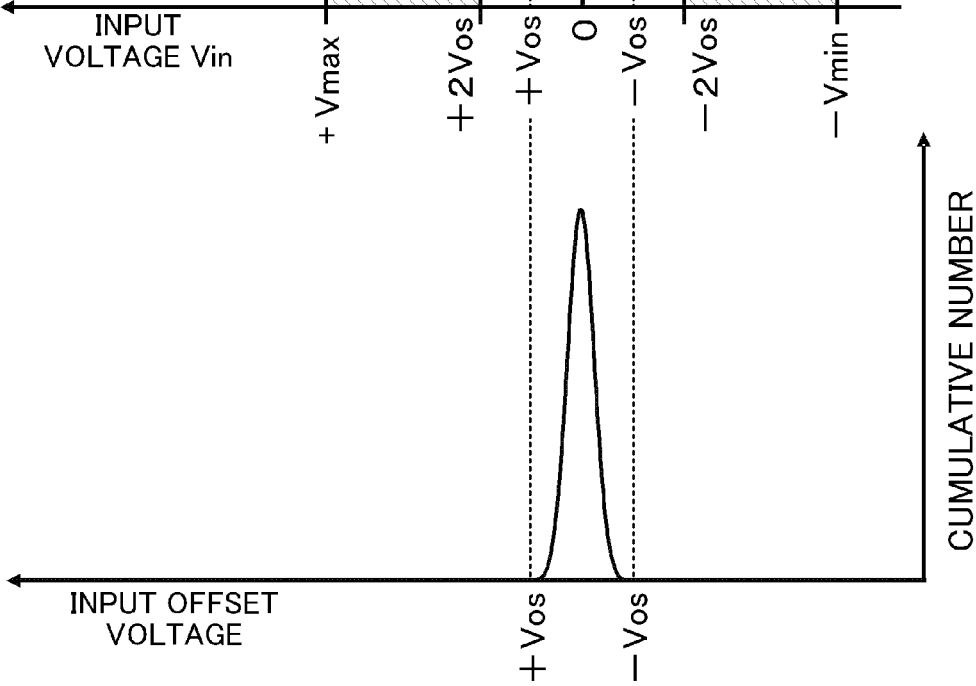

FIG. 23 is a circuit diagram showing an operational amplifier circuit in which the input offset voltage Vosa is set by applying a bias voltage to an amplifier AMP.

Although the input offset voltage Vosa is set on the non-inverting input side of the operational amplifier circuit 100a in the first to fourth embodiments, the input offset voltage Vosa may be set on the inverting input side to obtain the desired operation, whereby advantages similar to those of the first to fourth embodiments are obtained.

Although the input offset voltage Vosa is set in the operational amplifier circuit 100a in the first to fourth embodiments, a bias voltage may, of course, be externally applied to the operational amplifier circuit 100a, whereby similar advantages are obtained.

Although the charge/discharge state of a secondary battery is determined in the first and second embodiments, the current polarity of a general power supply may be determined by detecting a current, whereby advantages similar to those of the first and second embodiments are obtained.

In the third embodiment, the discharging measurement circuit 20, the charging measurement circuit 30, and the storage circuit 50 are used. In the fourth embodiment, the charge measurement circuit 25, the time measurement circuit 35, the charge integration circuit 40, and the storage circuit 50 are used. These functions may be processed by a microcomputer or a dedicated calculation circuit, whereby similar advantages are obtained. The processes of addition and subtraction may be performed using an up or down counter.

The voltage polarity determination circuit of the present disclosure is useful for mobile electronic devices (e.g., a mobile telephone, a digital camera, a game machine, etc.), electric vehicles, etc. which include a secondary battery. The voltage polarity determination circuit of the present disclosure is also applicable to a current detector etc. For example, the voltage polarity determination circuit of the present disclosure is useful as a circuit which determines the polarity of a charging/discharging current in a system which detects or estimates the remaining capacity of a secondary battery by detecting a consumed current or a charge amount of an electronic device to which power is supplied by the secondary battery, and a charging current or an integrated charge value during charging of the secondary battery.

The charge amount measurement circuit of the present disclosure is useful for mobile electronic devices (e.g., a mobile telephone, a digital camera, a game machine, etc.), electric vehicles, etc. which include a secondary battery. The charge amount measurement circuit of the present disclosure is also applicable to an ammeter etc.

What is claimed is:

1. A voltage polarity determination circuit comprising:
    an integration circuit;
    a switch configured to switch a voltage input to the integration circuit between a voltage whose polarity is to be determined and a reference voltage; and
    a time measurement circuit configured to measure a time interval which it takes an output voltage of the integration circuit to reach a set voltage, and based on a result of the measurement, determine the polarity of the input voltage of the integration circuit, wherein
    the integration circuit includes an operational amplifier circuit having an input offset voltage which is larger than a maximum value of the input voltage of the integration circuit or smaller than a minimum value of the input voltage of the integration circuit.

2. The voltage polarity determination circuit of claim 1, wherein
    the time measurement circuit includes
        a comparison circuit configured to compare the output voltage of the integration circuit with a first reference voltage, and output a result of the comparison, and
        a determination circuit configured to measure a time interval between when the input voltage of the integration circuit is switched by the switch and when the output voltage of the comparison circuit is inverted, and based on a result of the measurement, determine the polarity of the input voltage of the integration circuit.

3. The voltage polarity determination circuit of claim 1, wherein
    the time measurement circuit determines the polarity of the input voltage of the integration circuit by comparing a time interval between when the input voltage of the integration circuit is switched to the reference voltage by the switch and when the output voltage of the integration circuit reaches a first reference voltage with a time interval between when the input voltage of the integration circuit is switched to the voltage whose polarity is to be determined by the switch and when the output voltage of the integration circuit reaches the first reference voltage.

4. The voltage polarity determination circuit of claim 1, wherein
    the time measurement circuit includes
        a first comparison circuit configured to compare the output voltage of the integration circuit with a first reference voltage, and output a result of the comparison,
        a second comparison circuit configured to compare the output voltage of the integration circuit with a second reference voltage, and output a result of the comparison,
        a logic circuit configured to output a voltage which is set or reset in response to inversion of an output voltage of the first comparison circuit or inversion of an output voltage of the second comparison circuit,
        a counter configured to measure an output of the logic circuit until a set value, and
        a determination circuit configured to measure a time interval between when the input voltage of the integration circuit is switched by the switch and when a value measured by the counter reaches the set value, and based on a result of the measurement, determine the polarity of the input voltage of the integration circuit, and
    the voltage polarity determination circuit further includes an initialization circuit configured to initialize the output voltage of the integration circuit in response to an output of the logic circuit.

5. The voltage polarity determination circuit of claim 4, wherein
    the determination circuit compares the time interval between when the input voltage of the integration circuit is switched to the reference voltage by the switch and when the value measured by the counter reaches the set value with a time interval between when the input voltage of the integration circuit is switched to the voltage whose polarity is to be determined by the switch and when the value measured by the counter reaches the set value, to determine the polarity of the input voltage of the integration circuit.

* * * * *